(12) United States Patent
Konno

(10) Patent No.: US 10,615,226 B2
(45) Date of Patent: Apr. 7, 2020

(54) SEMICONDUCTOR MEMORY DEVICE AND METHOD OF MANUFACTURING THE SAME

(71) Applicant: Toshiba Memory Corporation, Minato-ku (JP)

(72) Inventor: Takuya Konno, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/401,391

(22) Filed: May 2, 2019

(65) Prior Publication Data

US 2019/0259813 A1    Aug. 22, 2019

Related U.S. Application Data

(63) Continuation of application No. 16/150,321, filed on Oct. 3, 2018, now Pat. No. 10,325,957, which is a
(Continued)

(51) Int. Cl.
*H01L 27/24*    (2006.01)
*G11C 13/00*    (2006.01)
*H01L 45/00*    (2006.01)

(52) U.S. Cl.
CPC ...... *H01L 27/2463* (2013.01); *G11C 13/0002* (2013.01); *G11C 13/0007* (2013.01); *H01L 45/085* (2013.01); *H01L 45/1266* (2013.01); *H01L 45/145* (2013.01); *H01L 45/1608* (2013.01); *H01L 45/1675* (2013.01); *G11C 2213/51* (2013.01); *G11C 2213/71* (2013.01)

(58) Field of Classification Search
CPC .................................................. H01L 27/2463
USPC ............................................................ 257/5
See application file for complete search history.

(56) References Cited

U.S. PATENT DOCUMENTS 8,274,068 B2    9/2012    Nagashima
8,298,931 B2    10/2012    Raghuram et al.
(Continued)

FOREIGN PATENT DOCUMENTS

JP    2011-54758    3/2011
JP    2011-508459    3/2011
(Continued)

*Primary Examiner* — Jami Valentine Miller
(74) *Attorney, Agent, or Firm* — Oblon, McClelland, Maier & Neustadt, L.L.P.

(57) ABSTRACT

According to an embodiment, a semiconductor memory device comprises first wiring lines, second wiring lines, and first variable resistance elements. The first wiring lines are arranged in a first direction and have as their longitudinal direction a second direction intersecting the first direction. The second wiring lines are arranged in the second direction and have the first direction as their longitudinal direction. The first variable resistance elements are respectively provided at intersections of the first wiring lines and the second wiring lines. In addition, this semiconductor memory device comprises a first contact extending in a third direction that intersects the first direction and second direction and having one end thereof connected to the second wiring line. The other end and a surface intersecting the first direction of this first contact are covered by a first conductive layer.

20 Claims, 62 Drawing Sheets

Related U.S. Application Data continuation of application No. 15/791,514, filed on Oct. 24, 2017, now Pat. No. 10,115,771, which is a continuation of application No. 15/077,026, filed on Mar. 22, 2016, now Pat. No. 9,812,502.

(60) Provisional application No. 62/212,056, filed on Aug. 31, 2015.

(56) References Cited

U.S. PATENT DOCUMENTS

| | | |
|---|---|---|
| 8,445,883 B2 | 5/2013 | Himeno et al. |
| 8,492,808 B2 | 7/2013 | Omori et al. |
| 9,583,538 B2* | 2/2017 | Noda ................ H01L 27/2481 |
| 2010/0054029 A1* | 3/2010 | Happ ................ G11C 13/0004 |
| | | 365/163 |
| 2013/0140515 A1* | 6/2013 | Kawashima .......... H01L 45/085 |
| | | 257/4 |
| 2013/0264675 A1 | 10/2013 | Scheuerlein |
| 2013/0270501 A1* | 10/2013 | Toh ..................... H01L 45/1233 |
| | | 257/2 |
| 2014/0268995 A1* | 9/2014 | Joo ......................... H01L 45/06 |
| | | 365/148 |
| 2015/0171142 A1* | 6/2015 | Kawashima ........ H01L 27/2463 |
| | | 257/4 |
| 2015/0194619 A1* | 7/2015 | Franklin ............ H01L 51/0554 |
| | | 257/29 |
| 2015/0243884 A1* | 8/2015 | Brightsky .............. H01L 45/06 |
| | | 257/4 |
| 2015/0364381 A1* | 12/2015 | Choi ............... H01L 21/823487 |
| | | 438/268 |
| 2016/0133671 A1* | 5/2016 | Fantini ............... H01L 27/2463 |
| | | 257/4 |

FOREIGN PATENT DOCUMENTS

| | | |
|---|---|---|
| JP | 2012-43977 | 3/2012 |
| WO | WO 2010/050094 A1 | 5/2010 |

* cited by examiner

SEMICONDUCTOR MEMORY DEVICE AND METHOD OF MANUFACTURING THE SAME

CROSS-REFERENCE TO RELATED APPLICATIONS

This application is a continuation of and claims the benefit of priority under 35 U.S.C. § 120 from U.S. application Ser. No. 16/150,321 filed Oct. 3, 2018, which is a continuation of U.S. application Ser. No. 15/791,514 filed Oct. 24, 2017 (now U.S. Pat. No. 10,115,771 issued Oct. 30, 2018), which is a continuation of U.S. application Ser. No. 15/077,026 filed Mar. 22, 2016 (now U.S. Pat. No. 9,812,502 issued Nov. 7, 2017), and claims the benefit of priority from U.S. Provisional Patent Application No. 62/212,056 filed Aug. 31, 2015, the entire contents of each of which are incorporated herein by reference.

FIELD

Embodiments described herein relate to a semiconductor memory device and a method of manufacturing the same.

BACKGROUND

Description of the Related Art

A resistance varying type memory (ReRAM: Resistive RAM), and so on, that can easily be made three-dimensional, has been receiving attention as a memory utilized for storing large capacity data. In such a memory, a variable resistance element is employed as a storage element. The following are employed as such a variable resistance element, for example, CBRAM (Conduction Bridge RAM), a storage element utilizing the likes of a chalcogenide compound or metal oxide, an MRAM element employing a resistance change due to a tunnel magnetoresistance effect, a storage element utilizing a conductive polymer (polymer ferroelectric RAM, PFRAM), and so on.

DETAILED DESCRIPTION

A semiconductor memory device according to an embodiment comprises a plurality of first wiring lines, a plurality of second wiring lines, and a plurality of first variable resistance elements. The plurality of first wiring lines are arranged in a first direction and have as their longitudinal direction a second direction intersecting the first direction. The plurality of second wiring lines are arranged in the second direction and have the first direction as their longitudinal direction. The plurality of first variable resistance elements are respectively provided at intersections of the first wiring lines and the second wiring lines. In addition, this semiconductor memory device comprises a first contact extending in a third direction that intersects the first direction and second direction and having one end thereof connected to the second wiring line. The other end and a surface intersecting the first direction of this first contact are covered by a first conductive layer.

Next, nonvolatile semiconductor memory devices according to embodiments will be described in detail with reference to the drawings. Note that these embodiments are merely examples, and are not shown with the intention of limiting the present invention.

For example, a memory device employing CBRAM (Conduction Bridge RAM) is exemplified herein, but the present invention may also be applied to a memory device having another configuration. Such a memory device may be one having any configuration, for example, one employing a storage element that utilizes the likes of a chalcogenide compound or metal oxide, one employing MRAM that utilizes a resistance change due to a tunnel magnetoresistance effect, one employing a storage element that utilizes a conductive polymer (polymer ferroelectric RAM, PFRAM), and so on. Moreover, a memory cell included in the memory device may or may not include a non-linear element such as a diode or transistor.

In addition, a configuration having two layers of memory mats stacked is exemplified herein as a structure of a memory cell array. However, the present embodiment may also be applied to a configuration having a single layer memory mat or a configuration having three or more layers of memory mats stacked. Moreover, a configuration in which a bit line BL is shared between the stacked two layers of memory mats is exemplified herein. However, it is also possible to adopt a configuration in which a word line WL is shared between the stacked memory mats and to adopt a configuration in which wiring lines are not shared between the stacked memory mats.

[Semiconductor Memory Device According to First Embodiment]

Figure 1:
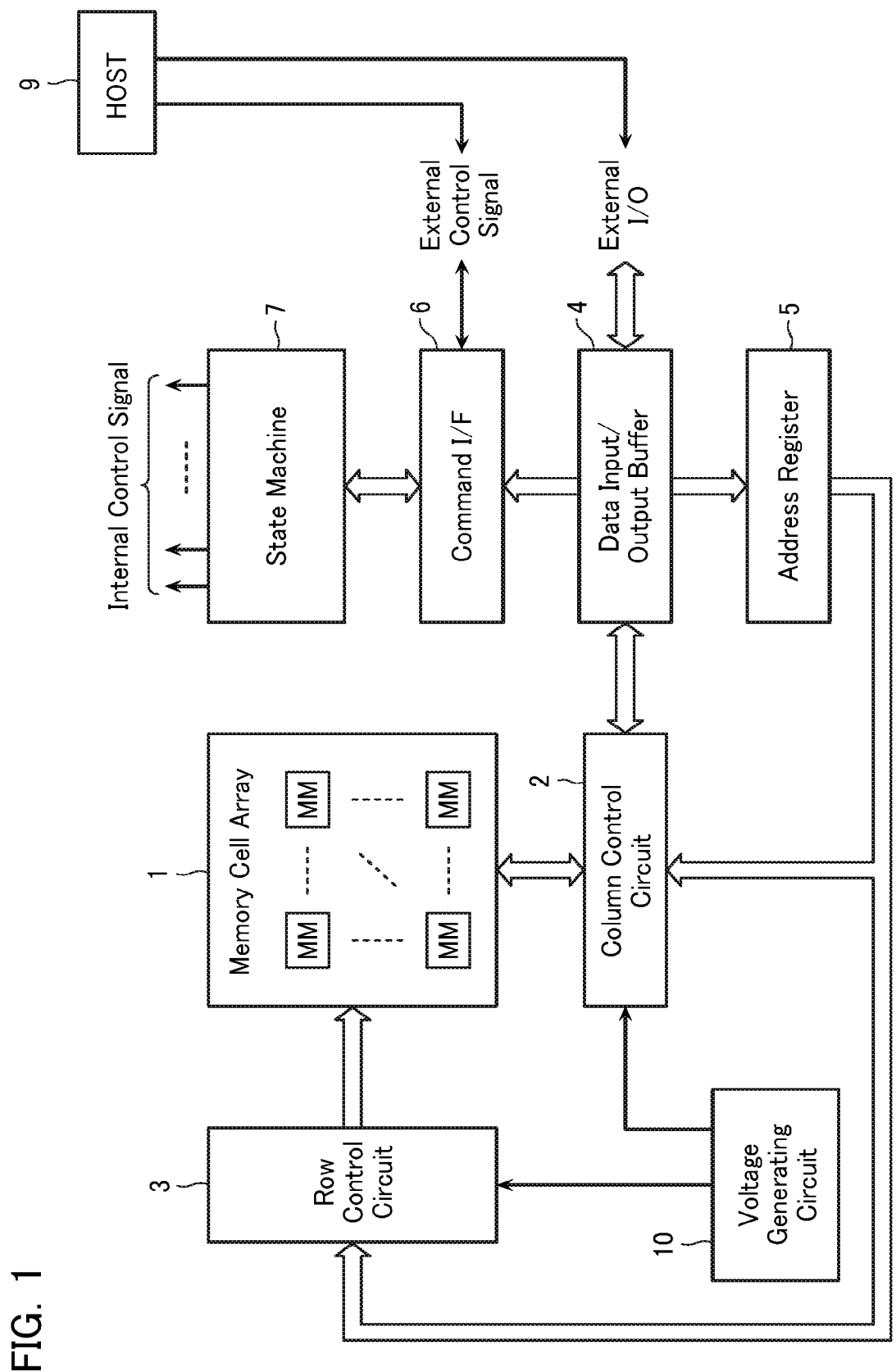
FIG. 1 is a block diagram of a nonvolatile semiconductor memory device according to a first embodiment.

FIG. 1 is a block diagram of a nonvolatile semiconductor memory device according to a first embodiment. The same nonvolatile semiconductor memory device stores user data inputted from an external host 9, in a certain address in a memory cell array 1. In addition, the same nonvolatile semiconductor memory device reads user data from a certain address in the memory cell array 1, and outputs the user data to the external host 9.

Figure 2:
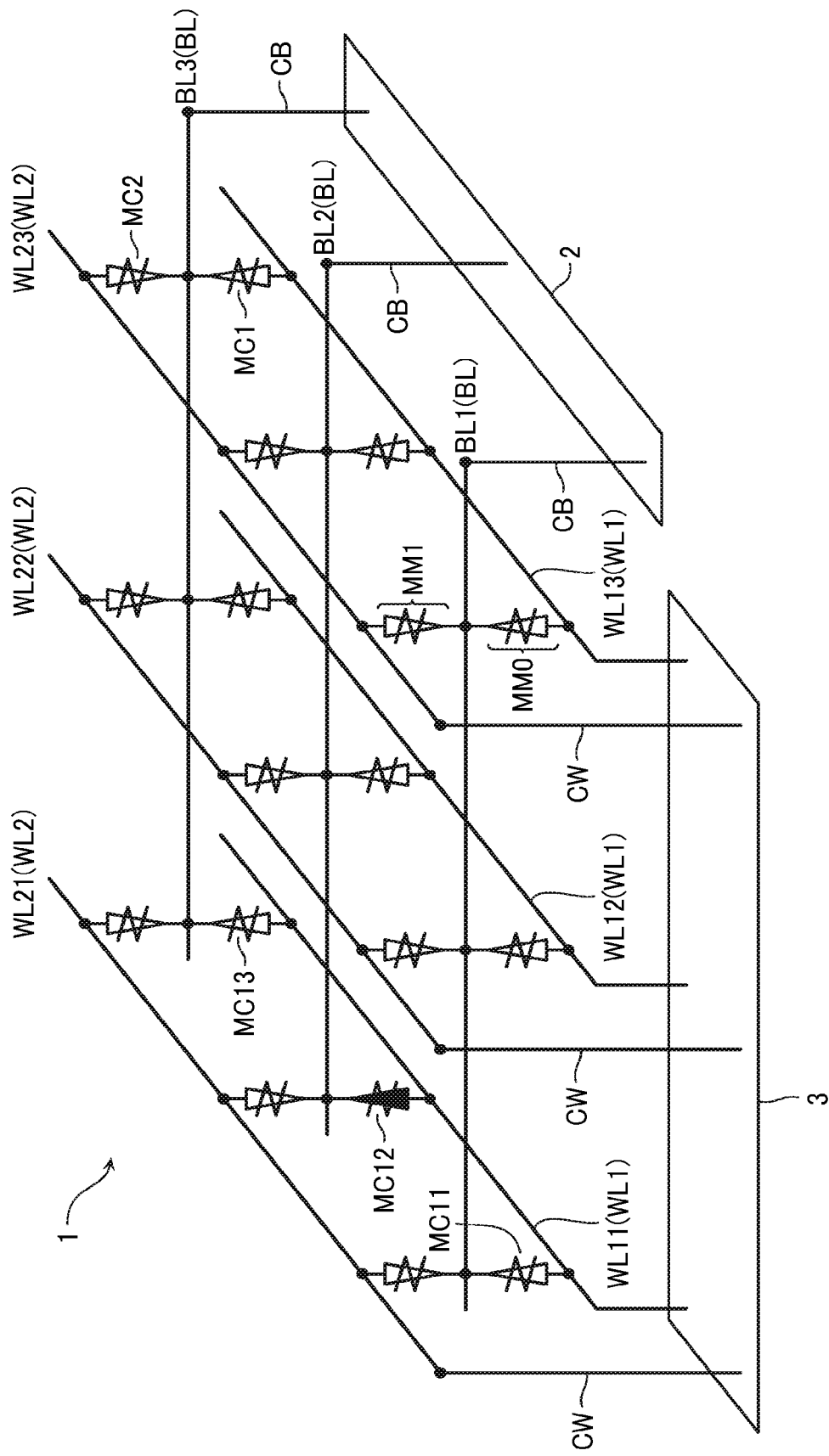
FIG. 2 is a circuit diagram showing a configuration of part of the same nonvolatile semiconductor memory device.

That is, as shown in FIG. 1, the same nonvolatile semiconductor memory device comprises the memory cell array 1 that stores user data. The memory cell array 1 comprises a plurality of memory mats MM. As shown in FIG. 2, these memory mats MM comprise: a plurality of memory cells MC1 and MC2; and a bit line BL and word lines WL1 and WL2 connected to these memory cells MC1 and MC2.

As shown in FIG. 1, the same nonvolatile semiconductor memory device comprises a column control circuit 2 provided in a periphery of the memory cell array 1. When performing write of user data, the column control circuit 2 transfers a voltage generated by a voltage generating circuit 10 to a desired bit line BL, according to the user data inputted from the external host 9. Moreover, the column control circuit 2 comprises an unillustrated sense amplifier, and when performing read of user data, detects a voltage or potential of a certain bit line BL.

As shown in FIG. 1, the same nonvolatile semiconductor memory device comprises a row control circuit 3 provided in a periphery of the memory cell array 1. The row control circuit 3 transfers a voltage generated by the voltage generating circuit 10 to desired word lines WL1 and WL2, and so on, according to address data inputted from the external host 9.

As shown in FIG. 1, the same nonvolatile semiconductor memory device comprises an address register 5 that supplies address data to the column control circuit 2 and the row control circuit 3. The address register 5 stores address data inputted from a data input/output buffer 4.

As shown in FIG. 1, the same nonvolatile semiconductor memory device comprises the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the same nonvolatile semiconductor memory device comprises the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the same nonvolatile semiconductor memory device comprises the data input/output buffer 4 which is connected to the external host 9 via an I/O line. The data input/output buffer 4 receives user data from the external host 9, and transfers the user data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives user data from the column control circuit 2, and transfers the user data to the external host 9.

As shown in FIG. 1, the same nonvolatile semiconductor memory device comprises the command interface 6 that receives an external control signal from the external host 9. The command interface 6 determines which of user data, command data, and address data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Next, a circuit configuration of part of the memory cell array 1 according to the present embodiment will be described with reference to FIG. 2. FIG. 2 is an equivalent circuit diagram showing a configuration of part of the memory cell array 1.

As shown in FIG. 2, the memory cell array 1 comprises: a plurality of the bit lines BL; a plurality of the word lines WL1 and WL2; and a plurality of the memory cells MC1 and MC2 connected to these bit lines BL and word lines WL1 and WL2. These memory cells MC1 and MC2 are connected to the row control circuit 3 via the word lines WL1 and WL2 and a word line contact CW, and are connected to the column control circuit 2 via the bit line BL and a bit line contact CB. For example, the plurality of memory cells MC1 and MC2 connected to common word lines WL1 and WL2 store a one-page portion of user data. Moreover, the plurality of memory cells MC1 and MC2 each store a one-bit portion of data, for example.

The memory cells MC1 and MC2 function as a variable resistance element, and have their resistance value changed according to data stored. For example, the memory cells MC11 and MC13 recording "0" are in a high-resistance state, and the memory cell MC12 recording "1" is in a low-resistance state. Therefore, when a certain voltage is applied to the word line WL11 (selected word line) connected to these memory cells MC11 to MC13, a current does not flow in the bit line BL1 and bit line BL3 connected to the memory cells MC11 and MC13, but a current does flow in the bit line BL2 connected to the memory cell MC12. Therefore, this current is detected by the column control circuit 2, whereby data of "010" is read as user data, for example. Note that the column control circuit 2 may detect a voltage, not the current, of the bit line BL.

In addition, the memory cells MC1 and MC2 function as a rectifier element. Therefore, practically no current flows in the word lines WL1 and WL2 (unselected word lines) other than the selected word line WL11.

Note that hereafter, a configuration including the plurality of bit lines BL, the plurality of word lines WL1, and the plurality of memory cells MC1 will be called a memory mat MM0. Similarly, a configuration including the plurality of bit lines BL, the plurality of word lines WL2, and the plurality of memory cells MC2 will be called a memory mat MM1.

Figure 3:
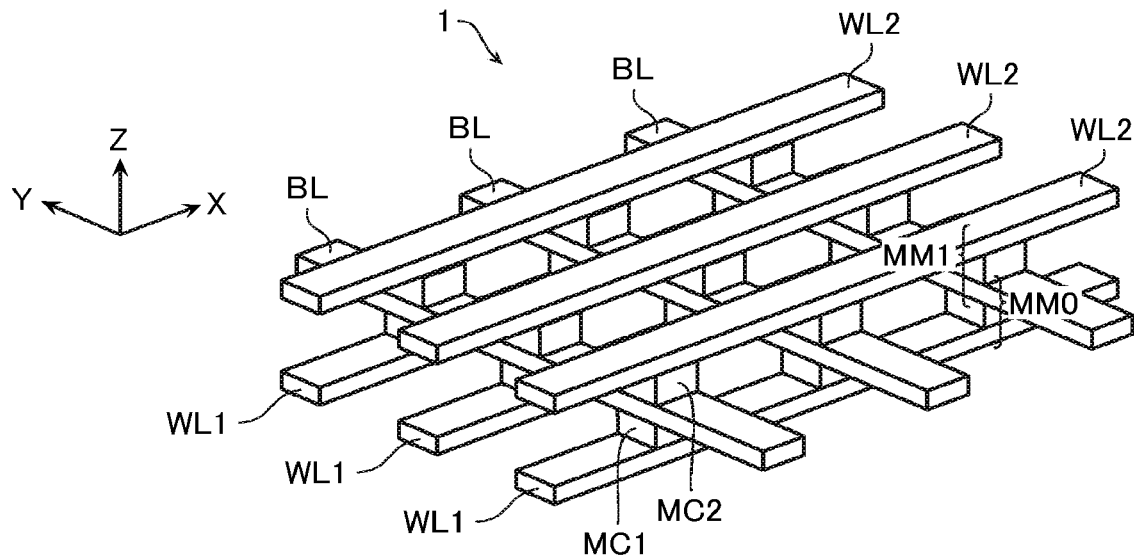
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory cell array 1. Note that in FIG. 3, part of the configuration is omitted. Moreover, the configuration shown in FIG. 3 is merely an example, and a specific configuration may be appropriately changed.

As shown in FIG. 3, the memory cell array 1 is a so-called cross-point type memory cell array. That is, the memory cell array 1 is provided with a plurality of the word lines WL1 that are arranged in parallel in a Y direction and extend in an X direction. Moreover, provided above these plurality of word lines WL1 are a plurality of the bit lines BL that are arranged in parallel in the X direction and extend in the Y direction. Furthermore, provided above the plurality of bit lines BL are a plurality of the word lines WL2 that are arranged in parallel in the Y direction and extend in the X direction. In addition, the memory cell MC1 is provided at each of intersections of the plurality of word lines WL1 and the plurality of bit lines BL. Similarly, the memory cell MC2 is provided at each of intersections of the plurality of bit lines BL and the plurality of word lines WL2.

Figure 4:
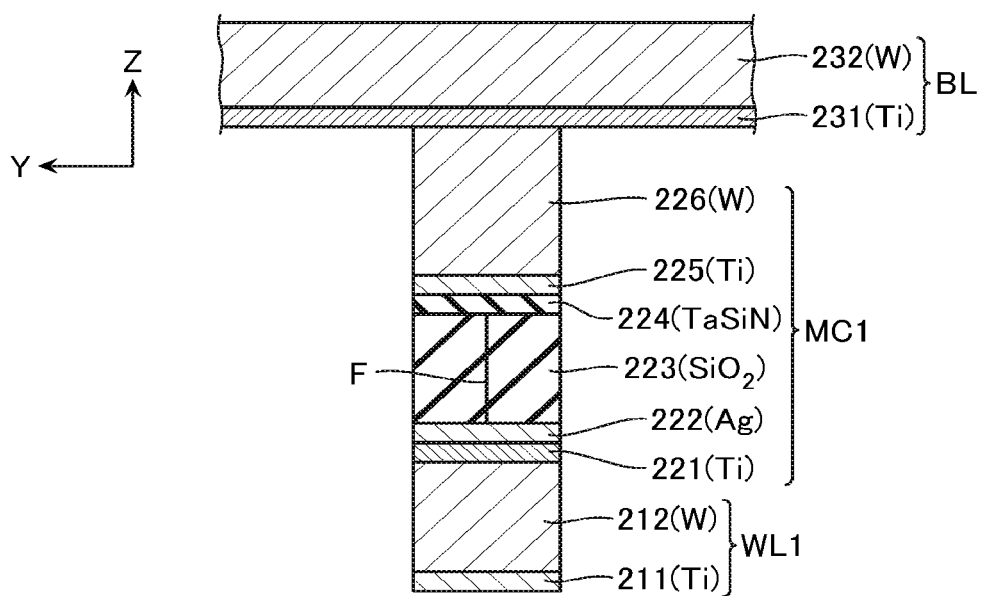
FIG. 4 is a cross-sectional view showing a configuration of part of the same nonvolatile semiconductor memory device.

Next, the memory mat MM0 will be described with reference to FIG. 4. FIG. 4 is a cross-sectional view showing a configuration of the memory mat MM0. Note that in FIG. 4, part of the configuration is omitted.

As shown in FIG. 4, the memory mat MM0 comprises: the word line WL1; the memory cell MC1 provided on an upper surface of the word line WL1; and the bit line BL provided on an upper surface of the memory cell MC1. The memory cell MC1 includes a filament F having conductivity, and attains the low-resistance state when this filament F contacts an electrode layer 224 and the high-resistance state when this filament F does not contact the electrode layer 224.

As shown in FIG. 4, the word line WL1 comprises the following, for example, namely: a barrier metal layer 211; and a conductive layer 212 stacked on this barrier metal layer 211. The barrier metal layer 211 is configured from a conductive layer of the likes of titanium (Ti), for example, and suppresses diffusion of an impurity when depositing the conductive layer 212, and so on. The conductive layer 212 is configured from a conductive layer of the likes of tungsten (W), for example.

As shown in FIG. 4, the memory cell MC1 comprises the following, stacked sequentially on the word line WL1, namely: a barrier metal layer 221; a metal layer 222; an insulating layer 223; the electrode layer 224; a barrier metal layer 225; and a conductive layer 226. The barrier metal layers 221 and 225 are configured from a conductive layer of the likes of titanium (Ti), for example, and suppress diffusion of an impurity when depositing the metal layer 222 or the conductive layer 226, and so on. The metal layer 222 is configured from a metal such as silver (Ag) or copper (Cu), for example, and functions as a supply source of a metal ion forming the filament F. The insulating layer 223 is configured from an insulating layer of the likes of silicon oxide ($SiO_2$), for example, and functions as a medium in which the filament F grows. The electrode layer 224 is configured from a material such as tantalum silicon nitride (TaSiN), for example, and functions as an electrode contacting the filament F. The conductive layer 226 is configured from a conductive layer of the likes of tungsten (W), for example.

As shown in FIG. 4, the bit line BL comprises the following, for example, namely: a barrier metal layer 231; and a conductive layer 232 stacked on this barrier metal layer 231. The barrier metal layer 231 is configured from a conductive layer of the likes of titanium (Ti), for example, and suppresses diffusion of an impurity when depositing the conductive layer 232, and so on. The conductive layer 232 is configured from a conductive layer of the likes of tungsten (W), for example.

Note that materials of each of the configurations are merely exemplified ones, and may be appropriately changed. For example, the insulating layer 223 may be formed from a material such as silicon nitride (SiN), silicon oxynitride (SiON), aluminum oxide ($Al_2O_3$), hafnium oxide (HfO), and so on. Moreover, the electrode layer 224 may be formed from a material such as amorphous silicon, polysilicon, tantalum nitride (TaN), aluminum tantalum nitride, and so on.

Figure 5:
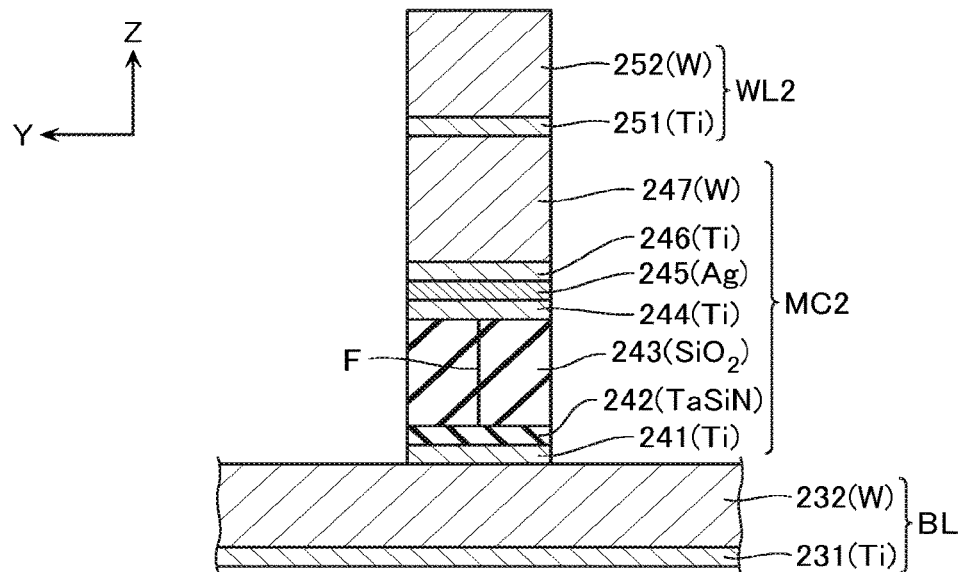
FIG. 5 is a cross-sectional view showing a configuration of part of the same nonvolatile semiconductor memory device.

Next, the memory mat MM1 will be described in more detail with reference to FIG. 5. FIG. 5 is a cross-sectional view showing a configuration of the memory mat MM1. Note that in FIG. 5, part of the configuration is omitted.

As shown in FIG. 5, the memory mat MM1 comprises: the bit line BL; the memory cell MC2 provided on an upper surface of the bit line BL; and the word line WL2 provided on an upper surface of the memory cell MC2. Similarly to the memory cell MC1, the memory cell MC2 also includes a filament F having conductivity, and attains the low-resistance state when this filament F contacts an electrode layer 242 and the high-resistance state when this filament F does not contact the electrode layer 242.

As shown in FIG. 5, the memory cell MC2 comprises the following, stacked sequentially on the bit line BL, namely: a barrier metal layer 241; the electrode layer 242; an insulating layer 243; a barrier metal layer 244; a metal layer 245; a barrier metal layer 246; and a conductive layer 247. The barrier metal layers 241, 244, and 246 are configured from a conductive layer of the likes of titanium (Ti), for example, and suppress diffusion of an impurity when depositing the electrode layer 242, the metal layer 245, or the conductive layer 247, and so on. The electrode layer 242 is configured from a material such as tantalum silicon nitride (TaSiN), and functions as an electrode contacting the filament F. The insulating layer 243 is configured from an insulating layer of the likes of silicon oxide ($SiO_2$), for example, and functions as a medium in which the filament F grows. The metal layer 245 is configured from a metal such as silver (Ag) or copper (Cu), for example, and functions as a supply source of a metal ion forming the filament F. The conductive layer 247 is configured from a conductive layer of the likes of tungsten (W), for example.

As shown in FIG. 5, the word line WL2 comprises the following, for example, namely: a barrier metal layer 251; and a conductive layer 252 stacked on this barrier metal layer 251. The barrier metal layer 251 is configured from a conductive layer of the likes of titanium (Ti), for example, and suppresses diffusion of an impurity when depositing the conductive layer 252, and so on. The conductive layer 252 is configured from a conductive layer of the likes of tungsten (W), for example.

Note that materials of each of the configurations are merely exemplified ones, and may be appropriately changed. For example, the electrode layer 242 may be formed from a material such as amorphous silicon, polysilicon, tantalum nitride (TaN), aluminum tantalum nitride, and so on. Moreover, the insulating layer 243 may be formed from a material such as silicon nitride (SiN), silicon oxynitride (SiON), aluminum oxide ($Al_2O_3$), hafnium oxide (HfO), and so on.

Figure 6:
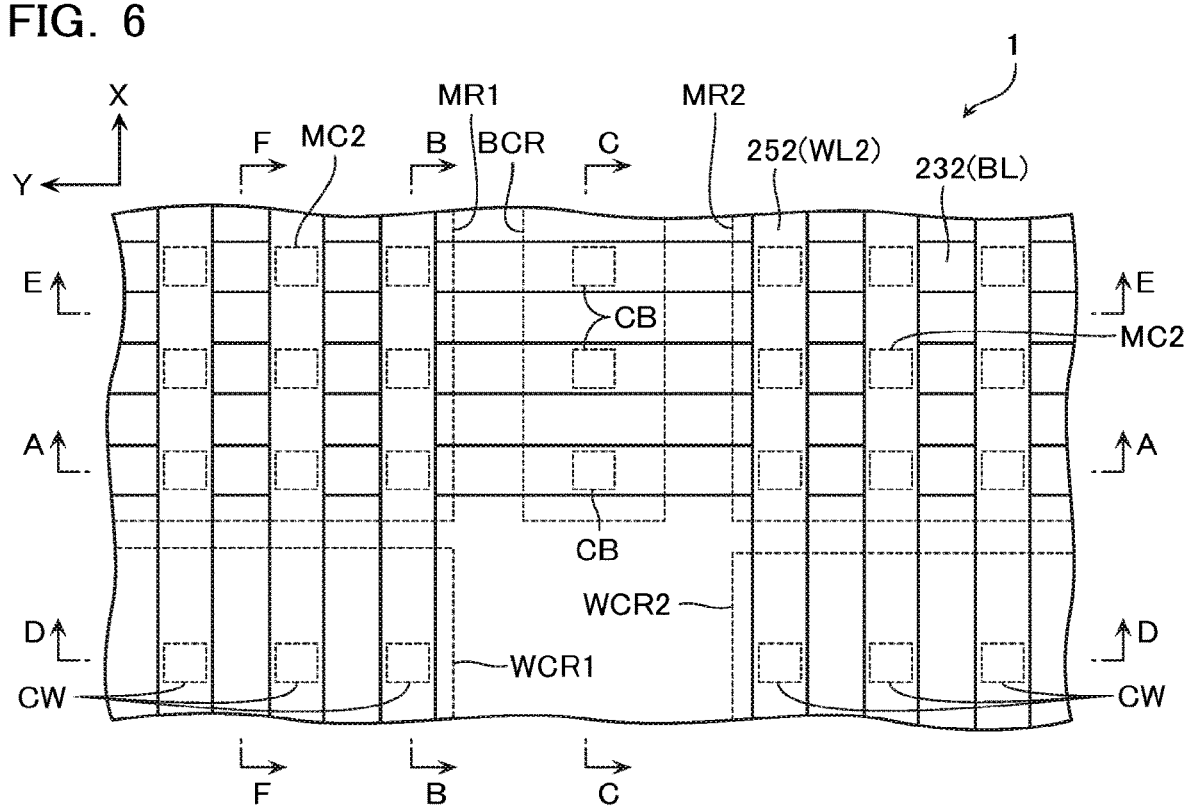
FIG. 6 is a plan view showing a configuration of part of the same nonvolatile semiconductor memory device.

Next, the memory cell array 1 according to the present embodiment will be described in more detail with reference to FIGS. 6 to 12. FIG. 6 is a plan view showing a configuration of part of the memory cell array 1. FIGS. 7 to 12 are cross-sectional views showing configurations of parts of the memory cell array 1, and respectively show cross-sections corresponding to A-A through F-F of FIG. 6. Note that in FIG. 6, part of the configuration is omitted.

As shown in FIG. 6, the memory cell array 1 according to the present embodiment is provided with a plurality of memory regions MR1 and MR2. In addition, a bit line contact region BCR is provided in the Y direction of the memory regions MR1 and MR2. Moreover, word line contact regions WCR1 and WCR2 are provided in the X direction of the memory regions MR1 and MR2.

Figure 7:
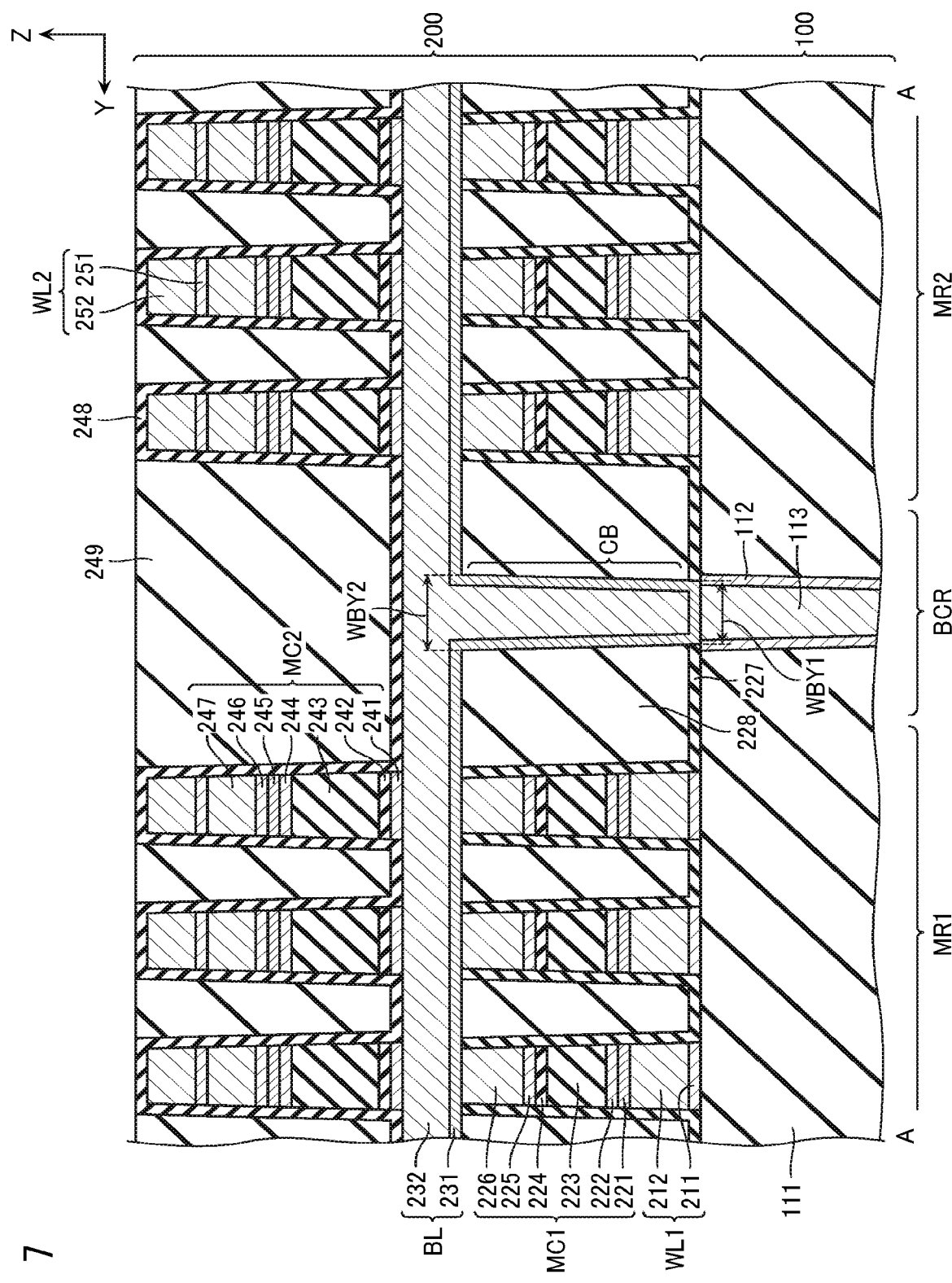
FIGS. 7 to 12 are cross-sectional views showing configuration of parts of the same nonvolatile semiconductor memory device.
Figure 8:
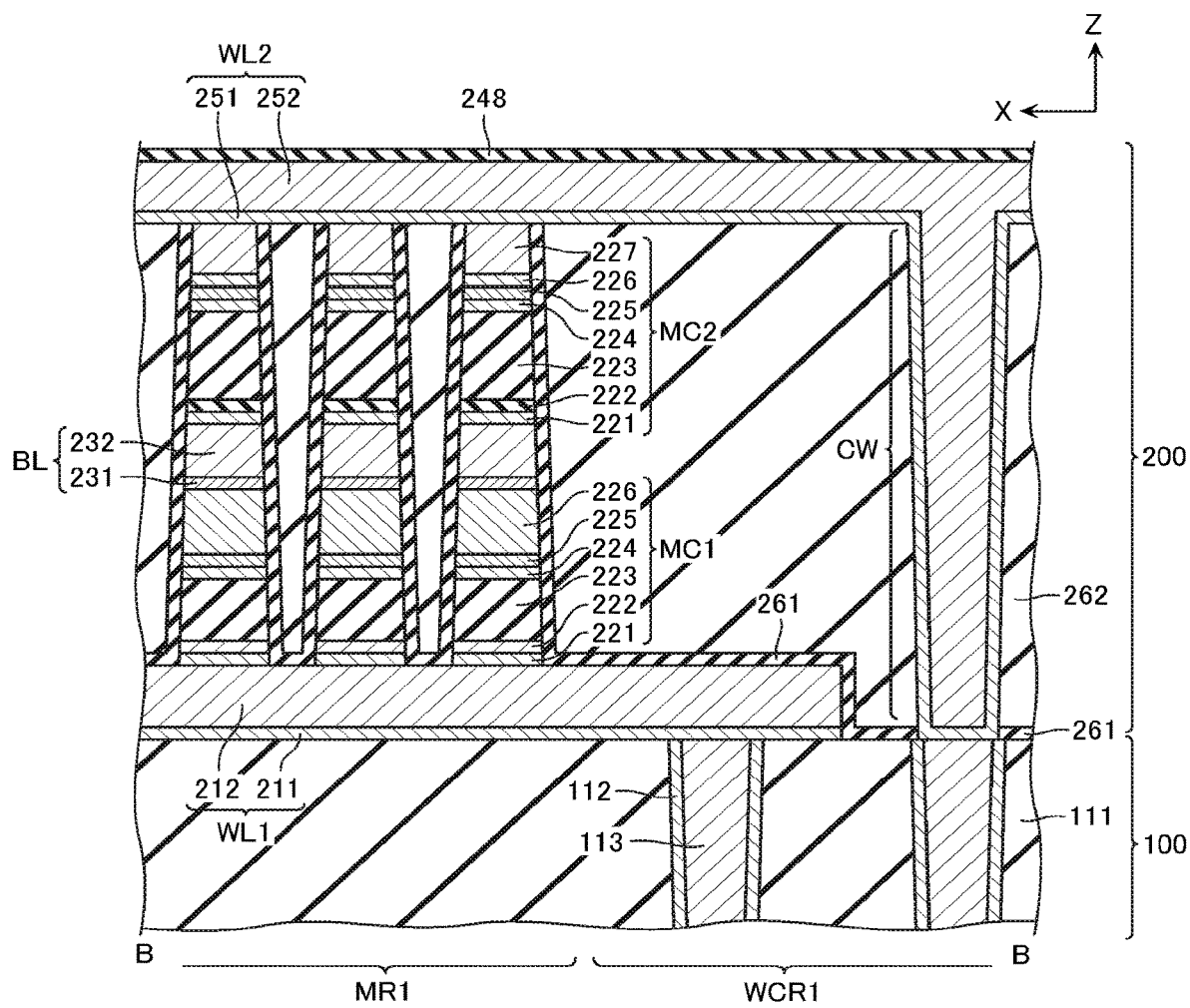

As shown in FIGS. 6 to 8, the memory regions MR1 and MR2 are provided with a plurality of the bit lines BL that are arranged in parallel in the X direction and extend in the Y direction, and a plurality of the word lines WL1 and word lines WL2 that are arranged in parallel in the Y direction and extend in the X direction (refer to FIGS. 7 and 8). In addition, memory cells MC1 and MC2 are provided at intersections of these plurality of bit lines BL and plurality of word lines WL1 and WL2.

As shown in FIG. 6, the bit line contact region BCR is provided with a plurality of the bit lines BL that are arranged in the X direction and extend in parallel in the Y direction. In other words, the plurality of bit lines BL are provided straddling the memory regions MR1 and MR2 and the bit line contact region BCR. Moreover, as shown in FIGS. 6 and 7, the bit line contact CB is connected to each of these bit lines BL. The bit line contact CB extends in the Z direction and has its upper end connected to a lower surface of the bit line BL and its lower end connected to a conductive layer 113 of a lower wiring line layer 100.

As shown in FIGS. 6 to 8, the word line contact regions WCR1 and WCR2 are each provided with a plurality of the word lines WL1 and WL2 that are arranged in the Y direction and extend in parallel in the X direction. In other words, the plurality of word lines WL1 and WL2 are provided straddling the memory regions MR1 and MR2 and the word line contact regions WCR1 and WCR2. Moreover, as shown in FIG. 8, in the word line contact regions WCR1 and WCR2, the word line WL1 is connected to the conductive layer 113 of the lower wiring line layer 100. In addition, as shown in FIGS. 6 and 8, the word line contact CW is connected to each of the word lines WL2. The word line contact CW extends in the Z direction and has its upper end connected to a lower surface of the word line WL2 and its lower end connected to the conductive layer 113 of the lower wiring line layer 100.

Figure 9:
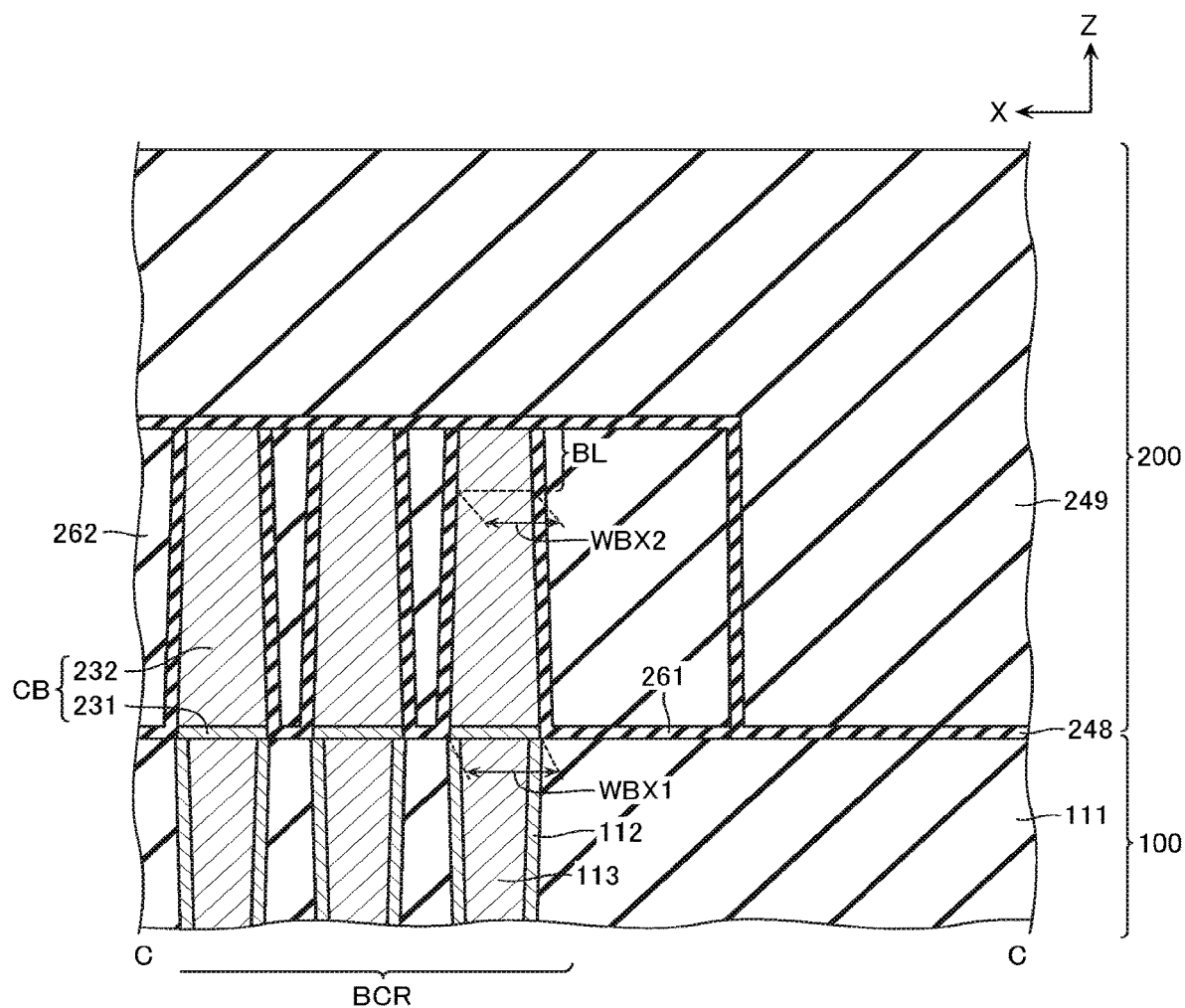

Now, as shown in FIGS. 6 and 9, in the present embodiment, a position and width in the X direction of the bit line BL substantially matches a position and width in the X direction of the bit line contact CB. Moreover, in the bit line contact region BCR, a plurality of the bit line contacts CB are lined up in the X direction with an identical pitch to that of the bit lines BL, and positions in the Y direction of these plurality of bit line contacts CB are substantially matched.

In such a configuration, a width in the X direction of the bit line contact region BCR can be suppressed to about the same width as that of the memory regions MR1 and MR2, and a width in the Y direction of the bit line contact region BCR can be suppressed to about the same width as that of the bit line contact CB. Therefore, an area occupied by the bit line contact region BCR can be reduced.

Moreover, in the present embodiment, the bit line contact CB is formed in an inversely tapered shape when viewed from the X direction as shown in FIG. 7, and is formed in a forwardly tapered shape when viewed from the Y direction as shown in FIG. 9. That is, as shown in FIG. 7, in the Y direction, a width WBY1 of the lower end of the bit line contact CB is smaller than a width WBY2 of the upper end of the bit line contact CB. On the other hand, as shown in FIG. 9, in the X direction, a width WBX1 of the lower end of the bit line contact CB is larger than a width WBX2 of the upper end of the bit line contact CB. Therefore, it is possible to suppress a cross-sectional area of the upper end or lower end of the contact becoming extremely small, and thereby prevent an increase in wiring line resistance.

Moreover, in the present embodiment, as shown in FIG. 7, the bit line BL and the bit line contact CB are formed integrally. Therefore, contact resistance between the bit line BL and the bit line contact CB may be ignored, and wiring line resistance can be more reduced compared to when the bit line BL and the bit line contact CB are formed separately, for example.

Note that in the present embodiment, as shown in FIG. 7, the lower surface of the bit line BL and a side surface in the Y direction (surface intersecting the Y direction) and lower surface of the bit line contact CB are covered by the barrier metal layer 231. In contrast, as shown in FIG. 9, side surfaces in the X direction (surface intersecting the X direction) of the bit line BL and the bit line contact CB contact a nitride layer 261. However, the nitride layer 261 may be omitted. In such a case, the side surfaces in the X direction of the bit line BL and the bit line contact CB sometimes contact an inter-layer insulating layer 228.

Moreover, in the present embodiment, as shown in FIG. 9, a side surface in the Y direction of the bit line BL and a side surface in the Y direction of the bit line contact CB are formed continuously.

Figure 10:
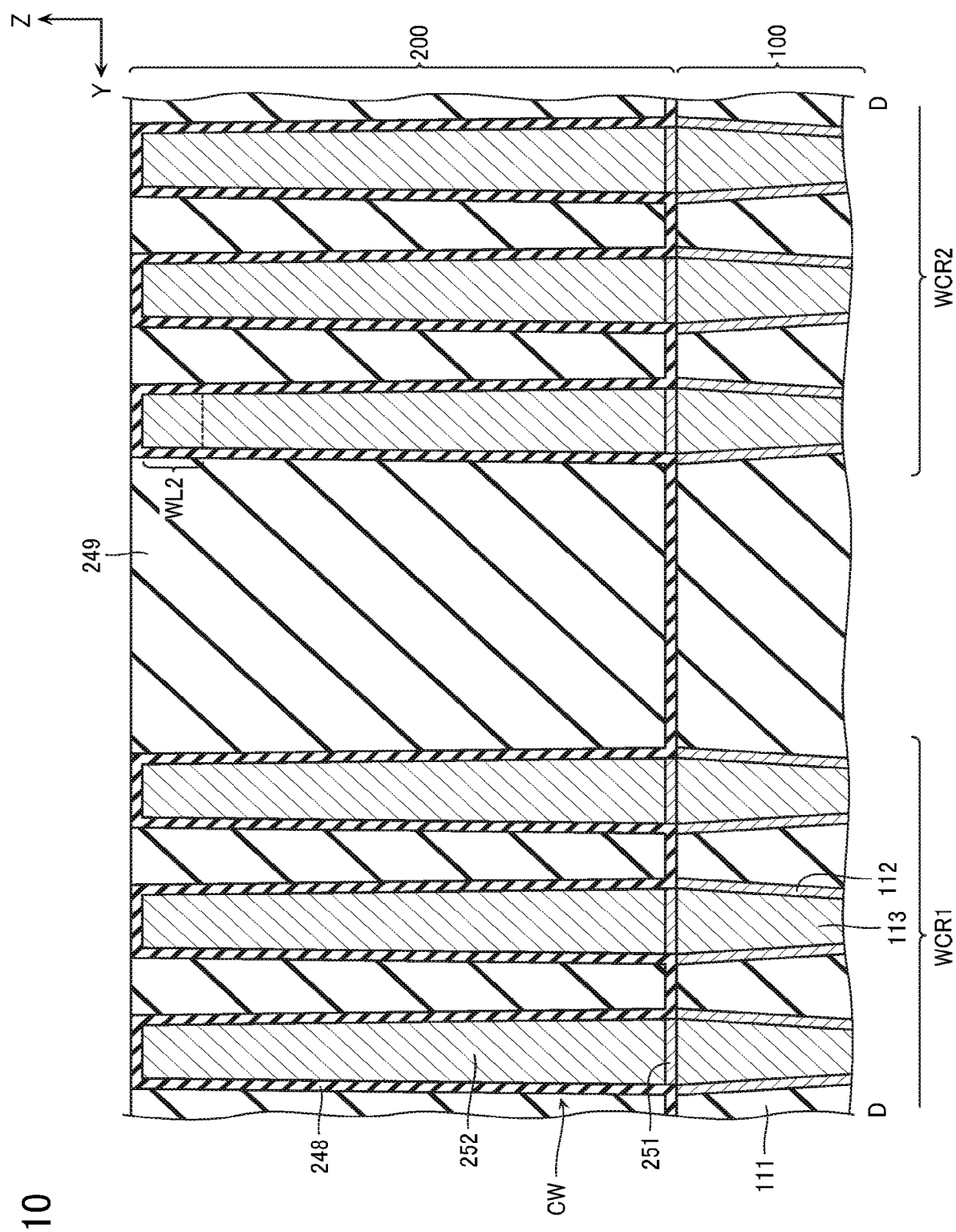

Note that as shown in FIGS. 6 and 10, in the present embodiment, the word line contact CW is also formed substantially similarly to the bit line contact CB. That is, as shown in FIGS. 6 and 10, in the present embodiment, a position and width in the Y direction of the word line WL2 substantially matches a position and width in the Y direction of the word line contact CW. Moreover, in the word line contact regions WCR1 and WCR2, a plurality of the word line contacts CW are lined up in the Y direction with an identical pitch to that of the word lines WL, and positions in the X direction of these plurality of word line contacts CW are substantially matched.

Therefore, in the semiconductor memory device according to the present embodiment, not only an area of the bit line contact region BCR, but also areas of the word line contact regions WCR1 and WCR2 can be reduced.

In addition, the word line contact CW may be formed in an inversely tapered shape when viewed from the Y direction as shown in FIG. 8, and may be formed in a forwardly tapered shape when viewed from the X direction as shown in FIG. 10.

Moreover, as shown in FIG. 8, the word line WL2 and the word line contact CW may be formed integrally.

In addition, a lower surface of the word line WL2 and a side surface in the X direction and lower surface of the word line contact region WCR1 or WCR2 may be covered by the barrier metal layer 251 as shown in FIG. 8, and an upper surface and side surface of the word line WL2 and a side surface in the Y direction of the word line contact CW may be covered by a nitride layer 248 as shown in FIG. 10.

Moreover, as shown in FIG. 10, a side surface in the X direction of the word line WL2 and a side surface in the X direction of the word line contact CW may be formed continuously.

[Method of Manufacturing According to First Embodiment]

Figure 13:
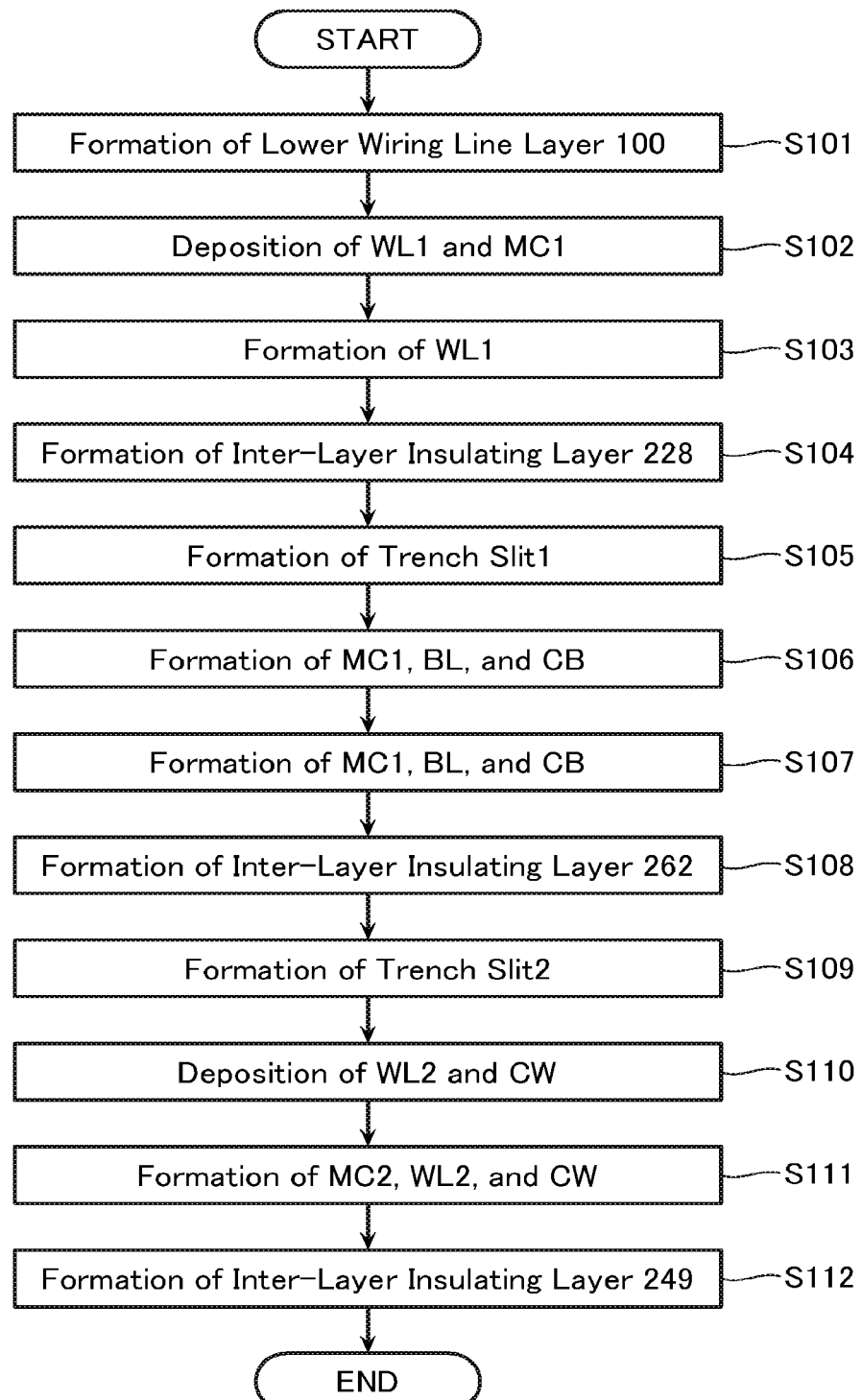
FIG. 13 is a flowchart showing a method of manufacturing the nonvolatile semiconductor memory device according to the first embodiment.

Next, a method of manufacturing the semiconductor memory device according to the present embodiment will be described with reference to FIGS. 13 to 64. FIG. 13 is a flowchart for explaining the same method of manufacturing.

Figure 14:
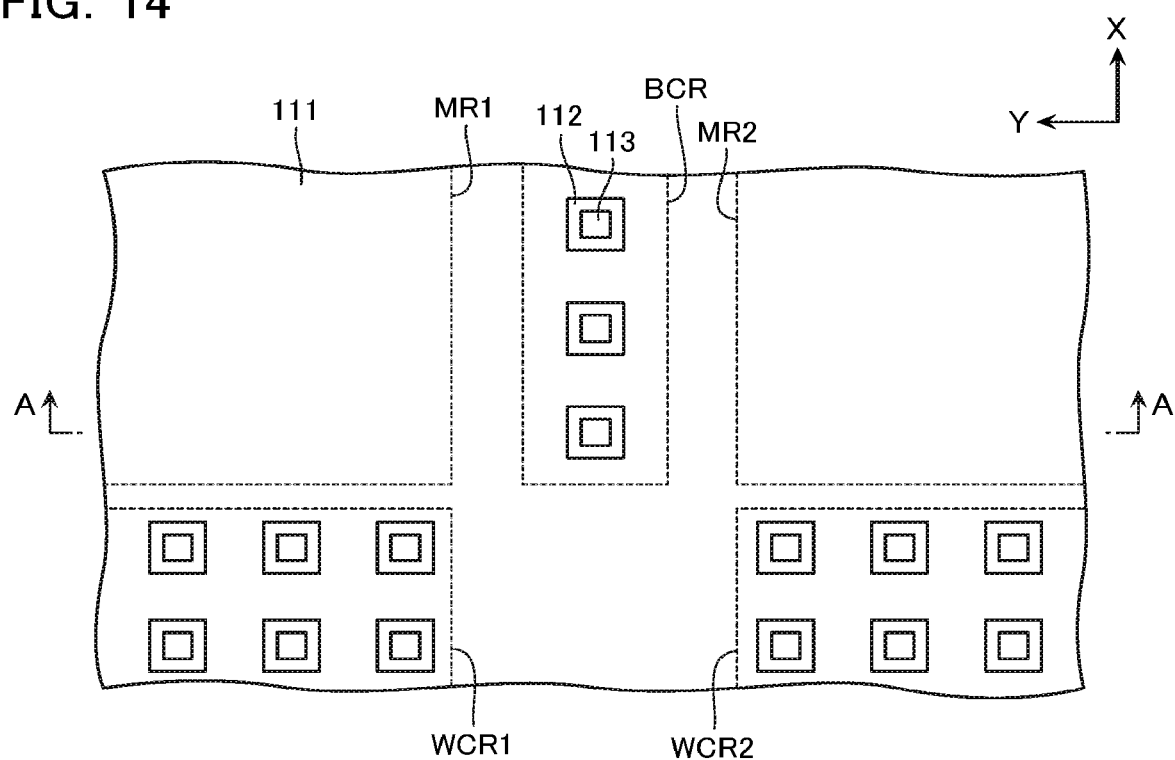
FIGS. 14, 17, 19, 21, 25, 30, 34, 39, 44, 47, 50, 54, 56, 60, and 62 are plan views showing the same method of manufacturing.
Figure 15:
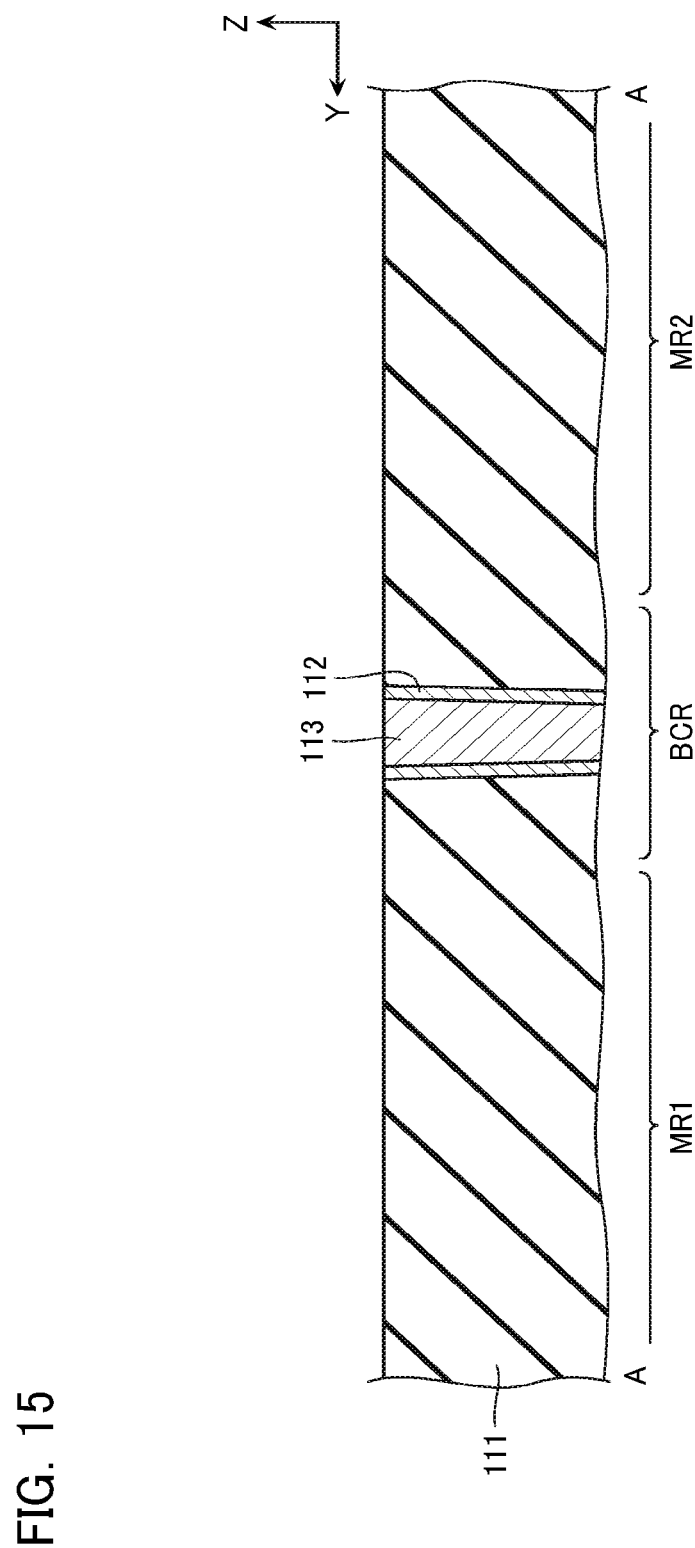
FIGS. 15, 16, 18, 20, 22 to 24, 26 to 29, 31 to 33, 35 to 38, 40 to 43, 45, 46, 48, 49, 51 to 53, 55, 57 to 59, 61, 63, and 64 are cross-sectional views showing the same method of manufacturing.

First, step S101 will be described with reference to FIGS. 13 to 15. FIG. 14 is a plan view for explaining step S101. FIG. 15 is a cross-sectional view for explaining step S101, and shows a cross-section corresponding to A-A of FIG. 14.

As shown in FIGS. 13 to 15, in step S101, the lower wiring line layer 100 is formed. For example, first, the likes of a CMOS circuit or wiring line layer configuring the control circuit described with reference to FIG. 1, are formed on an unillustrated substrate. Next, an inter-layer insulating layer 111 is formed on this substrate, and a contact hole is formed in this inter-layer insulating layer 111. The contact hole is provided at a position corresponding to the bit line contact CB and the word line contact CW. Next, a barrier metal layer 112 and the conductive layer 113 are implanted on the inside of this contact hole. The inter-layer insulating layer 111 is configured from silicon oxide ($SiO_2$), for example. The barrier metal layer 112 is configured from a conductive layer of the likes of titanium (Ti), for example. The conductive layer 113 is configured from a conductive layer of the likes of tungsten (W), for example.

Figure 16:
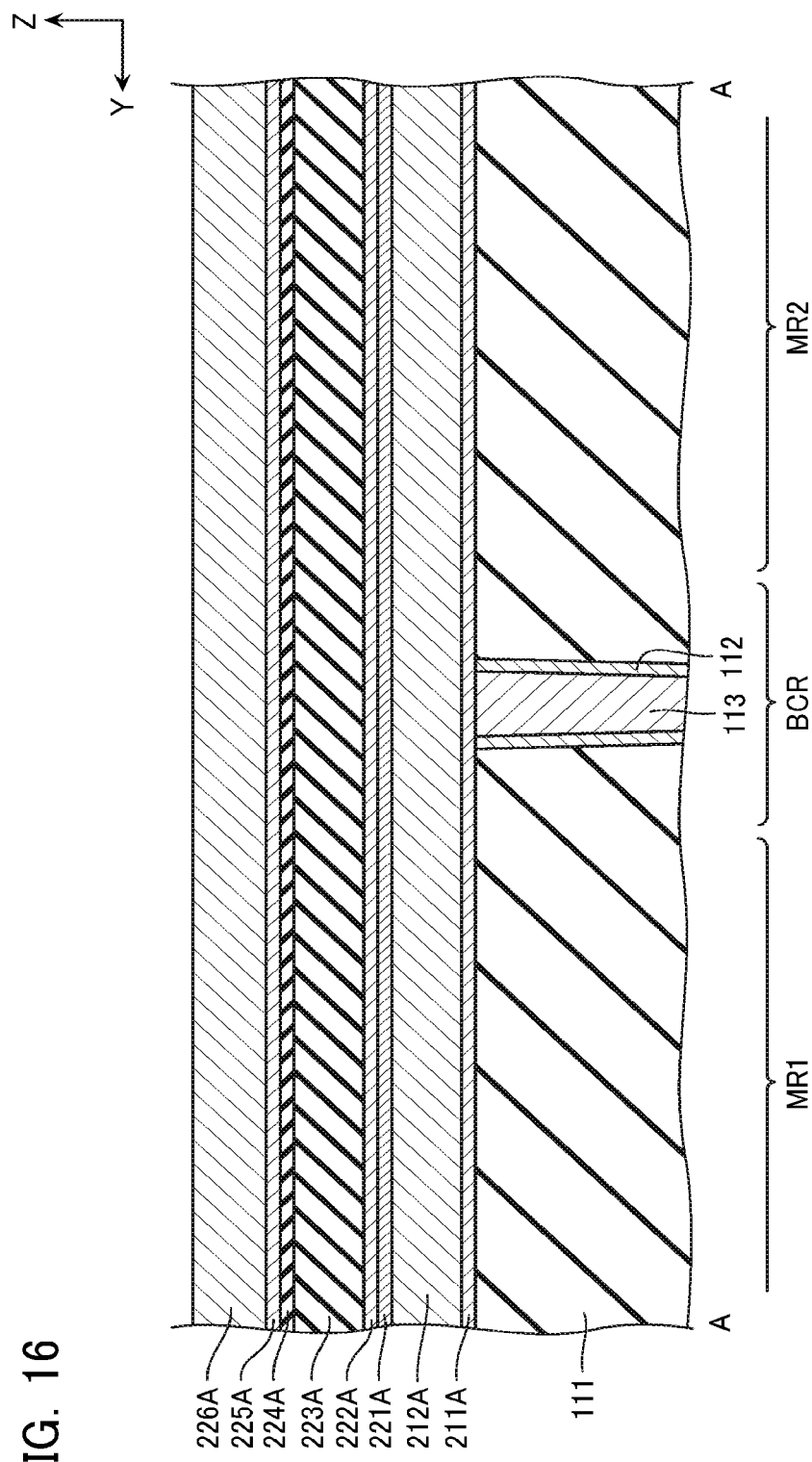

Next, step S102 will be described with reference to FIGS. 13 and 16. FIG. 16 is a cross-sectional view for explaining step S102.

As shown in FIGS. 13 and 16, in step S102, a layer forming the word line WL1 and a layer forming the memory cell MC1, are deposited.

For example, first, a barrier metal layer 211A and a conductive layer 212A that form the word line WL1, are sequentially deposited. The barrier metal layer 211A is configured from a conductive layer of the likes of titanium (Ti), for example. The conductive layer 212A is configured from a conductive layer of the likes of tungsten (W), for example.

Next, a barrier metal layer 221A, a metal layer 222A, an insulating layer 223A, an electrode layer 224A, a barrier metal layer 225A, and a conductive layer 226A that form the memory cell MC1, are sequentially deposited. The barrier metal layers 221A and 225A are configured from a conductive layer of the likes of titanium (Ti), for example. The metal layer 222A is configured from a metal such as silver (Ag) or copper (Cu), for example. The insulating layer 223A is configured from an insulating layer of the likes of silicon oxide ($SiO_2$), for example. The electrode layer 224A is configured from a material such as tantalum silicon nitride (TaSiN), for example. The conductive layer 226A is configured from a conductive layer of the likes of tungsten (W), for example.

Figure 17:
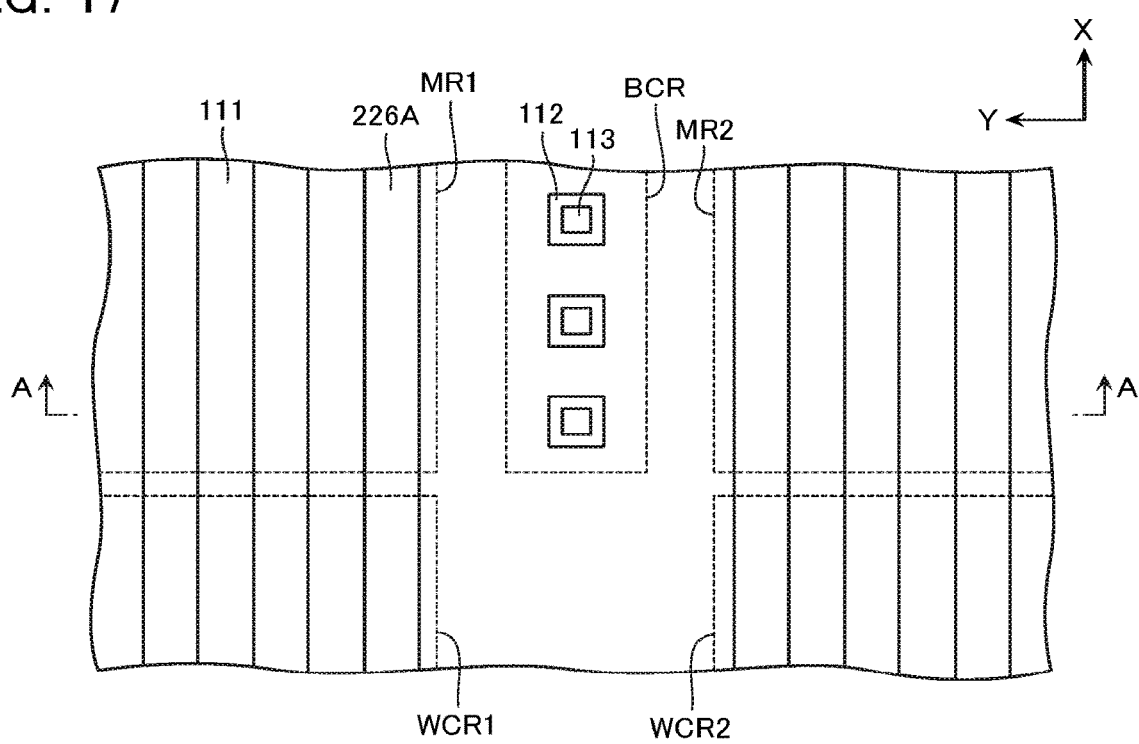
Figure 18:
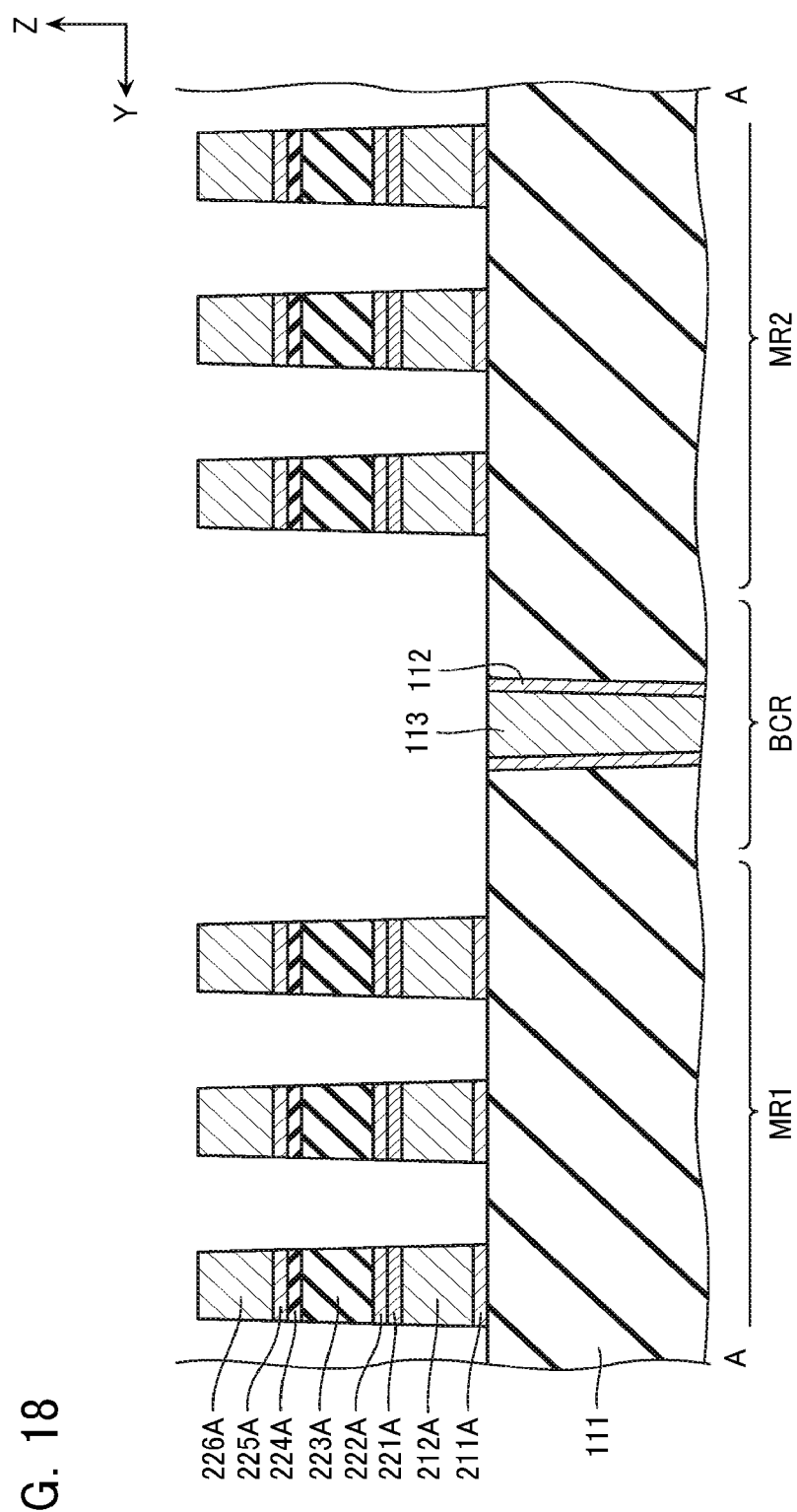

Next, step S103 will be described with reference to FIGS. 13, 17, and 18. FIG. 17 is a plan view for explaining step S103. FIG. 18 is a cross-sectional view for explaining step S103, and shows a cross-section corresponding to A-A of FIG. 17.

As shown in FIGS. 13, 17, and 18, in step S103, formation of the word line WL1 is performed. For example, each of layers forming the word line WL1 (barrier metal layer 211A and conductive layer 212A) and each of layers forming the memory cell MC1 (barrier metal layer 221A, metal layer 222A, insulating layer 223A, electrode layer 224A, barrier metal layer 225A, and conductive layer 226A) are divided in the Y direction along a pattern of the word line WL1. As a result of this step, the word line WL1 (barrier metal layer 211 and conductive layer 212) is formed.

Figure 19:
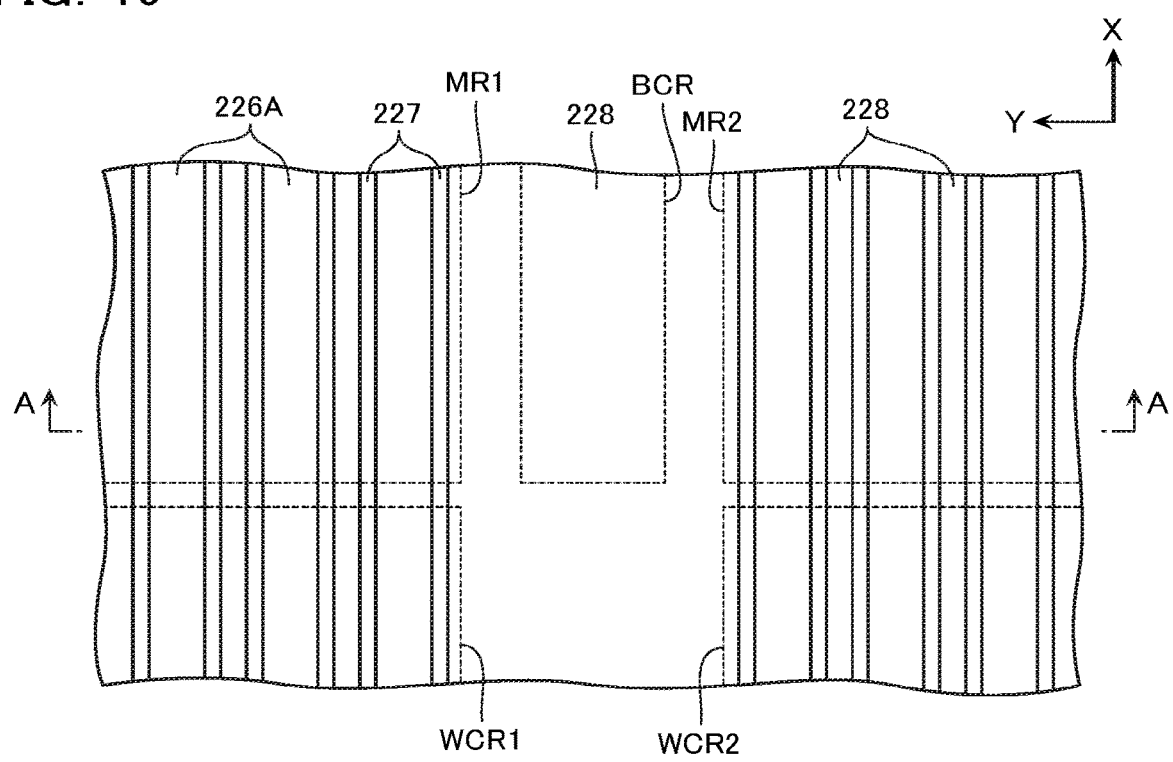
Figure 20:
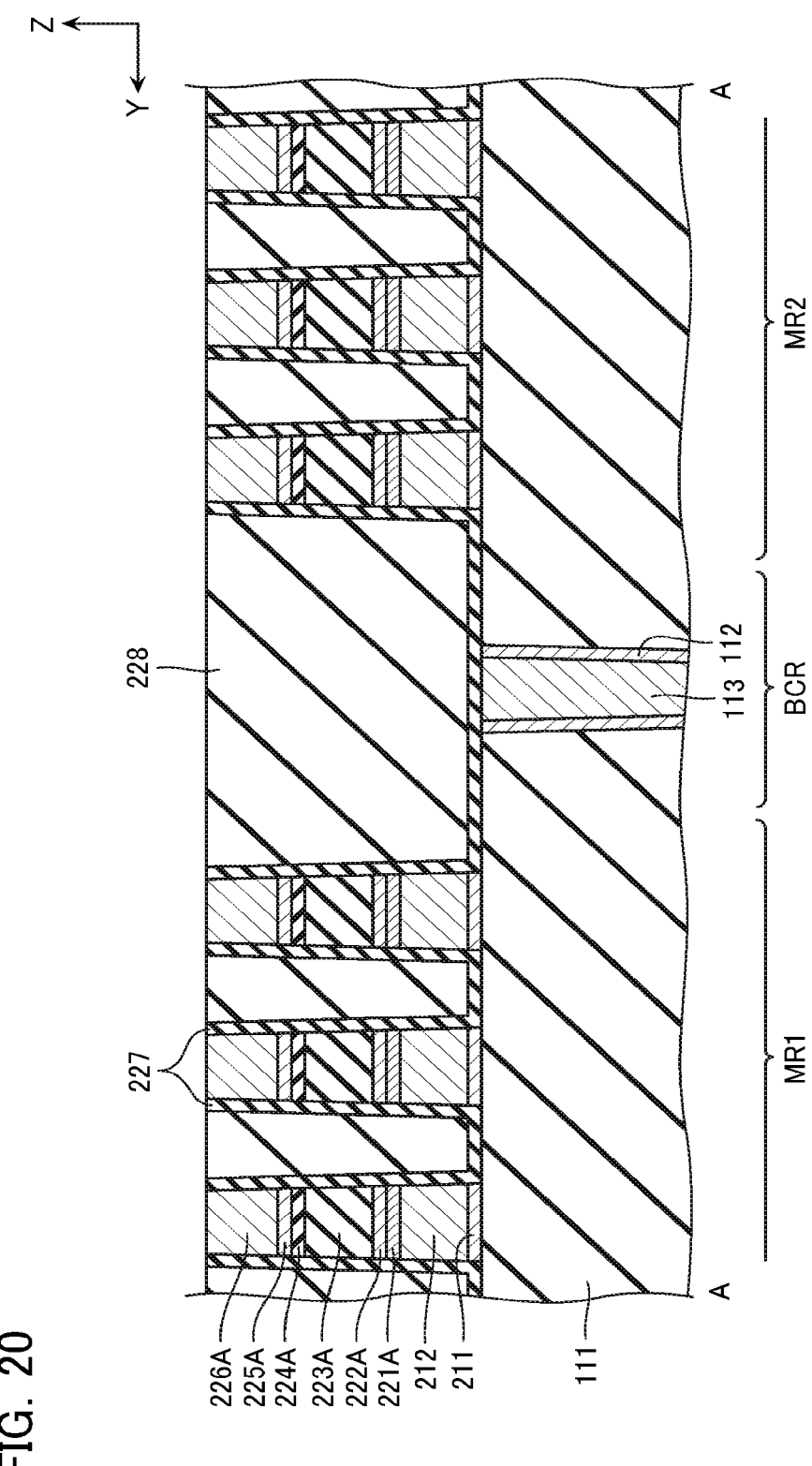

Next, step S104 will be described with reference to FIGS. 13, 19, and 20. FIG. 19 is a plan view for explaining step S104. FIG. 20 is a cross-sectional view for explaining step S104, and shows a cross-section corresponding to A-A of FIG. 19.

As shown in FIGS. 13, 19, and 20, in step S104, the inter-layer insulating layer 228 is formed. For example, the nitride layer 227 is deposited on sidewalls in the Y direction of each of the layers forming the word lines WL1 (barrier metal layer 211 and conductive layer 212) and the memory cells MC1 (barrier metal layer 221A, metal layer 222A, insulating layer 223A, electrode layer 224A, barrier metal layer 225A, and conductive layer 226A) adjacent in the Y direction and on an upper surface of the inter-layer insulating layer 111. The nitride layer 227 is configured from silicon nitride (SiN), for example. Next, the inter-layer insulating layer 228 is implanted between the nitride layers 227. The inter-layer insulating layer 228 is configured from silicon oxide ($SiO_2$), for example.

Figure 21:
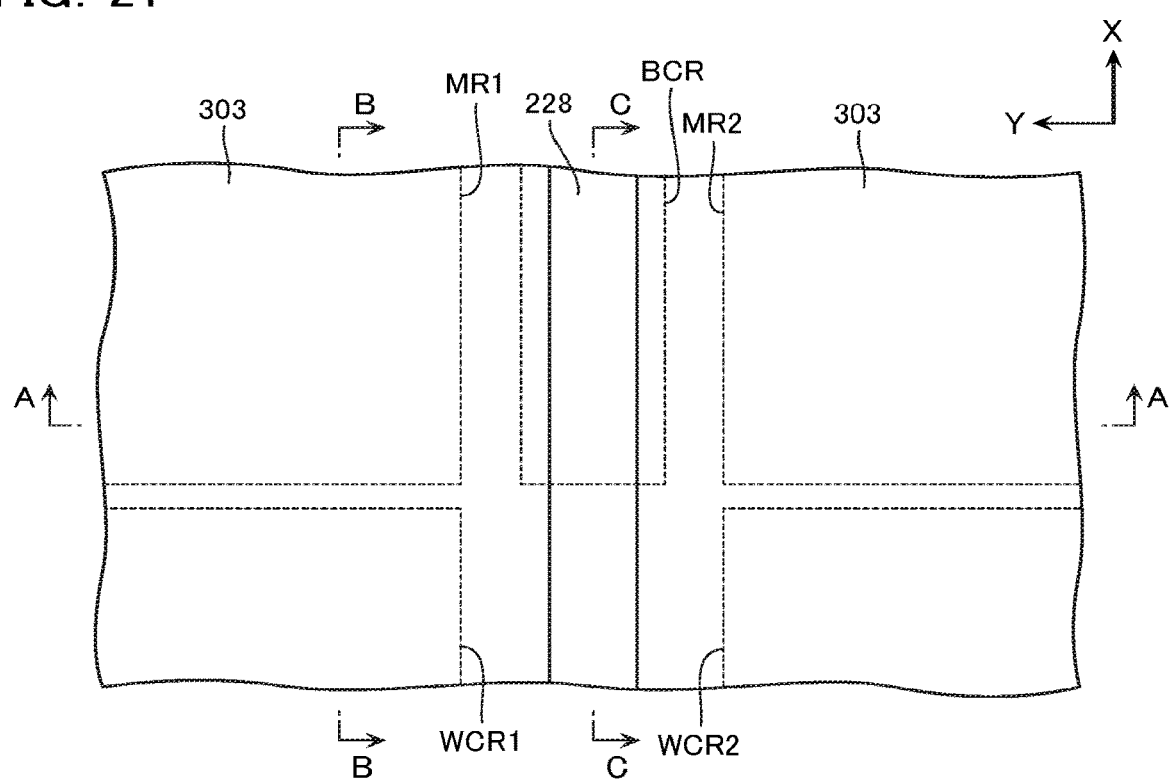
Figure 22:
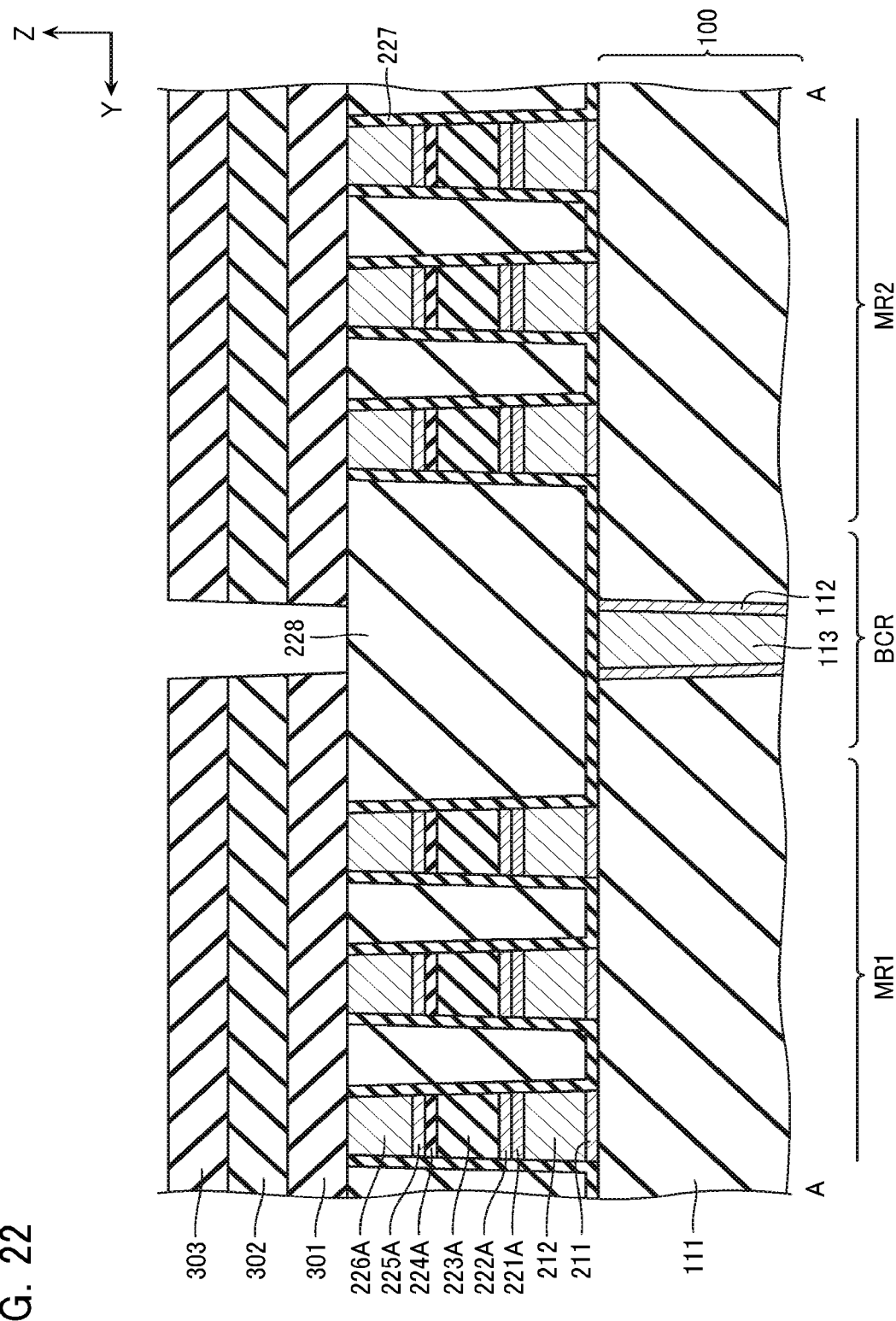
Figure 23:
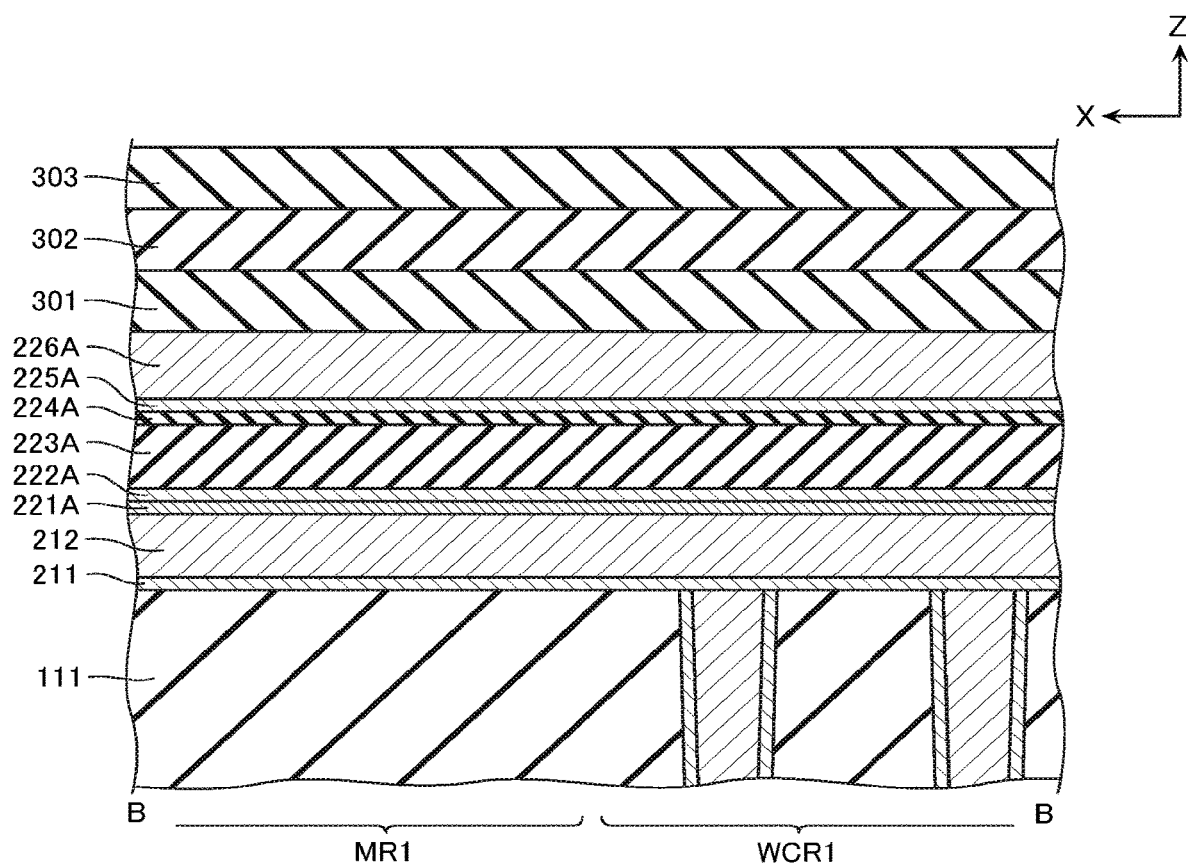
Figure 24:
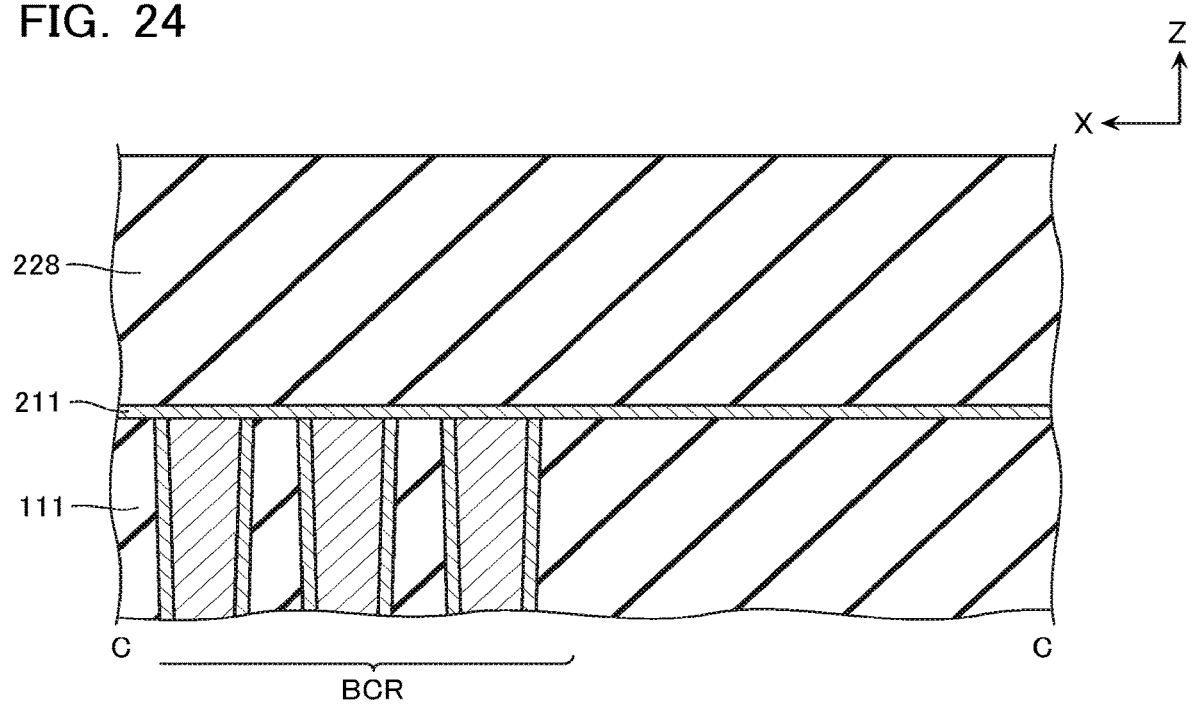
Figure 25:
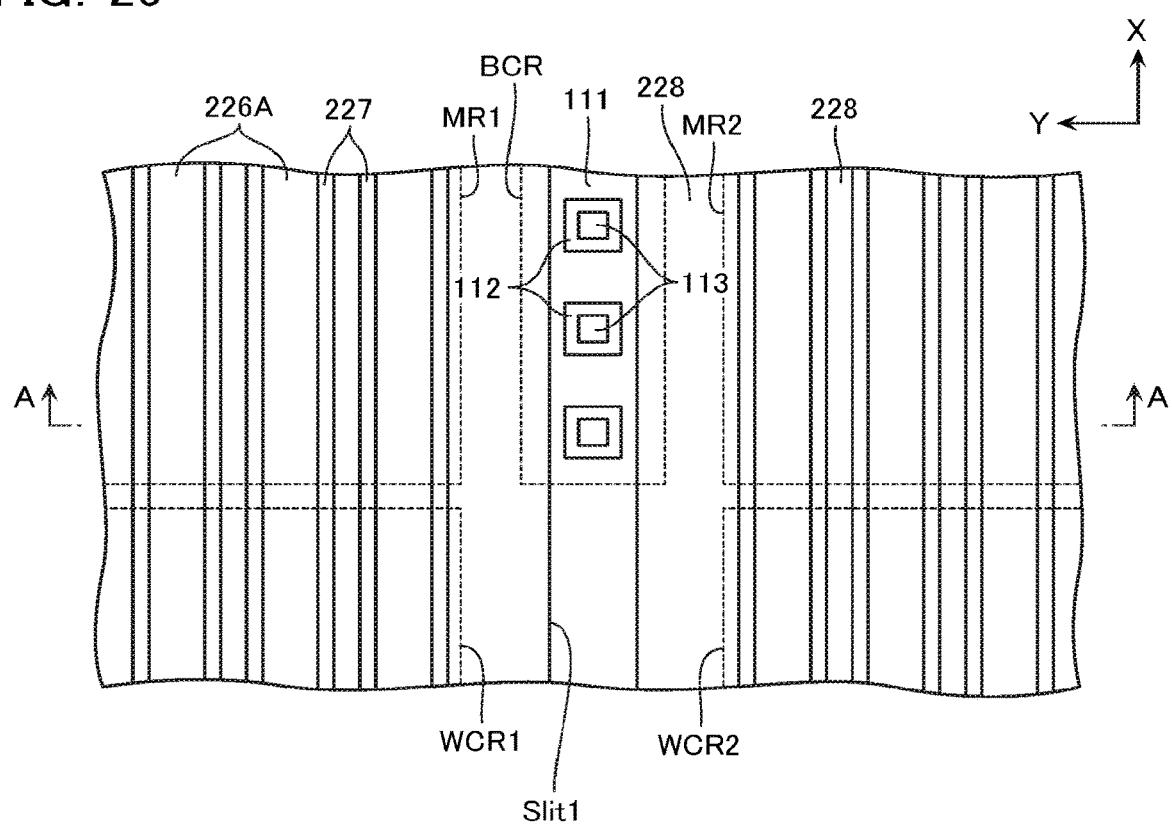

Next, step S105 will be described with reference to FIG. 13 and FIGS. 21 to 26. FIGS. 21 and 25 are plan views for explaining step S105. FIGS. 22 to 24 are cross-sectional views for explaining step S105, and respectively show cross-sections corresponding to A-A through C-C of FIG. 21. Moreover, FIG. 26 is a cross-sectional view for explaining step S105, and shows a cross-section corresponding to A-A of FIG. 25.

Figure 26:
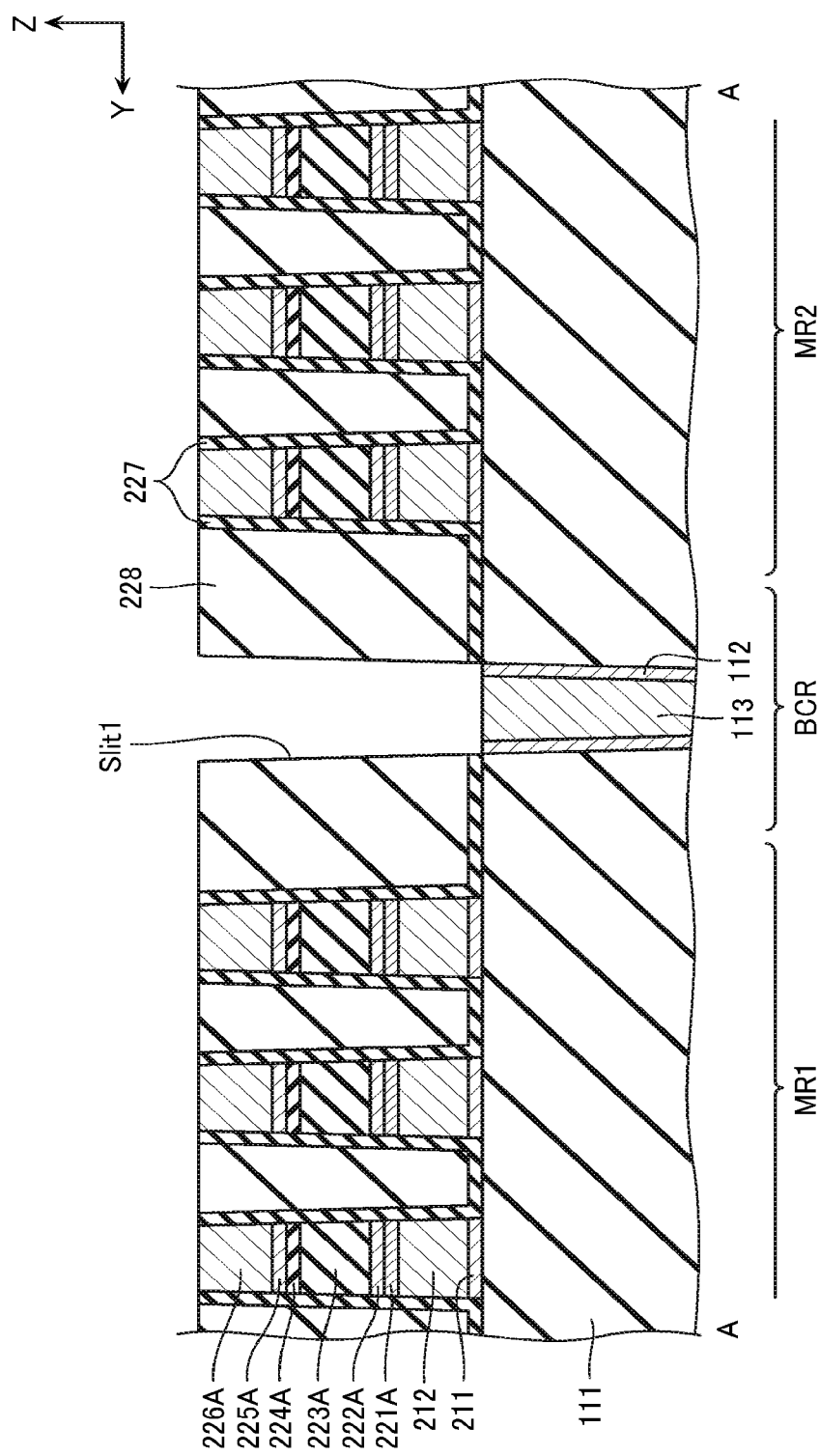

As shown in FIG. 13 and FIGS. 21 to 26, in step S105, a trench Slit1 is formed in the inter-layer insulating layer 228. For example, first, as shown in FIGS. 21 to 24, masks 301, 302, and 303 covering the memory regions MR1 and MR2 are formed. Next, as shown in FIGS. 25 and 26, anisotropic etching such as RIE is performed using these masks 301, 302, and 303, and the trench Slit1 is formed. The trench Slit1 extends in the X direction along the bit line contact region BCR. Moreover, the inter-layer insulating layer 111, barrier metal layer 112, and conductive layer 113 of the lower wiring line layer 100 are exposed at a lower surface of the trench Slit1.

Figure 27:
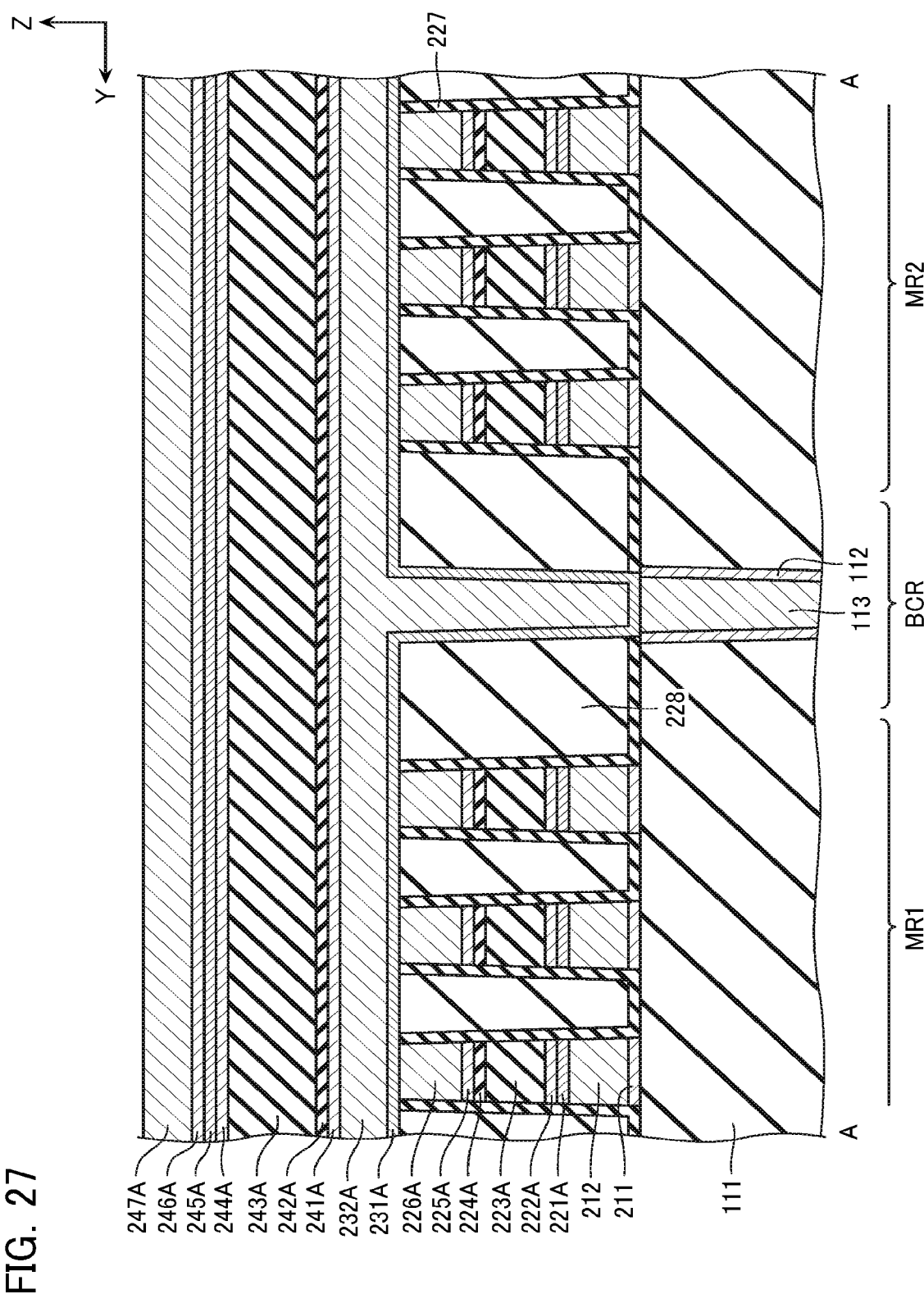
Figure 28:
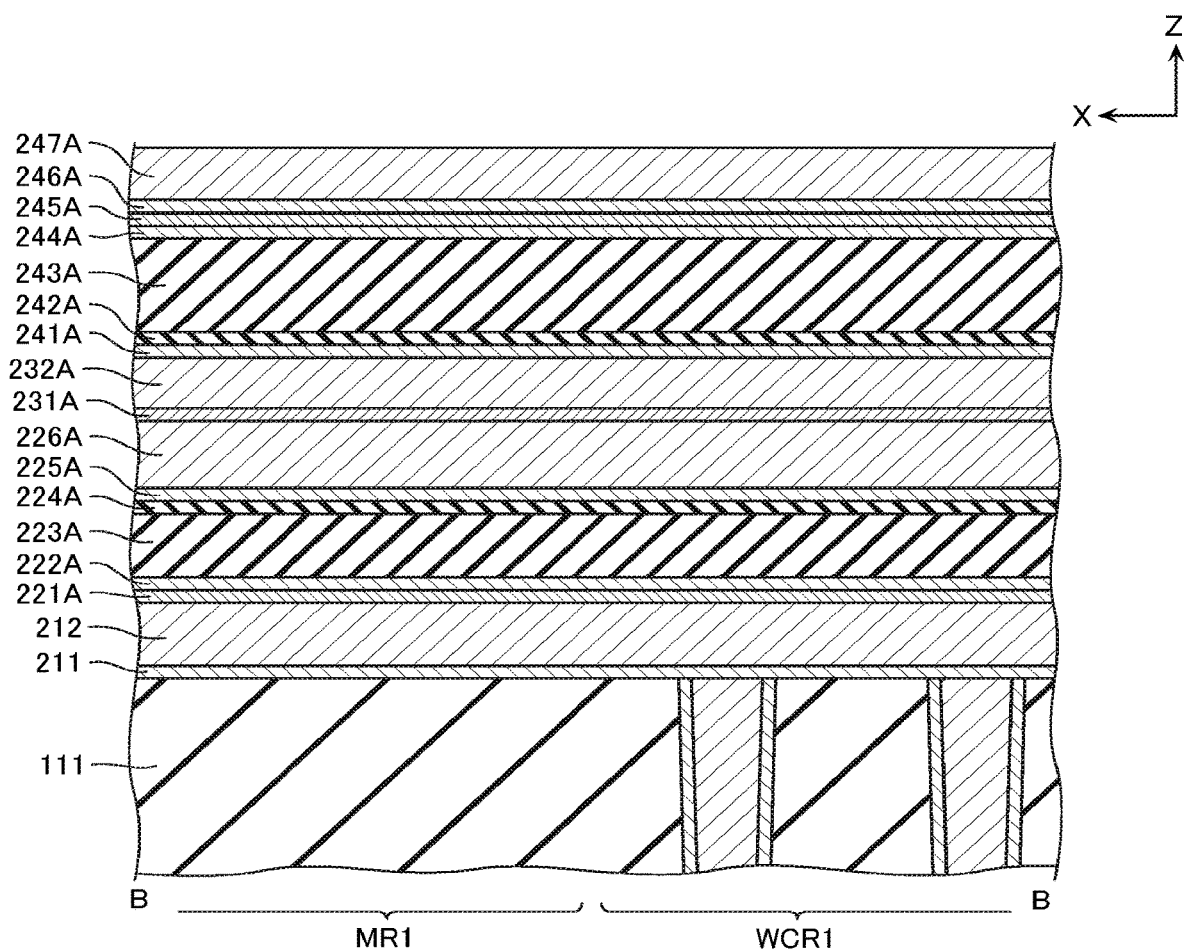
Figure 29:
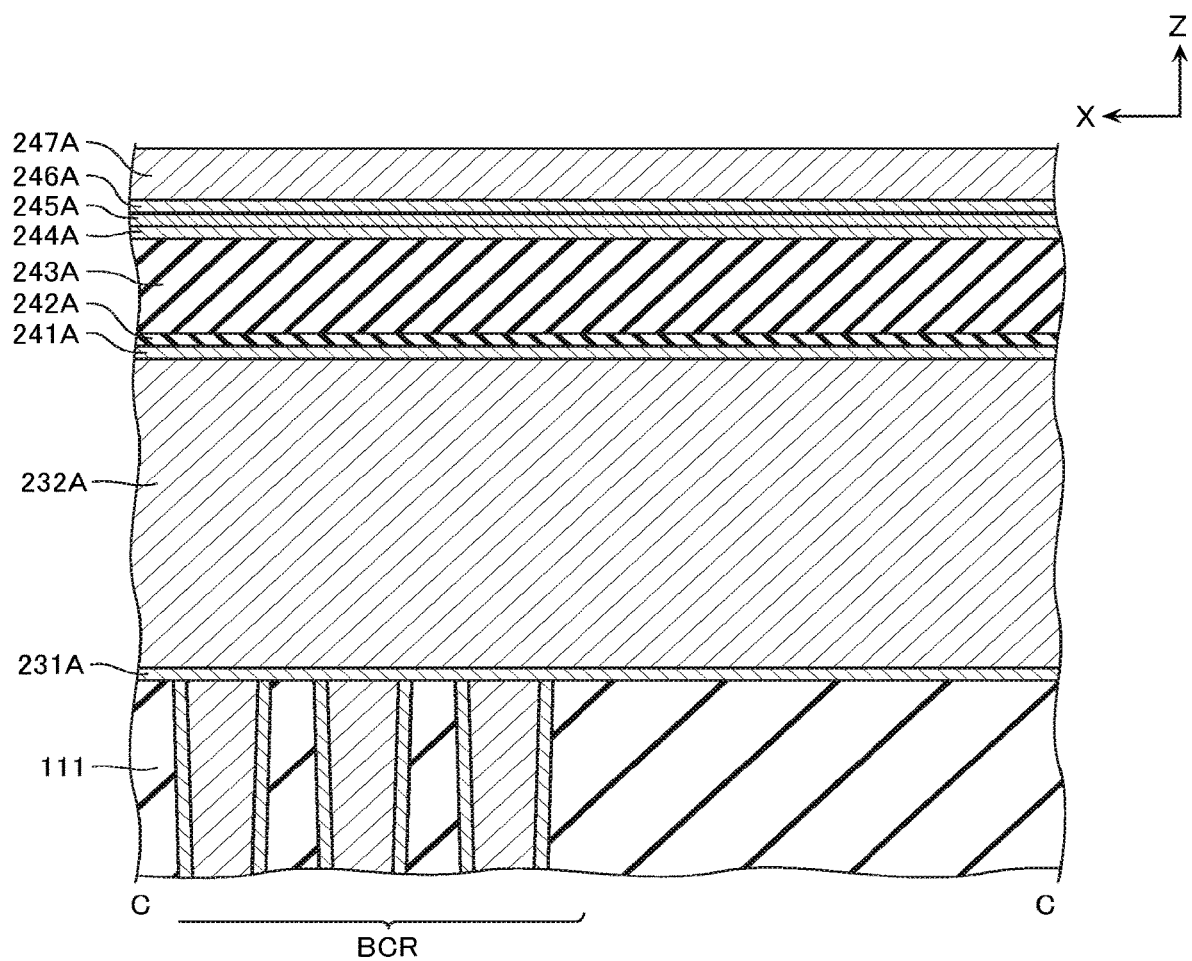
Figure 30:
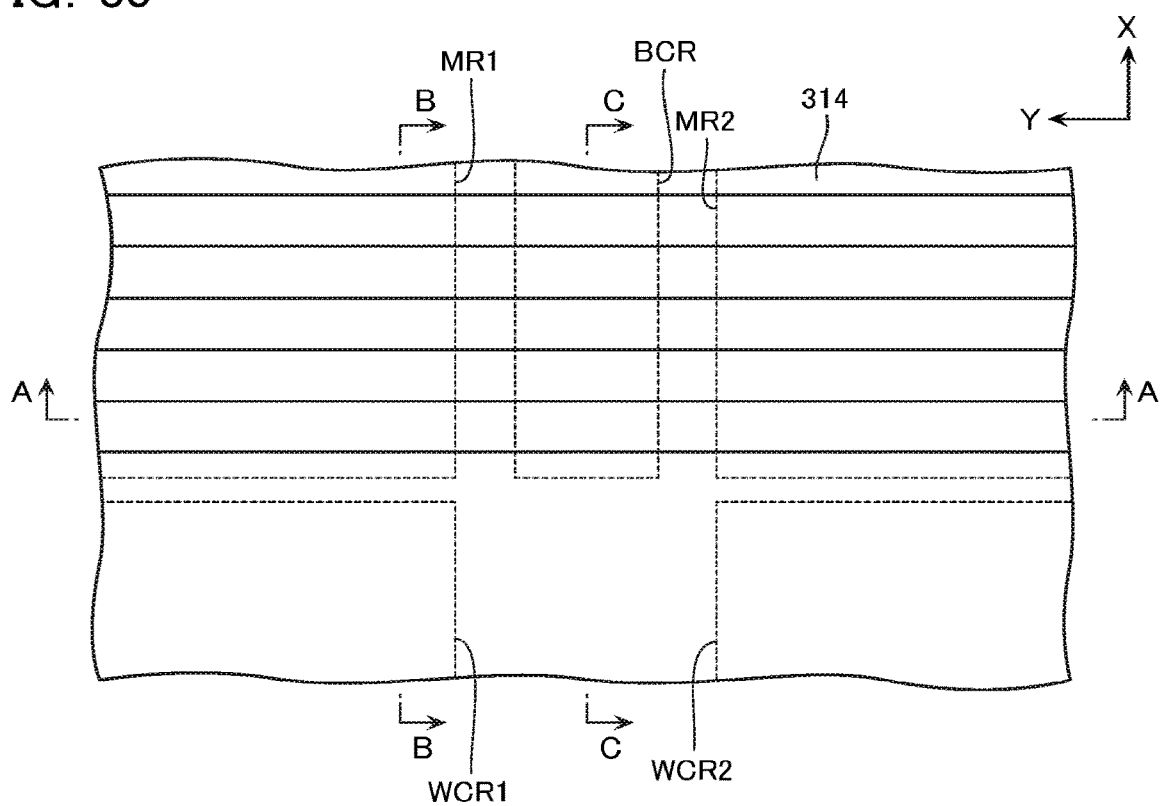

Next, step S106 will be described with reference to FIG. 13 and FIGS. 27 to 29. FIGS. 27 to 29 are cross-sectional views for explaining step S106.

As shown in FIG. 13 and FIGS. 27 to 29, in step S106, a layer forming the bit line BL and bit line contact CB and a layer forming the memory cell MC2, are deposited.

For example, first, a barrier metal layer 231A and a conductive layer 232A that form the bit line BL and the bit line contact CB, are sequentially deposited. The barrier metal layer 231A is configured from a conductive layer of the likes of titanium (Ti), for example. The conductive layer 232A is configured from a conductive layer of the likes of tungsten (W), for example.

Now, as shown in FIGS. 27 and 29, the barrier metal layer 231A and conductive layer 232A cover upper surfaces of the conductive layer 226A and the inter-layer insulating layer 228. Moreover, the barrier metal layer 231A and conductive layer 232A are implanted also on the inside of the trench Slit1, and contact the inter-layer insulating layer ill, barrier metal layer 112, and conductive layer 113 of the lower wiring line layer 100 at the lower surface of the trench Slit1.

Next, a barrier metal layer 241A, an electrode layer 242A, an insulating layer 243A, a barrier metal layer 244A, a metal layer 245A, a barrier metal layer 246A, and a conductive layer 247A that form the memory cell MC2, are sequentially deposited. The barrier metal layers 241A, 244A, and 246A are configured from a conductive layer of the likes of titanium (Ti), for example. The electrode layer 242A is configured from a material such as tantalum silicon nitride (TaSiN), for example. The insulating layer 243A is configured from an insulating layer of the likes of silicon oxide ($SiO_2$), for example. The metal layer 245A is configured from a metal such as silver (Ag) or copper (Cu), for example. The conductive layer 247A is configured from a conductive layer of the likes of tungsten (W), for example.

Figure 31:
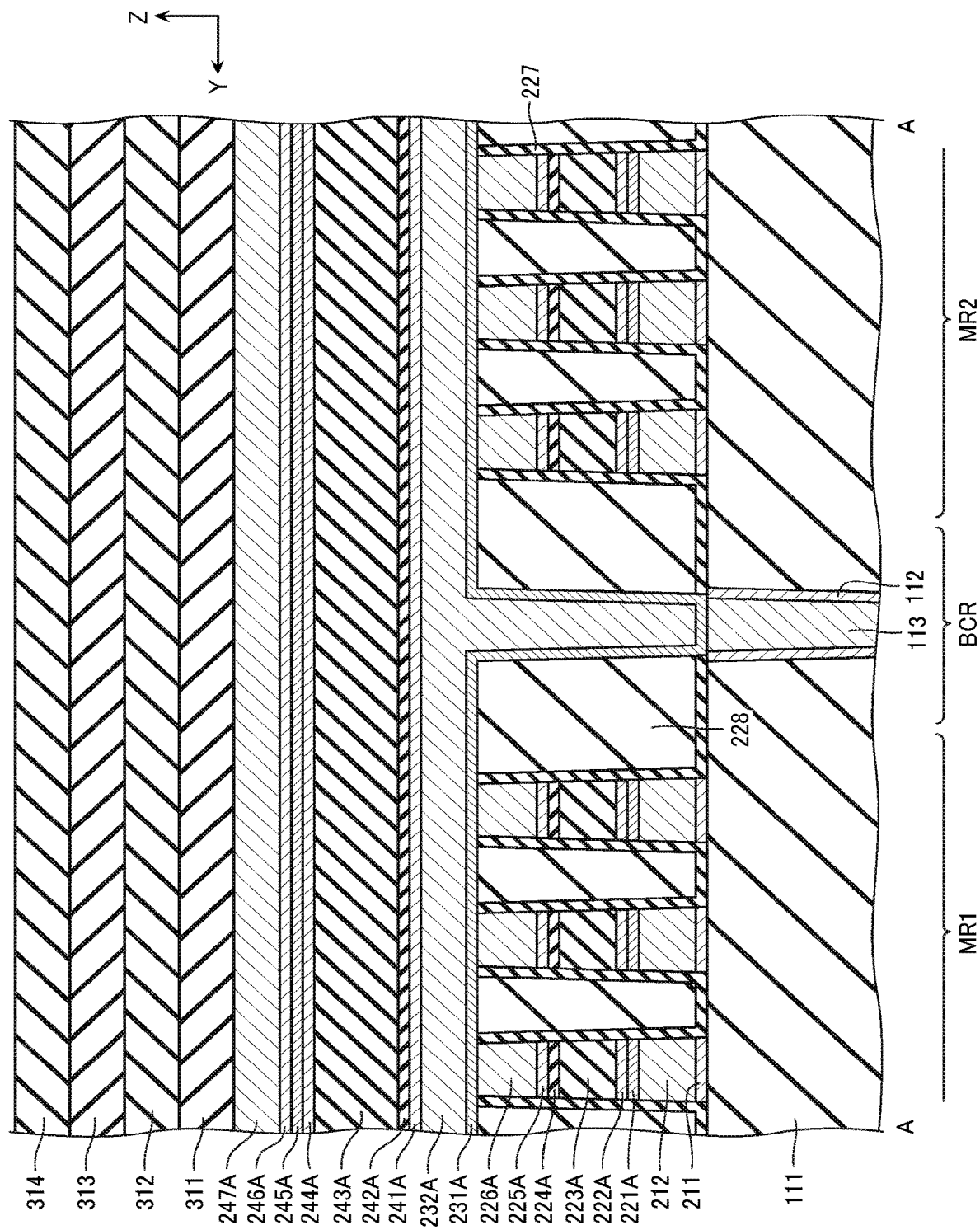
Figure 32:
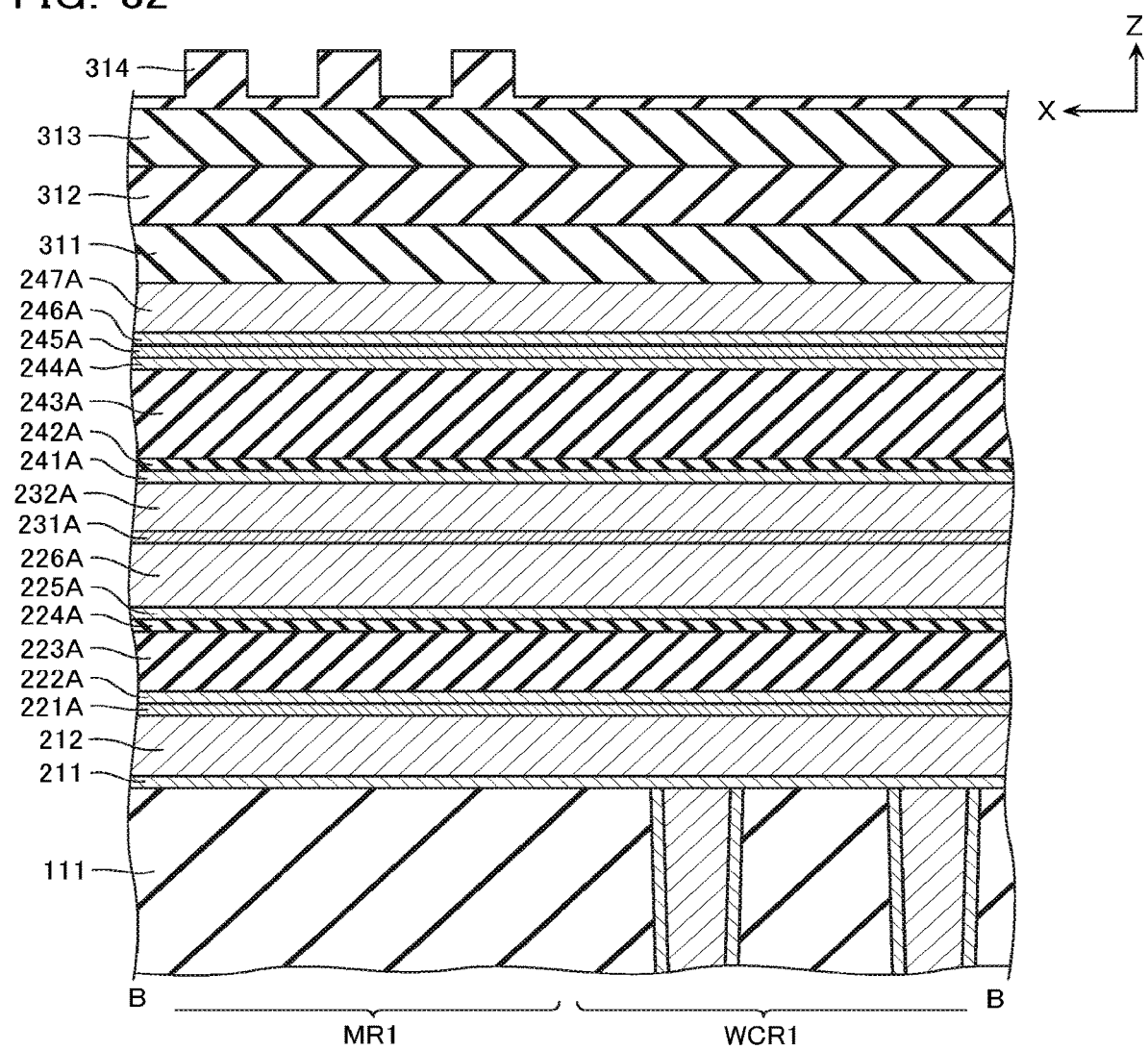
Figure 33:
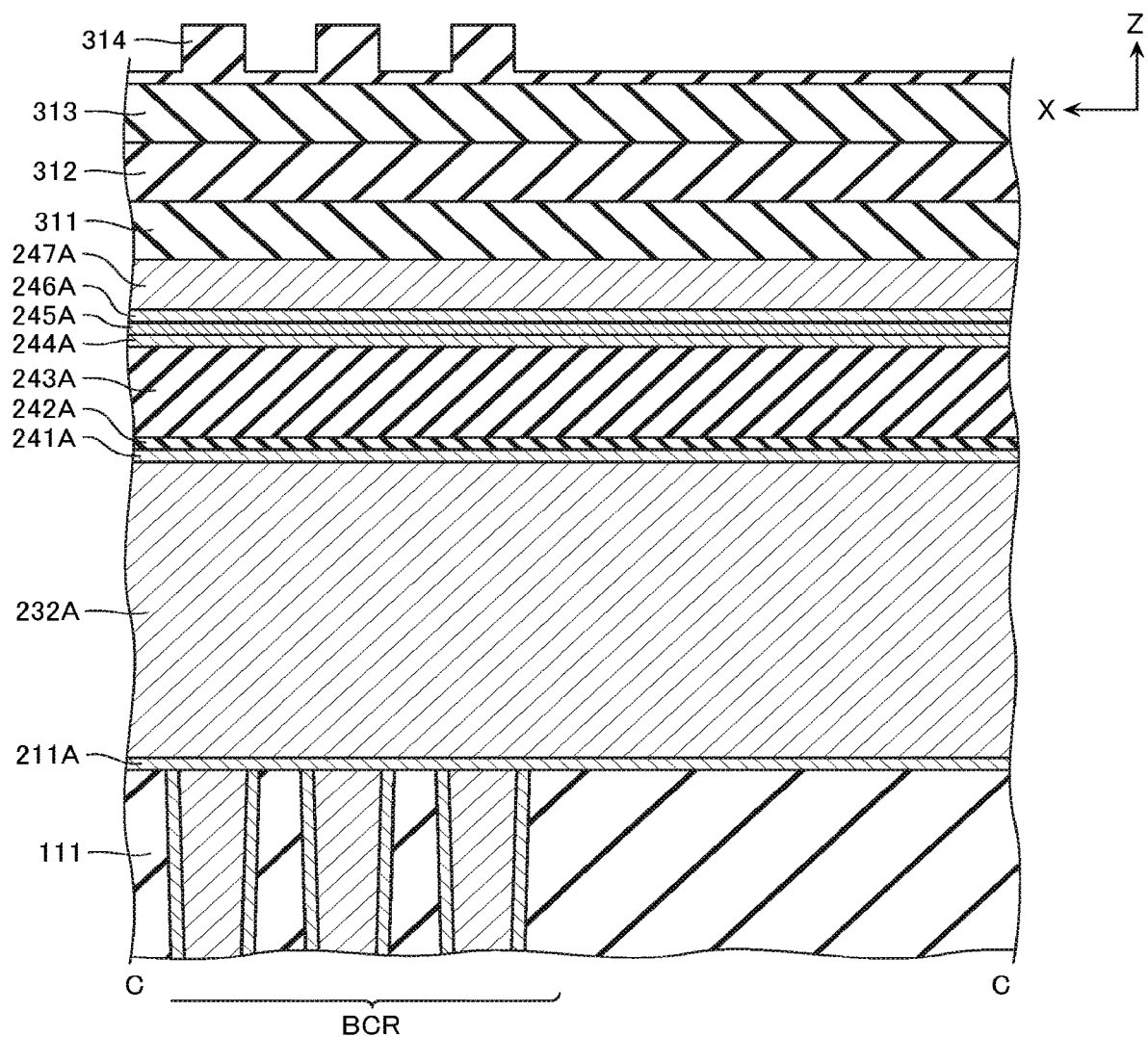
Figure 34:
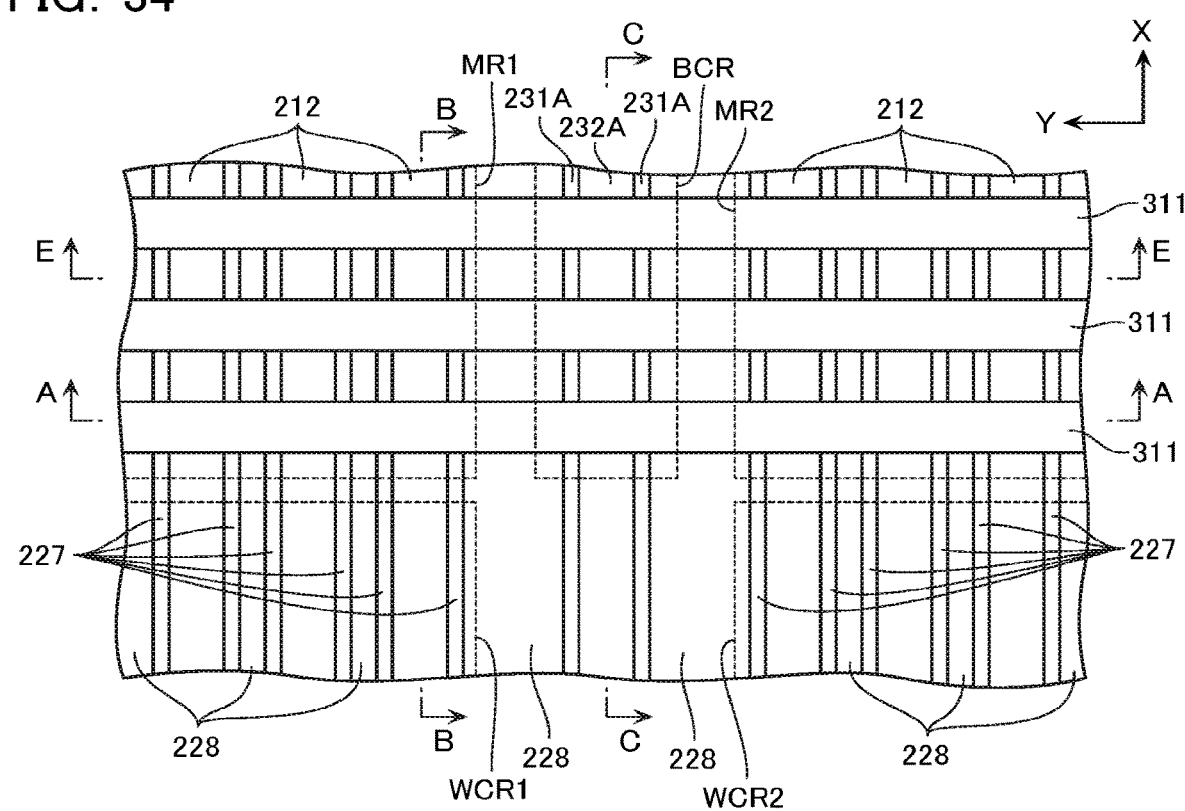
Figure 35:
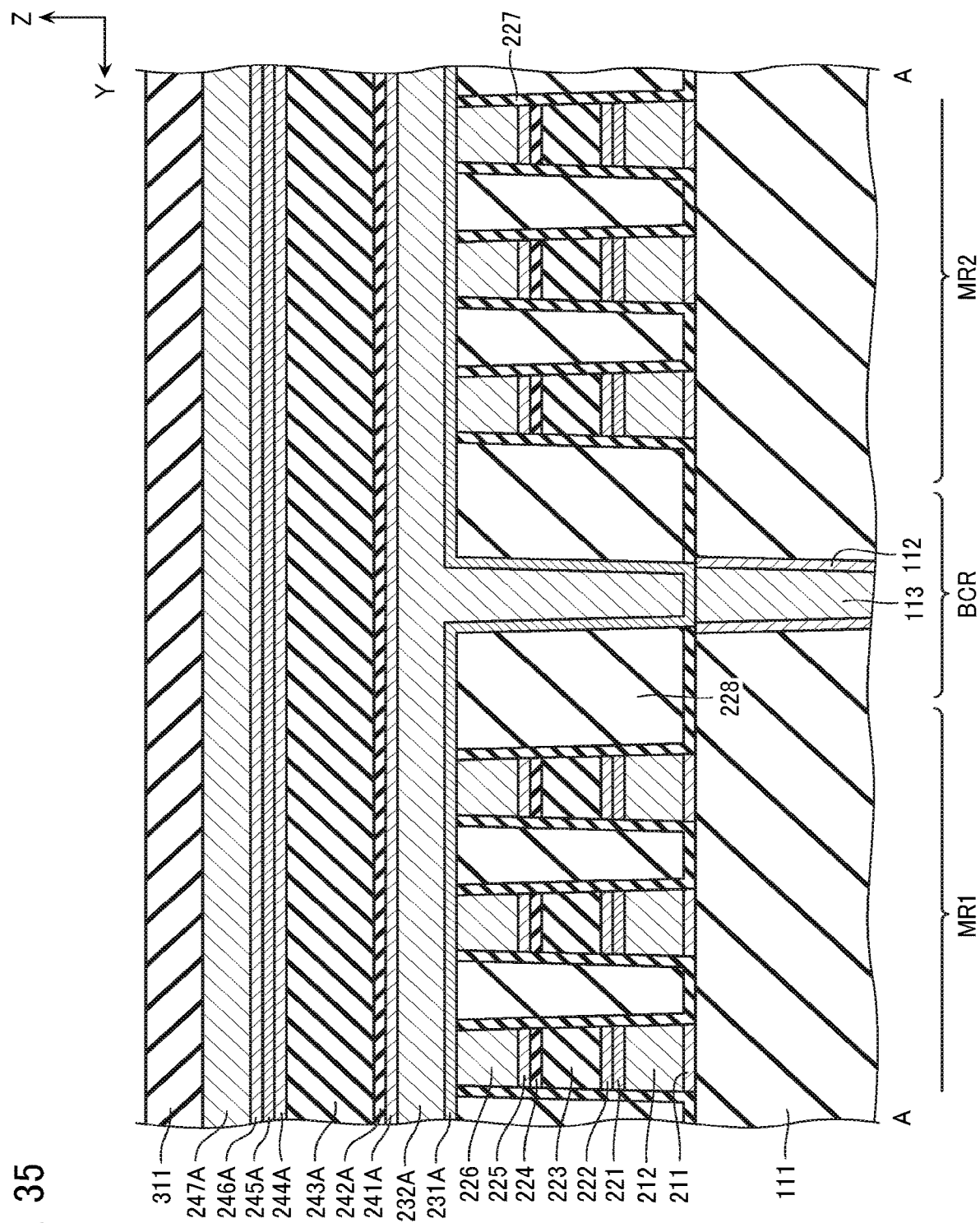

Next, step S107 will be described with reference to FIG. 13 and FIGS. 30 to 46. FIGS. 30, 34, 39, and 44 are plan views for explaining step S107. FIGS. 31 to 33 are cross-sectional views for explaining step S107, and respectively show cross-sections corresponding to A-A through C-C of FIG. 30. FIGS. 35 to 38 are cross-sectional views for explaining step S107, and respectively show cross-sections corresponding to A-A through C-C, and E-E of FIG. 34. FIGS. 40 to 43 are cross-sectional views for explaining step S107, and respectively show cross-sections corresponding to A-A through C-C, and E-E of FIG. 39. FIGS. 45 and 46 are cross-sectional views for explaining step S107, and respectively show cross-sections corresponding to C-C and E-E of FIG. 44.

As shown in FIG. 13 and FIGS. 30 to 46, in step S107, formation of the memory cell MC1, the bit line BL, and the bit line contact CB, are performed.

For example, as shown in FIGS. 30 to 33, first, masks 311, 312, 313, and 314 are formed. The mask 314 positioned in an uppermost layer is formed in a line-and-space pattern along a pattern of the bit line BL. Moreover, the masks 311, 312, 313, and 314 are formed straddling the memory regions MR1 and MR2 and the bit line contact region BCR.

Next, as shown in FIGS. 34 to 38, the masks 311, 312, 313, and 314 are utilized, and each of layers forming the memory cell MC1 (barrier metal layer 221A, metal layer 222A, insulating layer 223A, electrode layer 224A, barrier metal layer 225A, and conductive layer 226A), each of layers forming the bit line BL (barrier metal layer 231A and conductive layer 232A), and each of layers forming the memory cell MC2 (barrier metal layer 241A, electrode layer 242A, insulating layer 243A, barrier metal layer 244A, metal layer 245A, barrier metal layer 246A, and conductive layer 247A) are divided in the X direction along the pattern of the bit line BL. As a result, the memory cell MC1 (barrier metal layer 221, metal layer 222, insulating layer 223, electrode layer 224, barrier metal layer 225, and conductive layer 226) and the bit line BL are formed.

Figure 36:
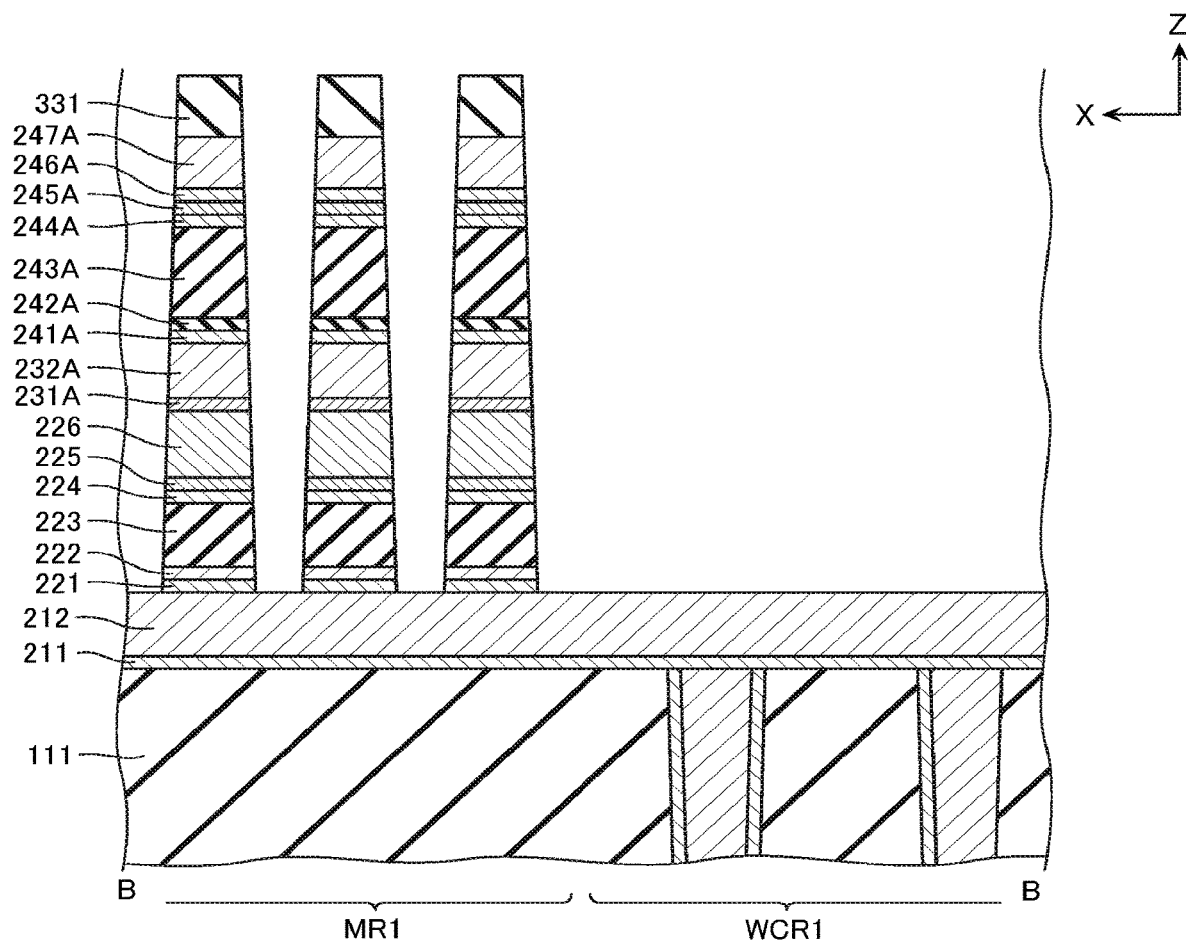
Figure 37:
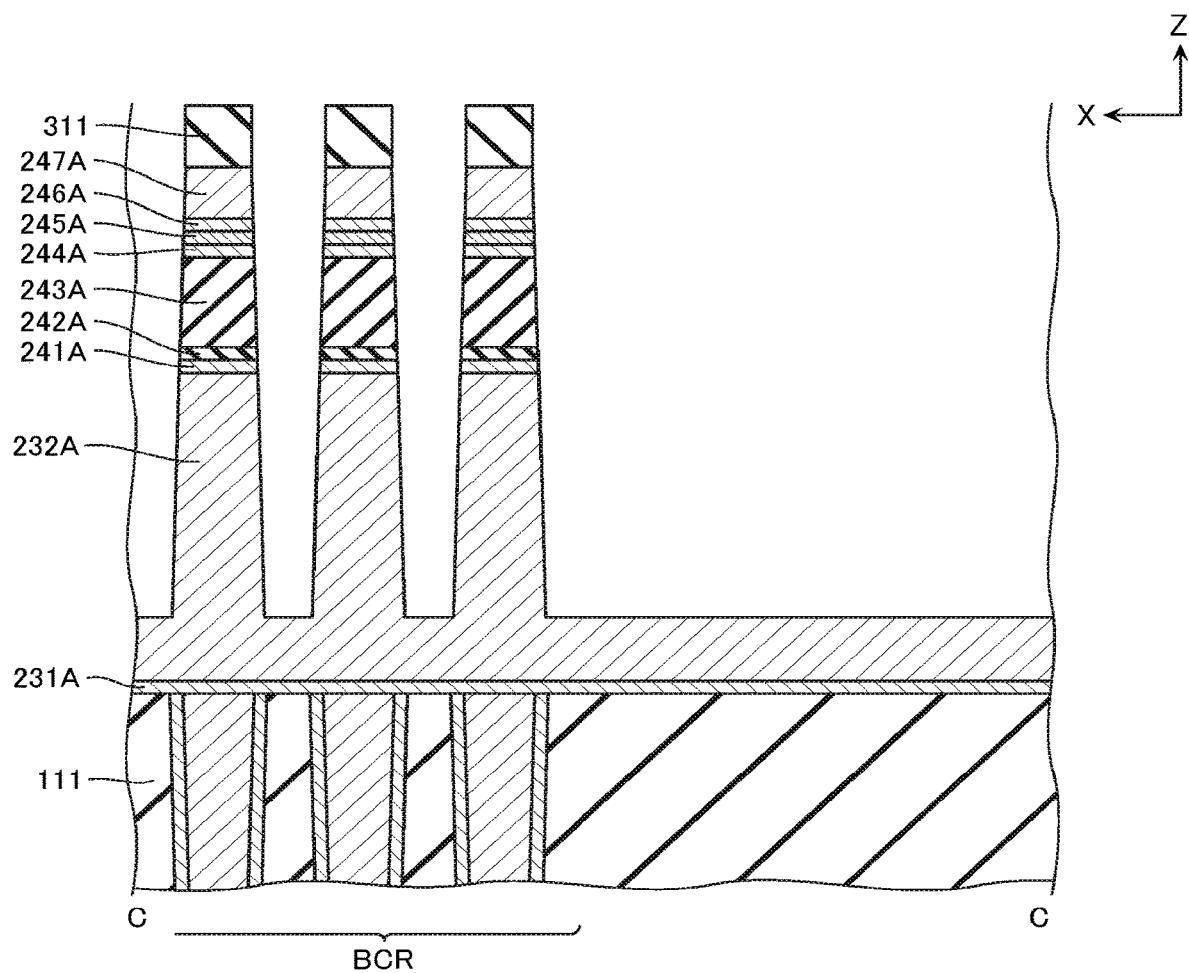
Figure 38:
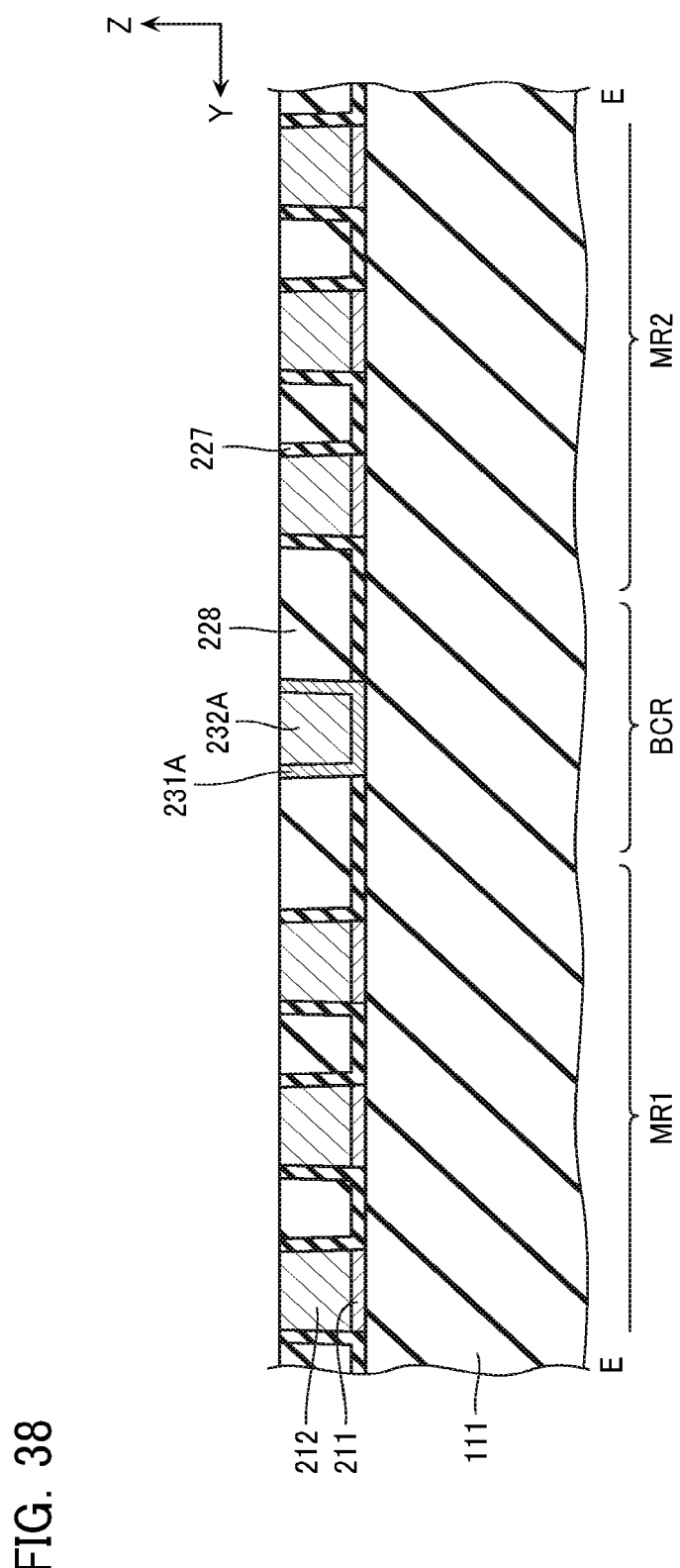
Figure 39:
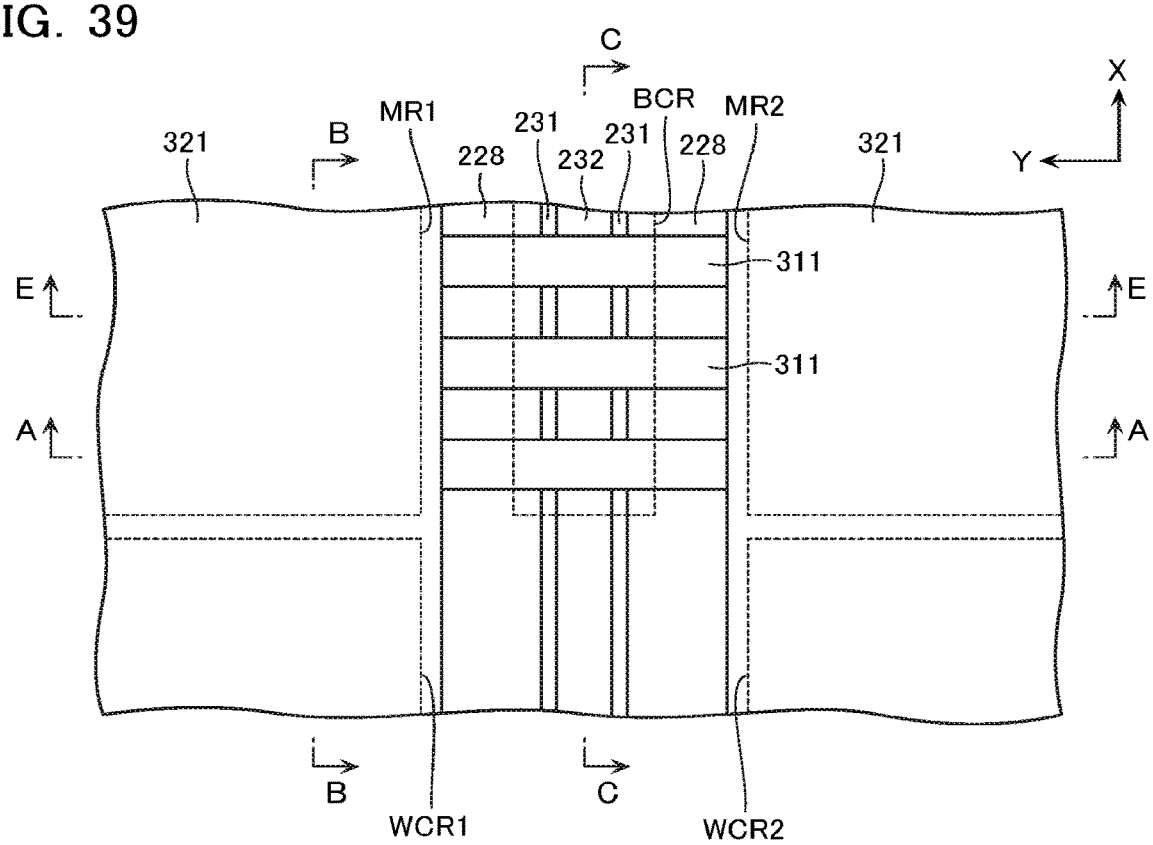
Figure 40:
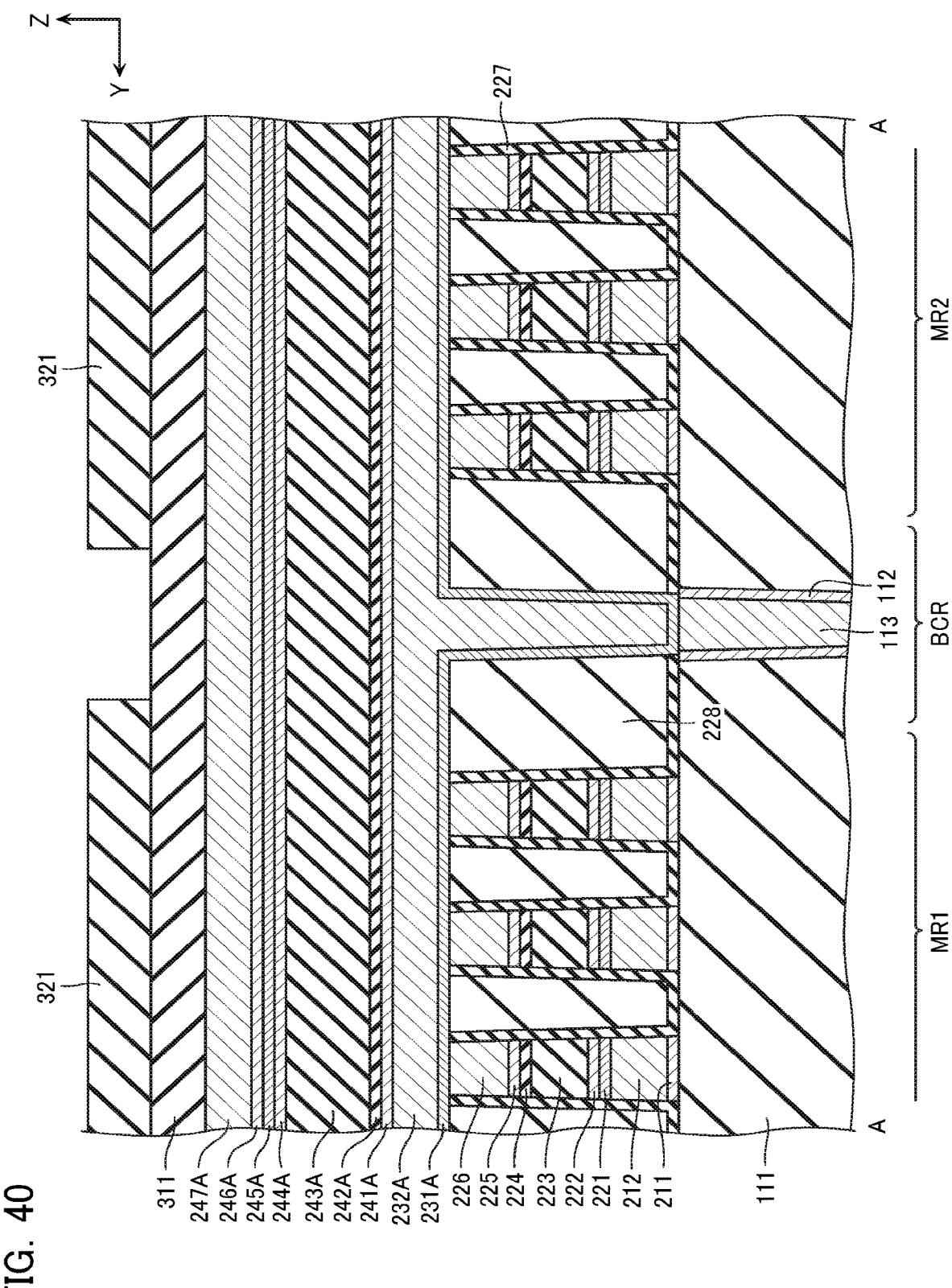
Figure 41:
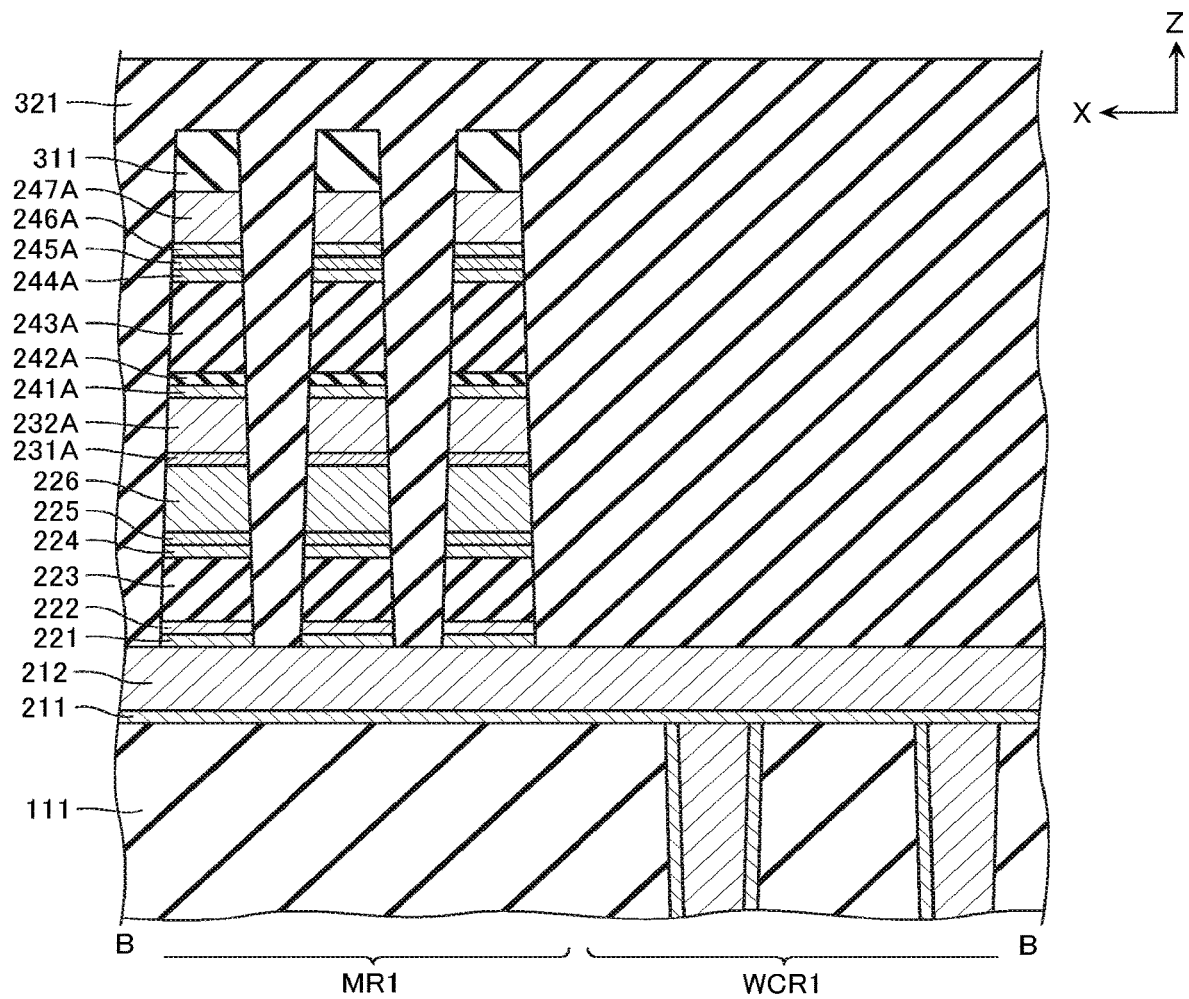
Figure 42:
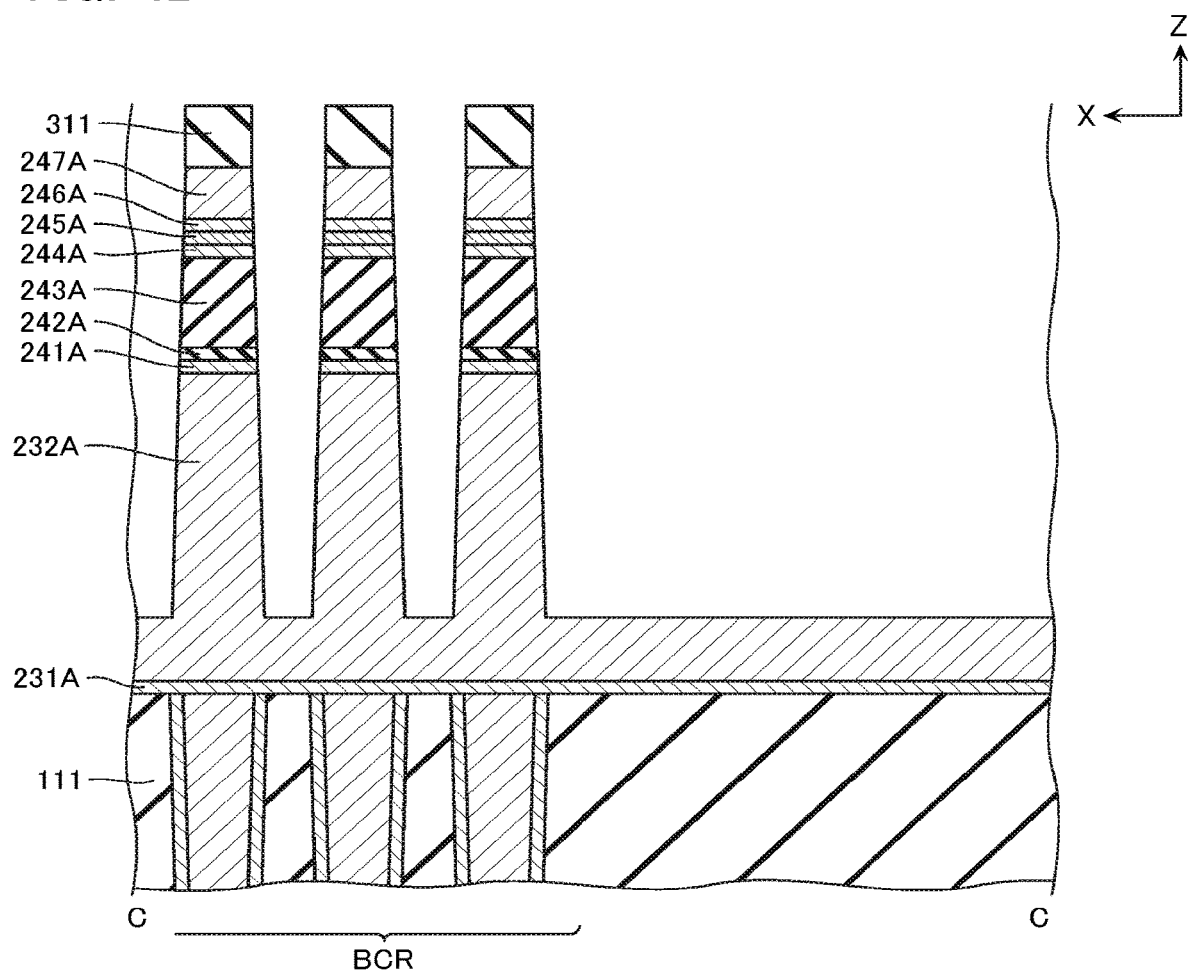
Figure 43:
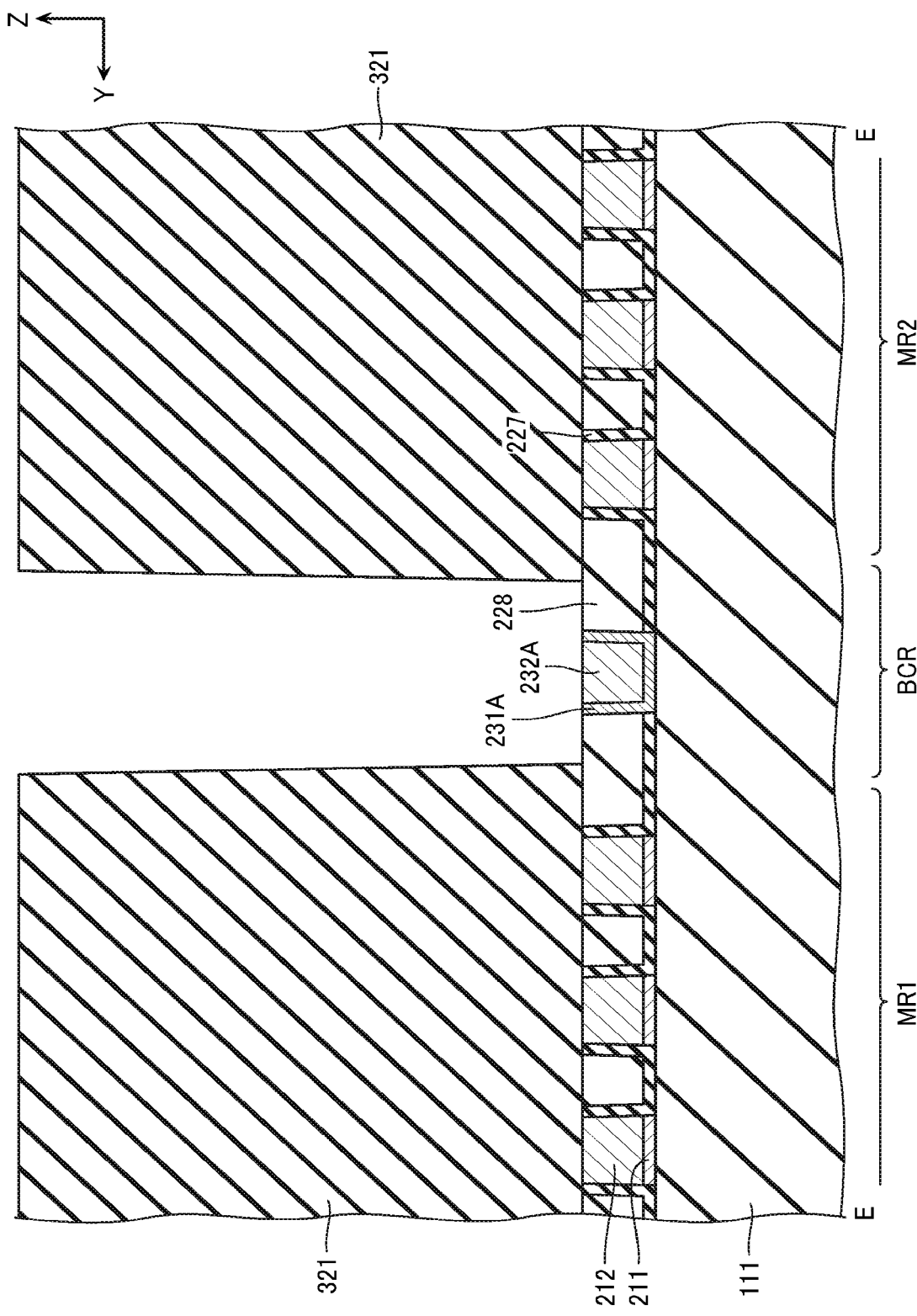

Note that as shown in FIGS. 36 to 38, this step is performed such that the word line WL1 (barrier metal layer 211 and conductive layer 212) is not divided in the X direction. Therefore, at this time point, each of the layers forming the bit line BL (barrier metal layer 231A and conductive layer 232A) are not completely divided, and are formed continuously in the bit line contact region BCR.

Next, as shown in FIGS. 39 to 43, a mask 321 covering the memory regions MR1 and MR2 is formed.

Figure 44:
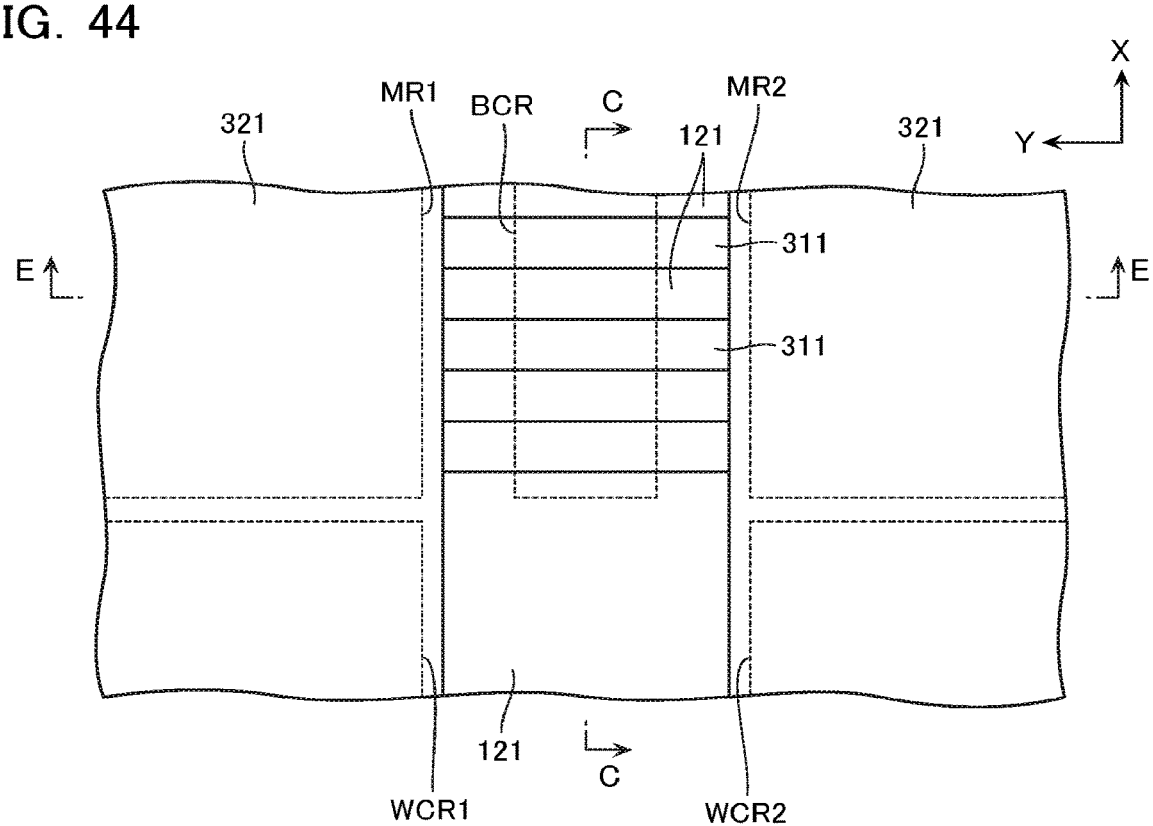
Figure 45:
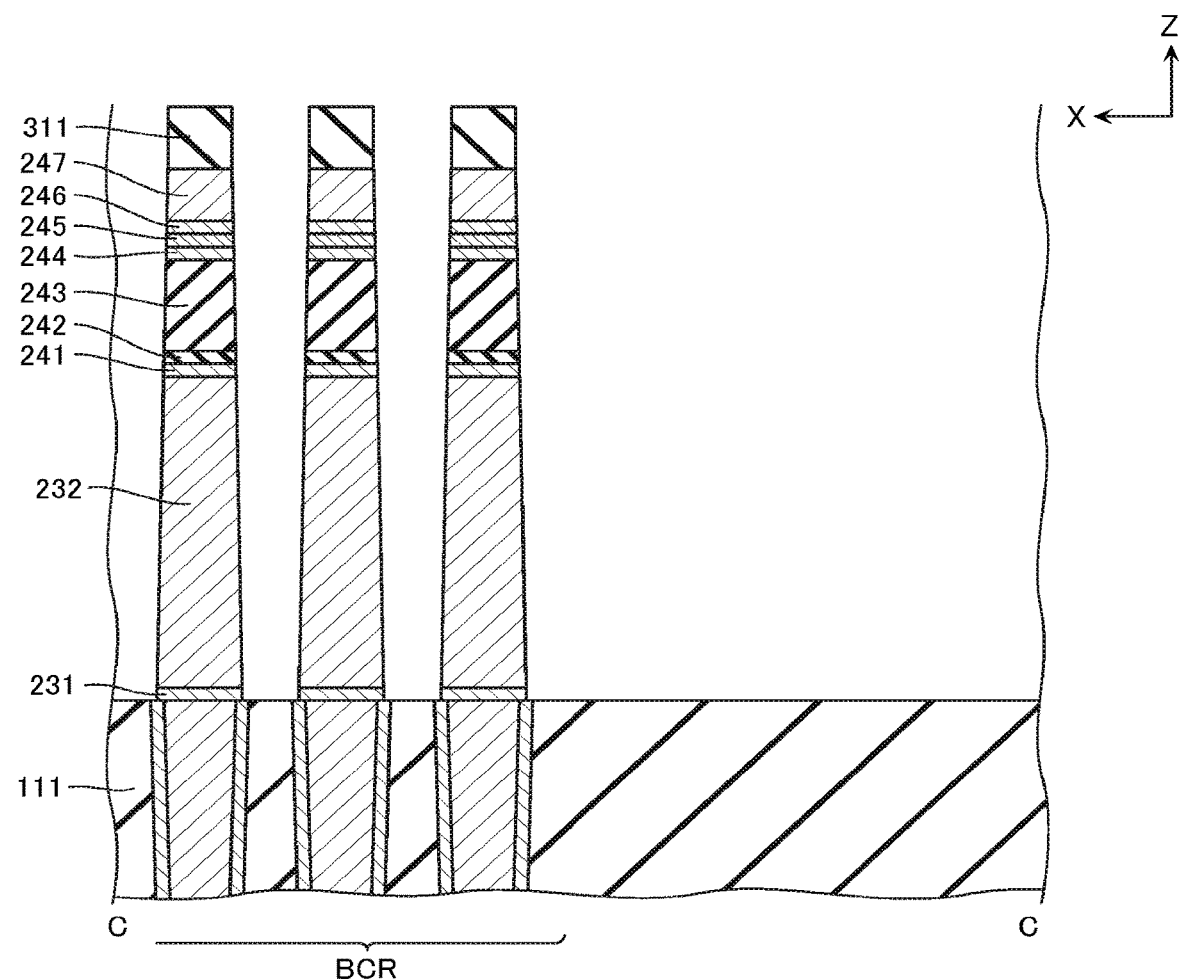
Figure 46:
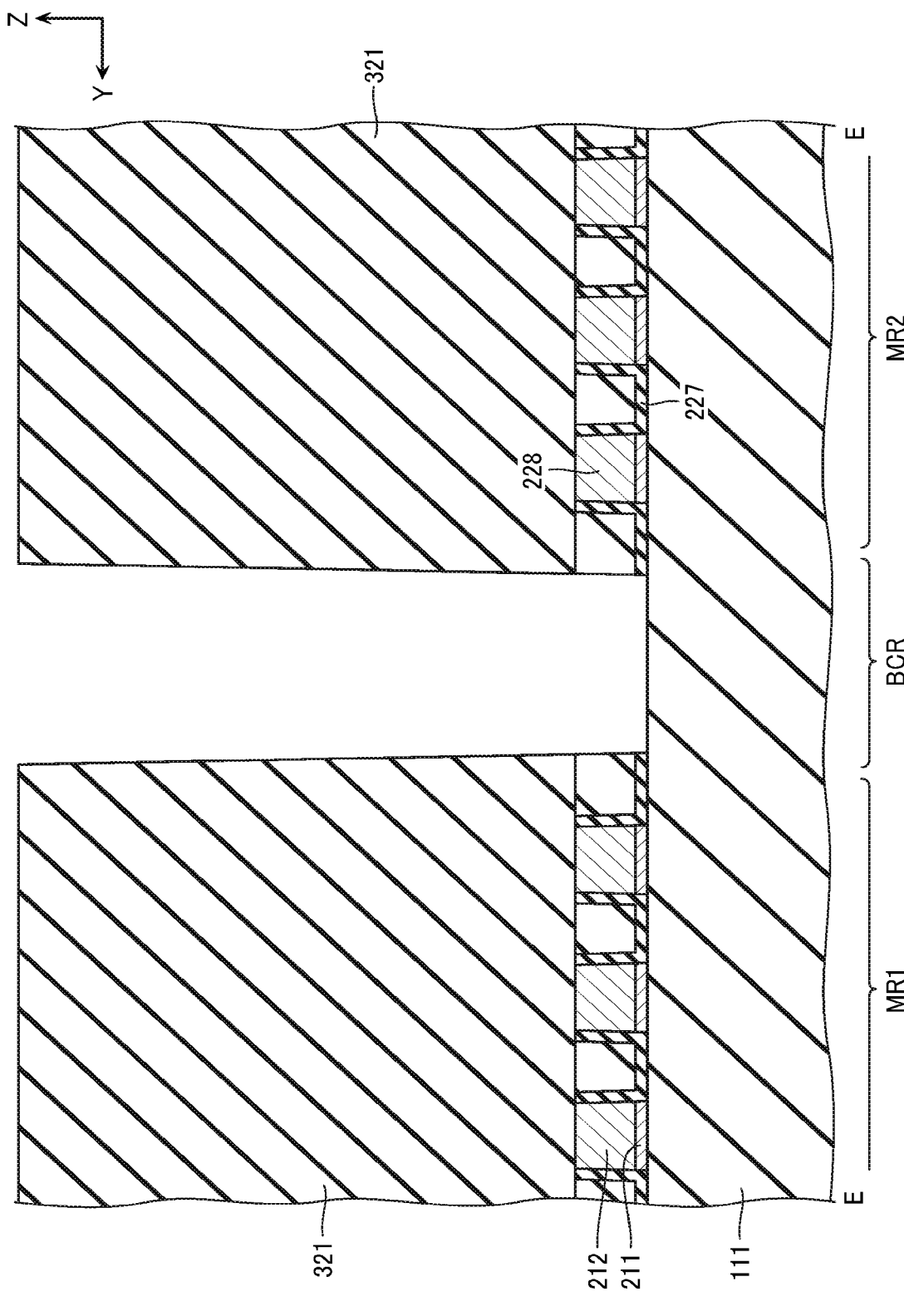

Next, as shown in FIGS. 44 to 46, this mask 321 and the mask 311 are utilized to divide each of the layers forming the bit line BL (barrier metal layer 231A and conductive layer 232A), in the X direction. As a result, each of the layers forming the bit line BL (barrier metal layer 231A and conductive layer 232A) are completely divided in the X direction, and the bit line contact CB (barrier metal layer 231 and conductive layer 232) is formed.

Figure 47:
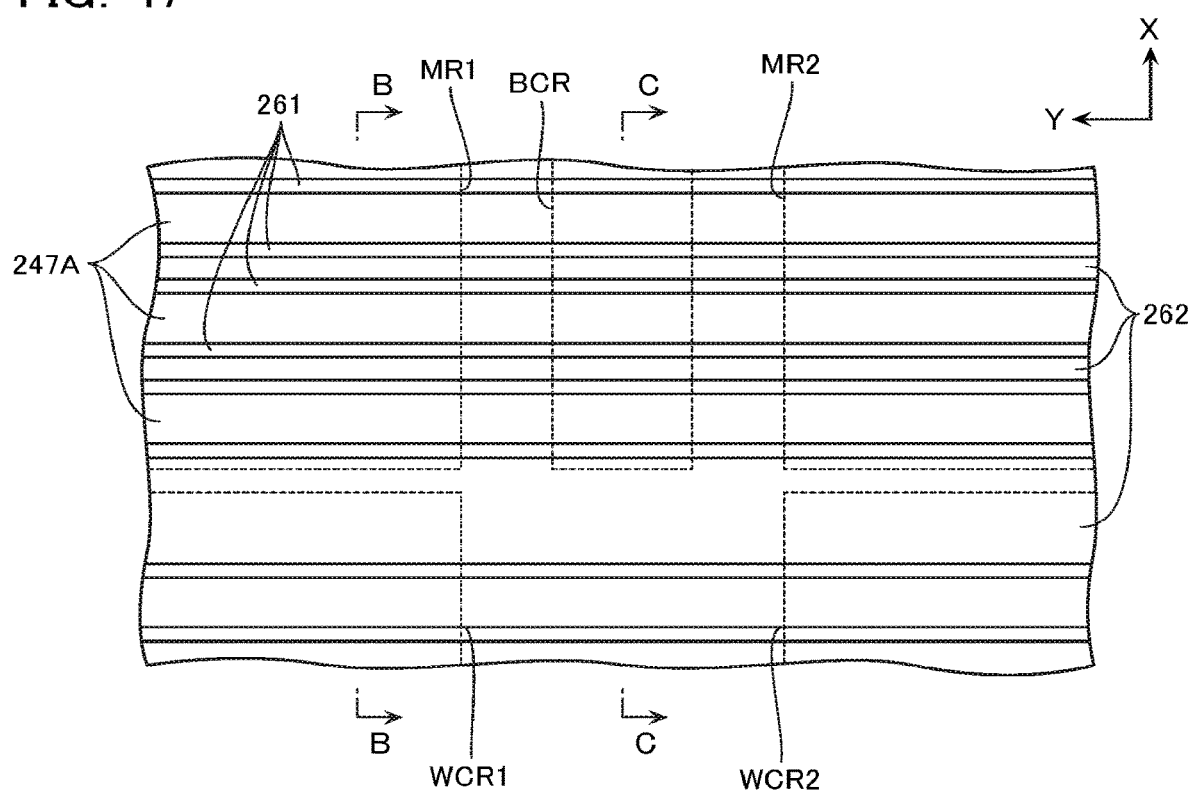
Figure 48:
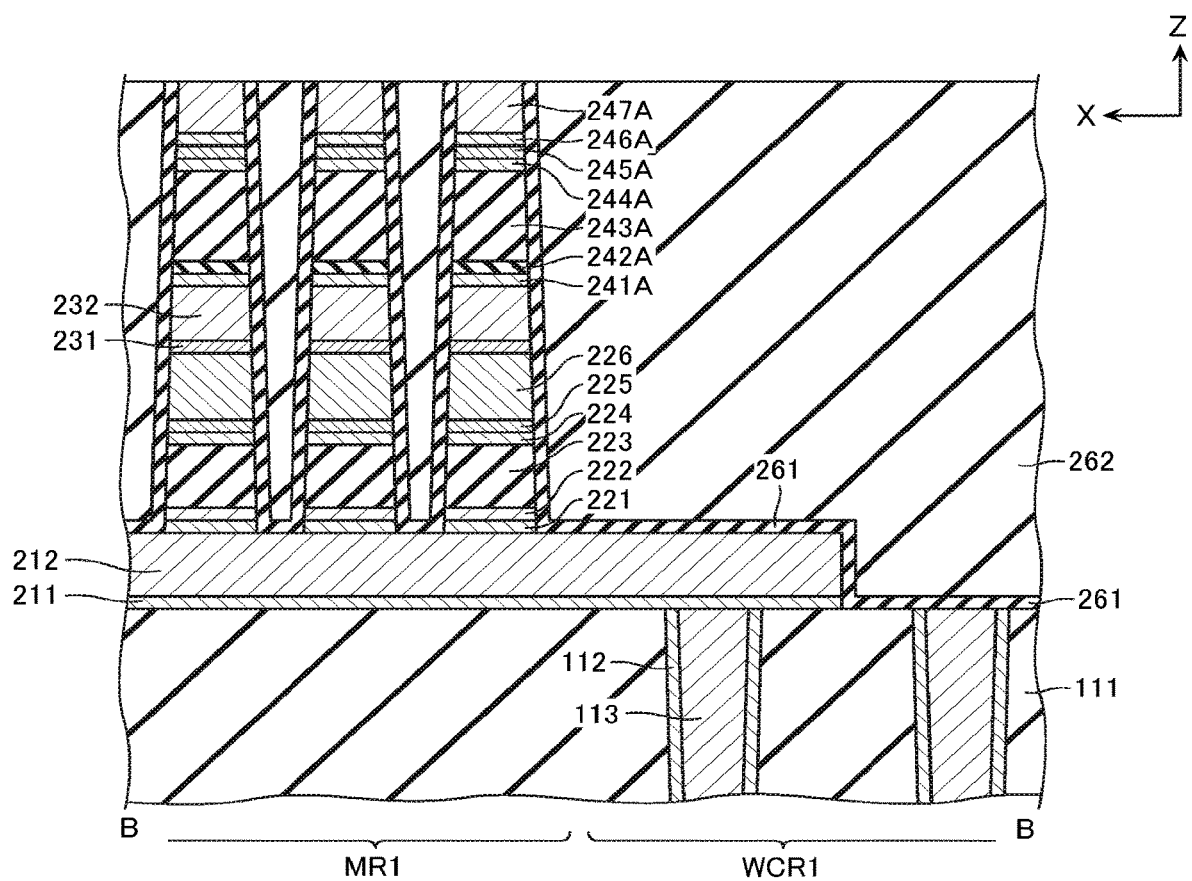
Figure 49:
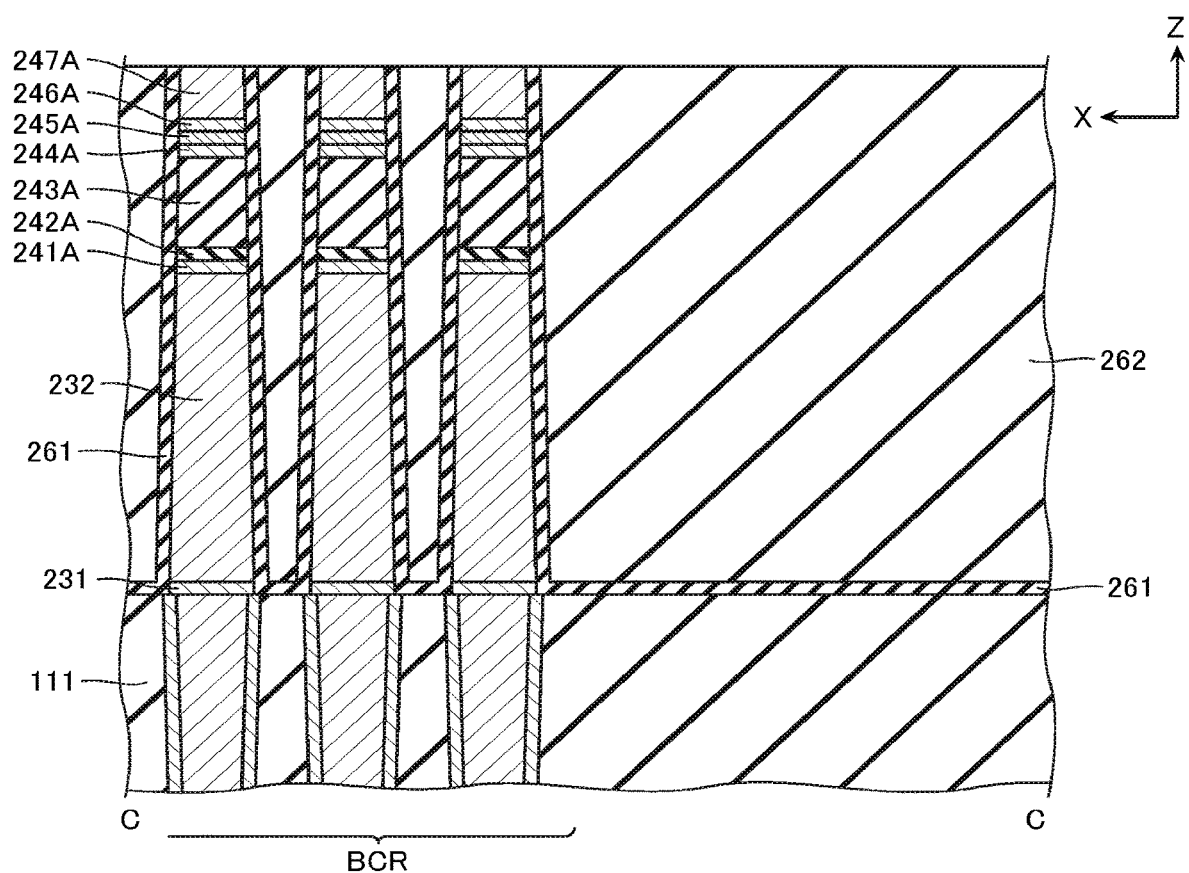

Next, step S108 will be described with reference to FIG. 13 and FIGS. 47 to 49. FIG. 47 is a plan view for explaining step S108. FIGS. 48 and 49 are cross-sectional views for explaining step S108, and respectively show cross-sections corresponding to B-B and C-C of FIG. 47.

As shown in FIG. 13 and FIGS. 47 to 49, in step S108, an inter-layer insulating layer 262 is formed. For example, the nitride layer 261 is deposited on sidewalls in the X direction of each of the layers forming the memory cells MC1 (barrier metal layer 221, metal layer 222, insulating layer 223, electrode layer 224, barrier metal layer 225, and conductive layer 226), the bit lines BL and bit line contacts CB (barrier metal layer 231 and conductive layer 232), and the memory cells MC2 (barrier metal layer 241A, electrode layer 242A, insulating layer 243A, barrier metal layer 244A, metal layer 245A, barrier metal layer 246A, and conductive layer 247A) adjacent in the X direction and on the upper surface of the inter-layer insulating layer 111. The nitride layer 261 is configured from silicon nitride (SiN), for example. Next, the inter-layer insulating layer 262 is implanted between the nitride layers 261. The inter-layer insulating layer 262 is configured from silicon oxide ($SiO_2$), for example.

Figure 50:
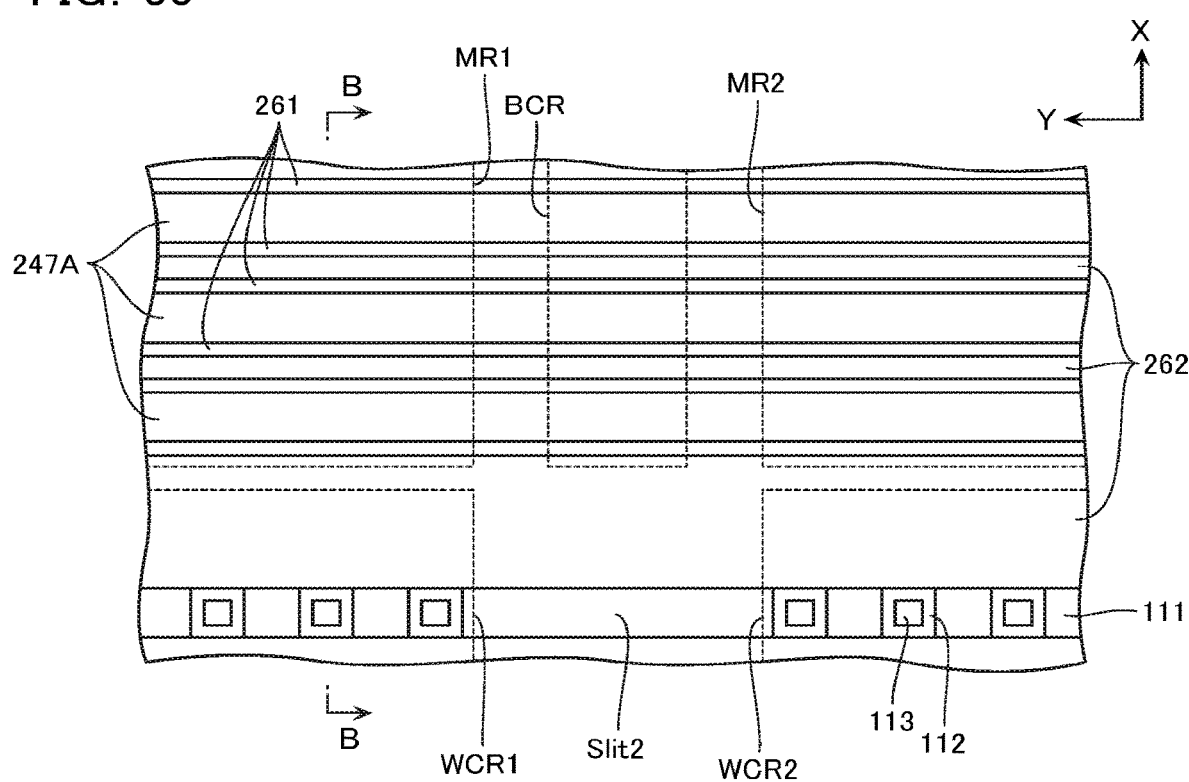
Figure 51:
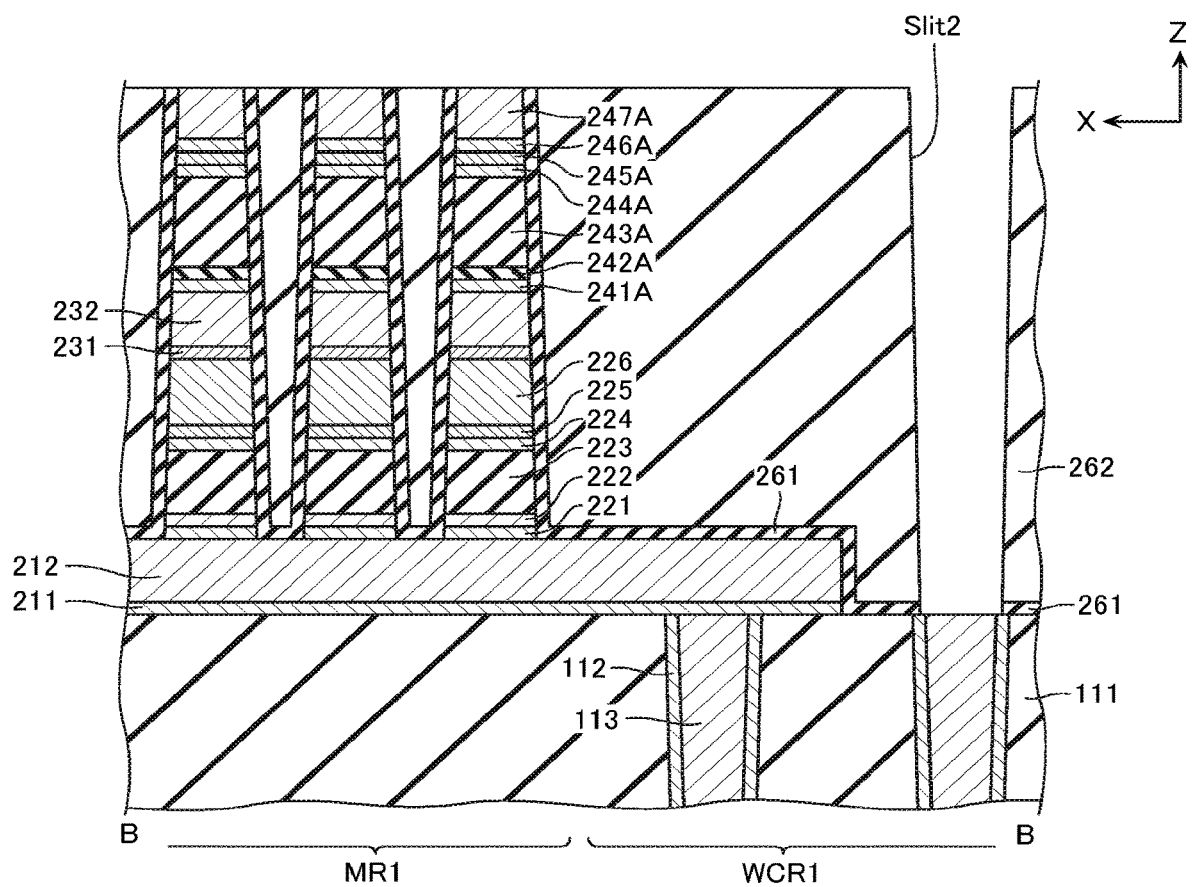

Next, step S109 will be described with reference to FIGS. 13, 50, and 51. FIG. 50 is a plan view for explaining step S109. FIG. 51 is a cross-sectional view for explaining step S109, and shows a cross-section corresponding to B-B of FIG. 50.

As shown in FIGS. 13, 50, and 51, in step S109, a trench Slit2 is formed in the inter-layer insulating layer 262. The trench Slit2 extends in the Y direction along the word line contact regions WCR1 and WCR2. Moreover, the inter-layer insulating layer 111, barrier metal layer 112, and conductive layer 113 of the lower wiring line layer 100 are exposed at a lower surface of the trench Slit2. Note that the trench Slit2 may be formed by a similar method to that for the trench Slit1.

Figure 52:
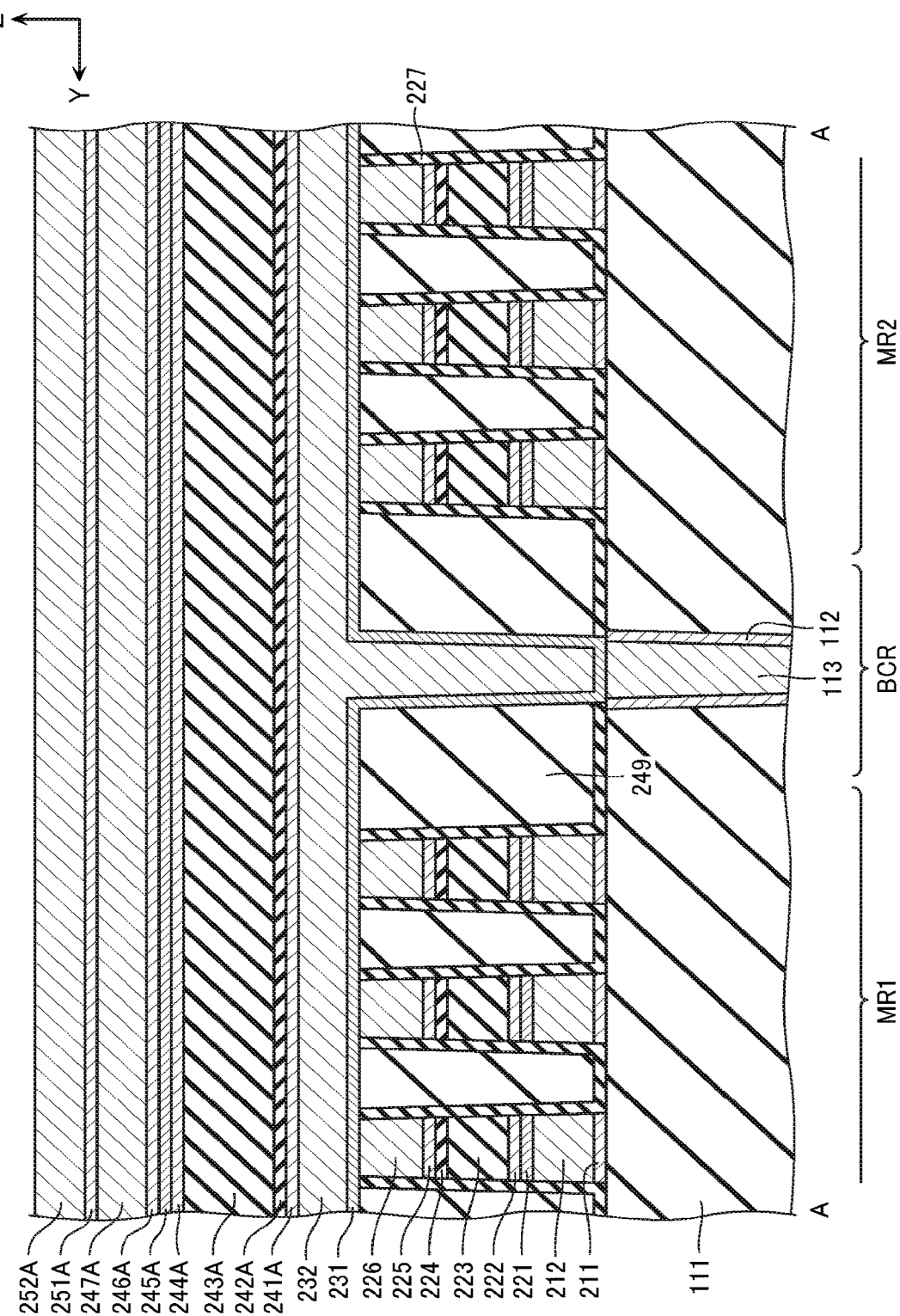

Next, step S110 will be described with reference to FIGS. 13, 52, and 53. FIG. 52 is a cross-sectional view for explaining step S110.

Figure 53:
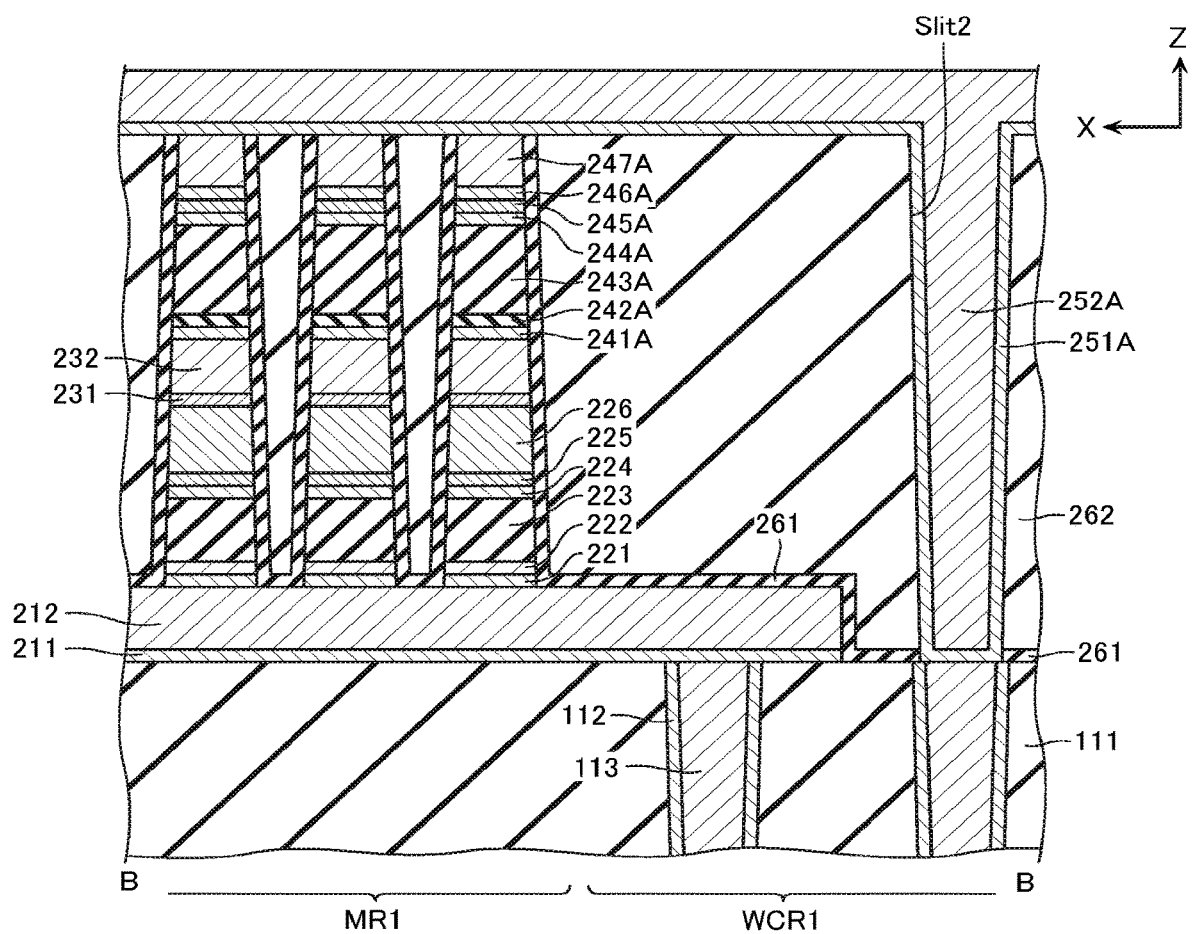

As shown in FIGS. 13, 52, and 53, in step S110, a layer forming the word line WL2 and word line contact CW is deposited. For example, first, a barrier metal layer 251A and a conductive layer 252A that form the word line WL2 and word line contact CW, are sequentially deposited. The barrier metal layer 251A is configured from a conductive layer of the likes of titanium (Ti), for example. The conductive layer 252A is configured from a conductive layer of the likes of tungsten (W), for example.

Now, as shown in FIGS. 52 and 53, the barrier metal layer 251A and conductive layer 252A cover upper surfaces of the conductive layer 247A and the inter-layer insulating layer 262. Moreover, the barrier metal layer 251A and conductive layer 252A are implanted also on the inside of the trench Slit2, and contact the inter-layer insulating layer ill, barrier metal layer 112, and conductive layer 113 of the lower wiring line layer 100 at the lower surface of the trench Slit2.

Figure 57:
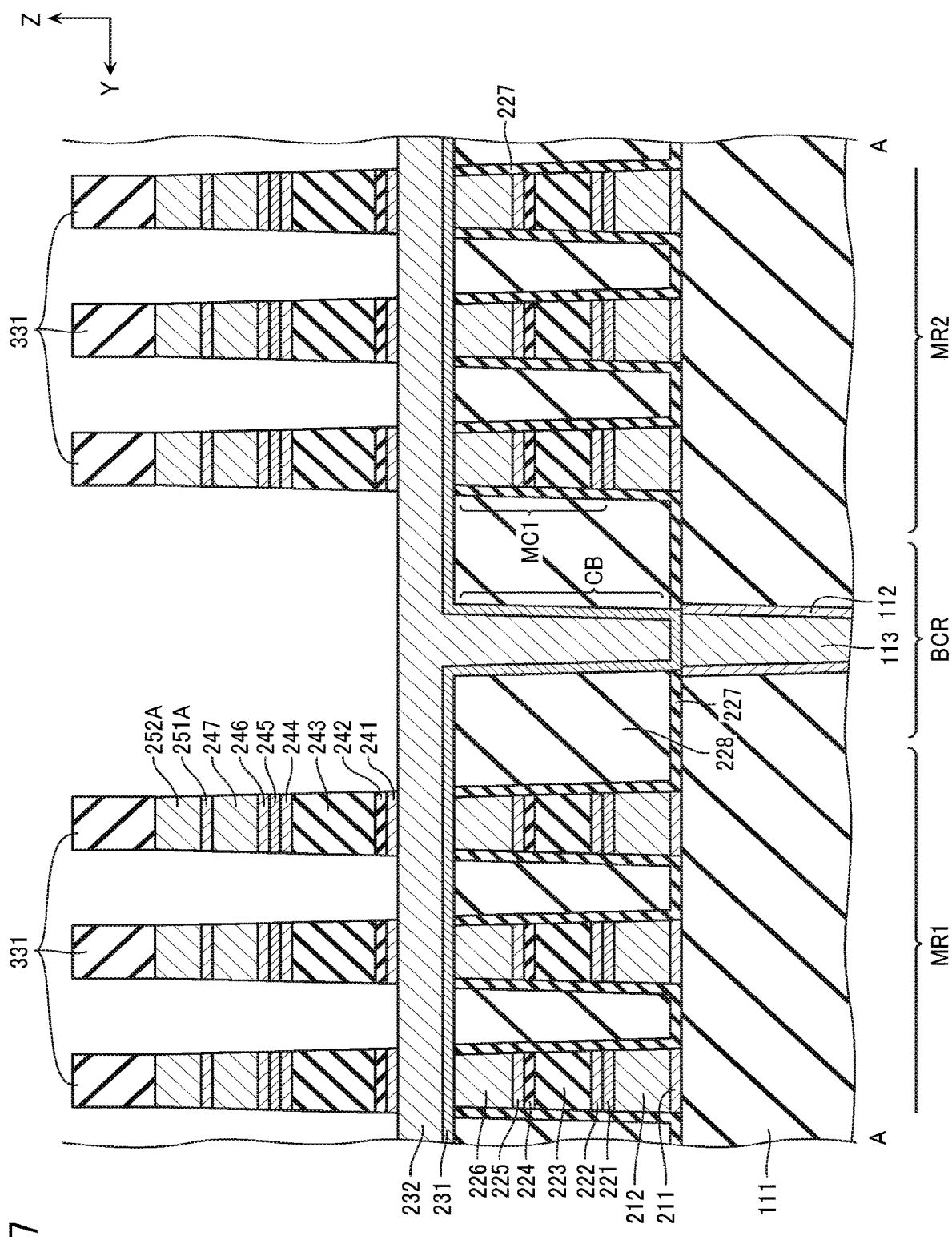
Figure 58:
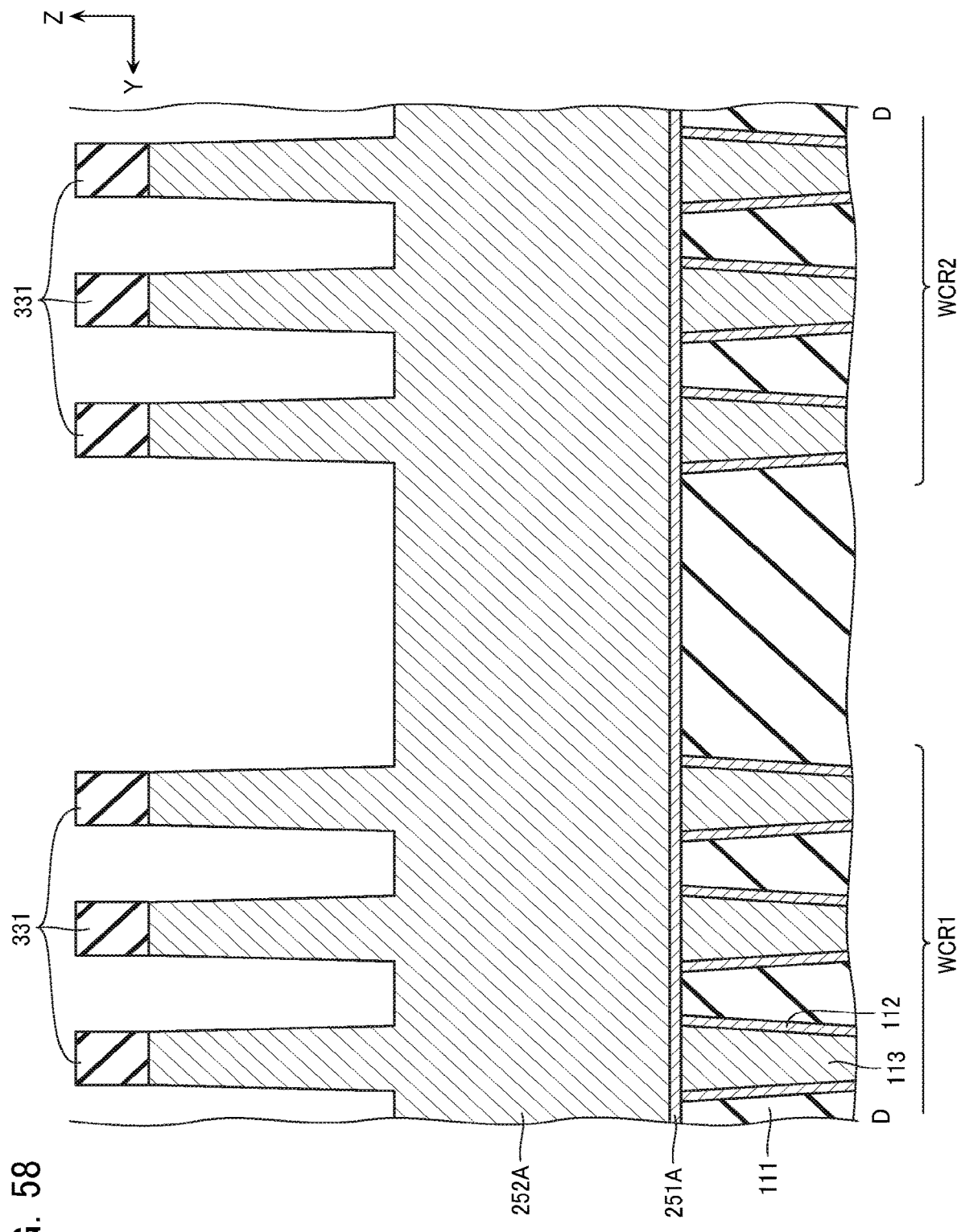
Figure 59:
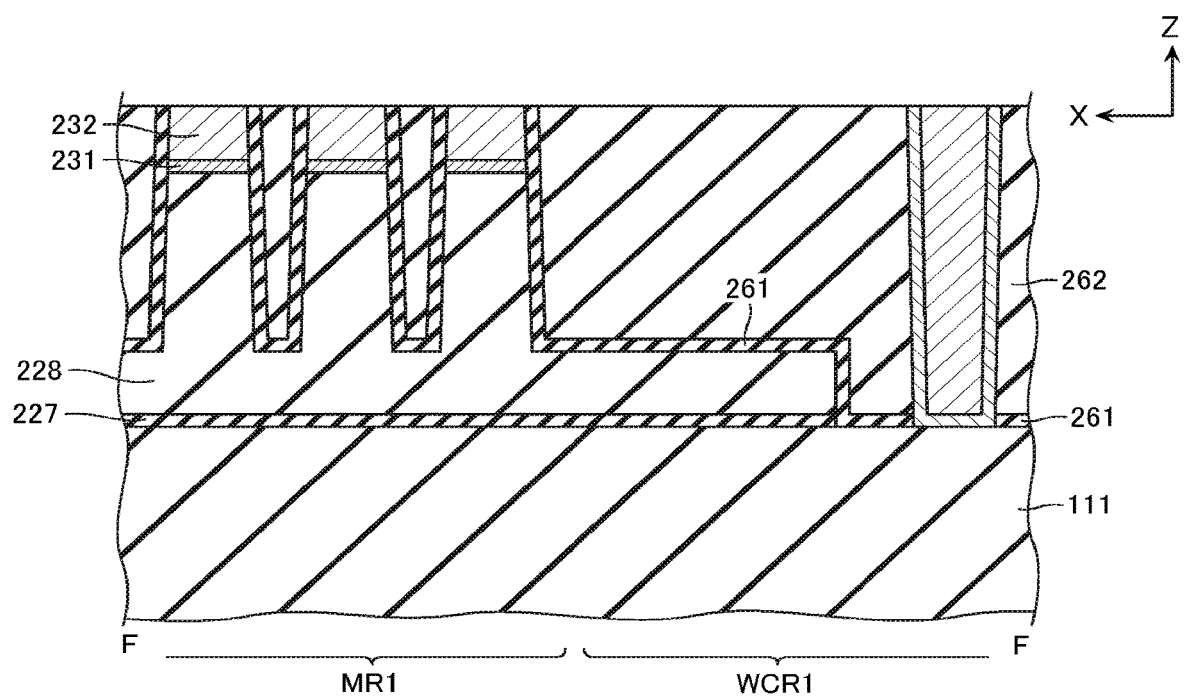

Next, step S111 will be described with reference to FIG. 13 and FIGS. 54 to 64. FIGS. 54, 56, 60, and 62 are plan views for explaining step S111. FIG. 55 is a cross-sectional view for explaining step S111, and shows a cross-section corresponding to A-A of FIG. 54. FIGS. 57 to 59 are cross-sectional views for explaining step S111, and respectively show cross-sections corresponding to A-A, D-D, and F-F of FIG. 56. FIG. 61 is a cross-sectional view for explaining step S111, and shows a cross-section corresponding to F-F of FIG. 60. FIGS. 63 and 64 are cross-sectional views for explaining step S111, and respectively show cross-sections corresponding to D-D and F-F of FIG. 62.

As shown in FIG. 13 and FIGS. 54 to 64, in step S111, formation of the memory cell MC2, the word line WL2, and the word line contact CW, are performed.

Figure 54:
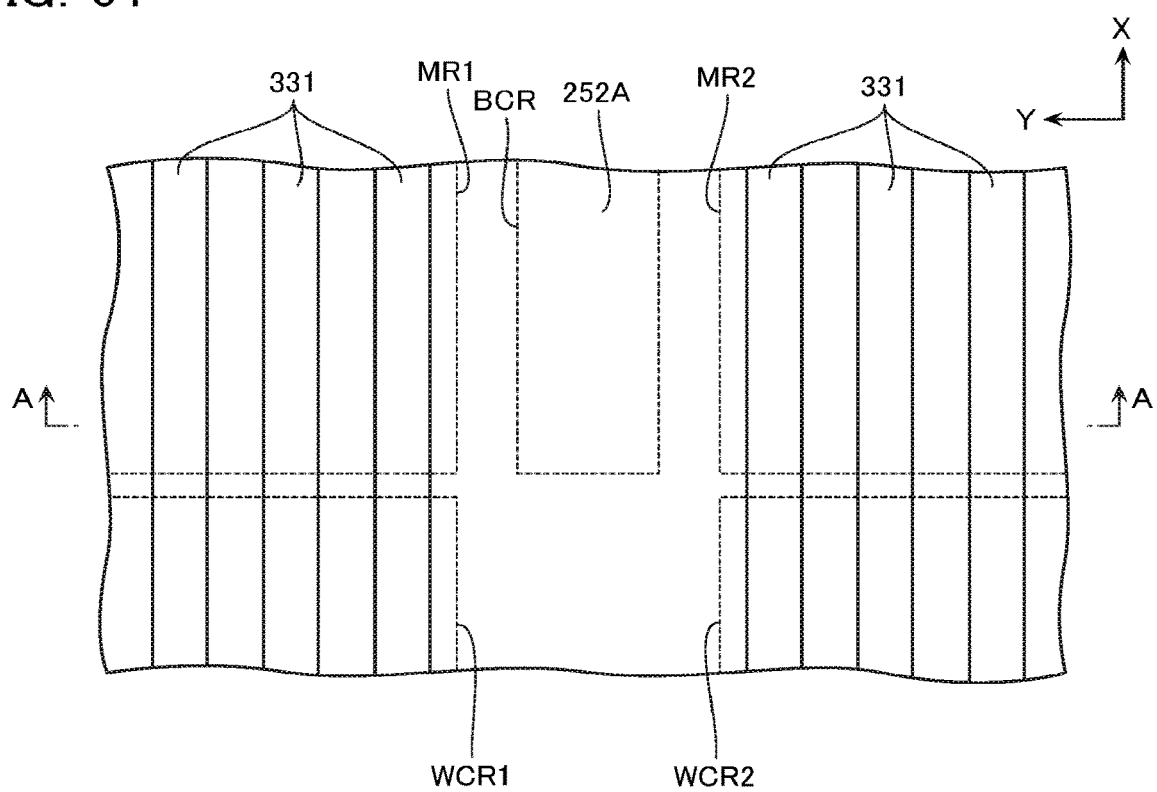
Figure 55:
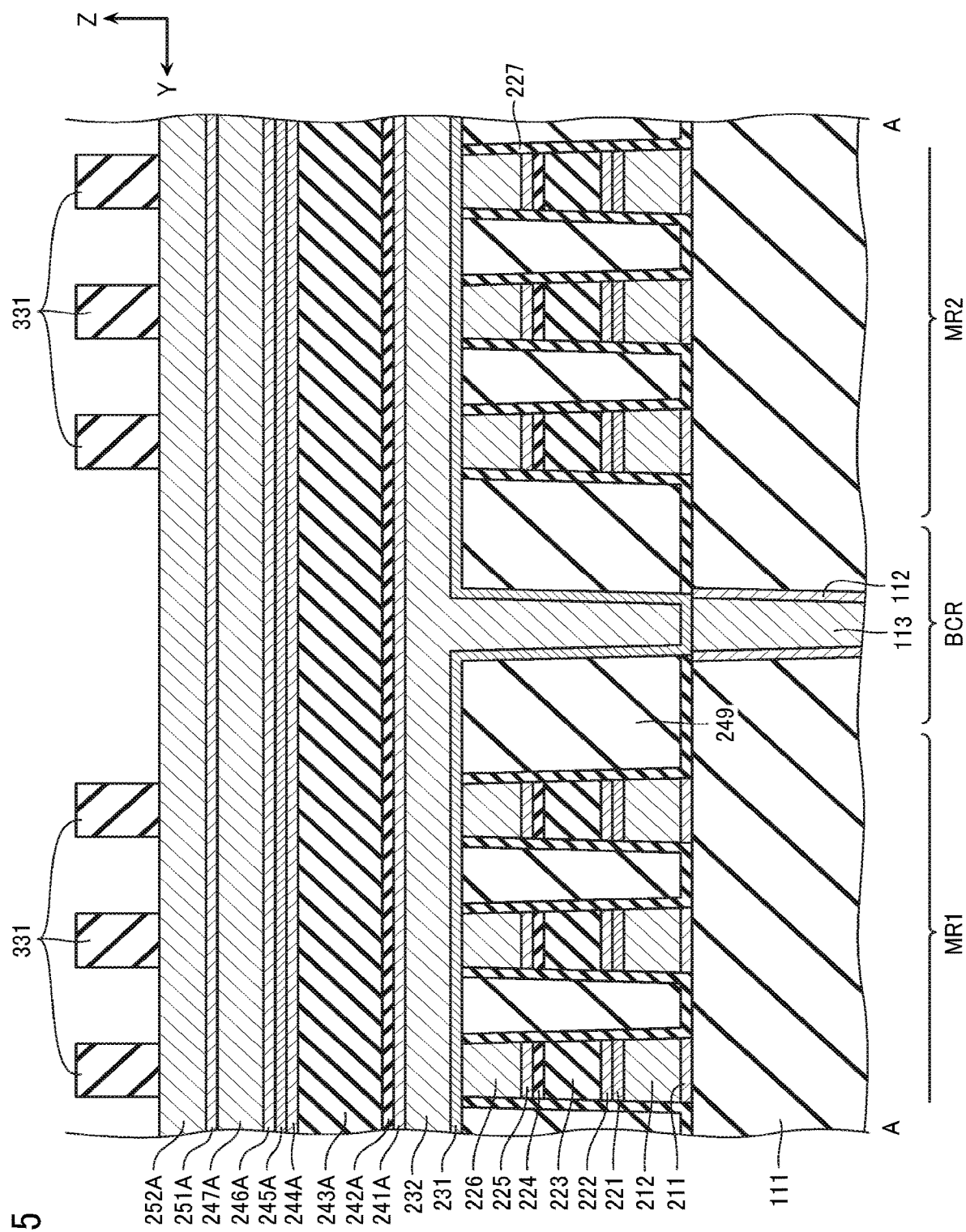
Figure 56:
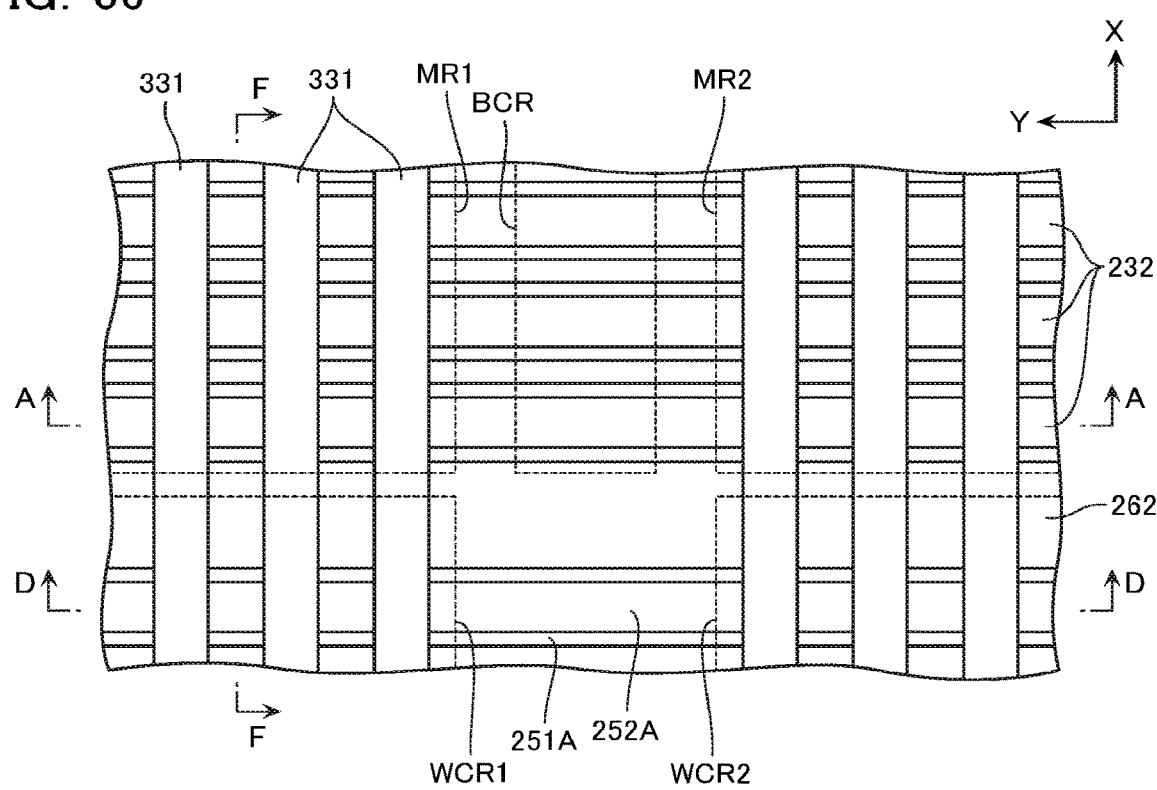

For example, as shown in FIGS. 54 and 55, first, a mask 331 is formed. The mask 331 is formed in a line-and-space pattern along a pattern of the word line WL2. Moreover, the mask 331 is formed straddling the memory regions MR1 and MR2 and the word line contact regions WCR1 and WCR2.

Next, as shown in FIGS. 56 to 59, the mask 331 is utilized, and each of layers forming the memory cell MC2 (barrier metal layer 241A, electrode layer 242A, insulating layer 243A, barrier metal layer 244A, metal layer 245A, barrier metal layer 246A, and conductive layer 247A) and each of layers forming the word line WL2 (barrier metal layer 251A and conductive layer 252A) are divided in the Y direction along the pattern of the word line WL2. As a result, the memory cell MC2 (barrier metal layer 241, electrode layer 242, insulating layer 243, barrier metal layer 244, metal layer 245, barrier metal layer 246, and conductive layer 247) and the word line WL2 are formed.

Note that as shown in FIGS. 58 and 59, this step is performed such that the bit line BL (barrier metal layer 231 and conductive layer 232) is not divided in the Y direction.

Therefore, at this time point, each of the layers forming the word line WL2 (barrier metal layer 251A and conductive layer 252A) are not completely divided, and are formed continuously in the word line contact regions WCR1 and WCR2.

Figure 60:
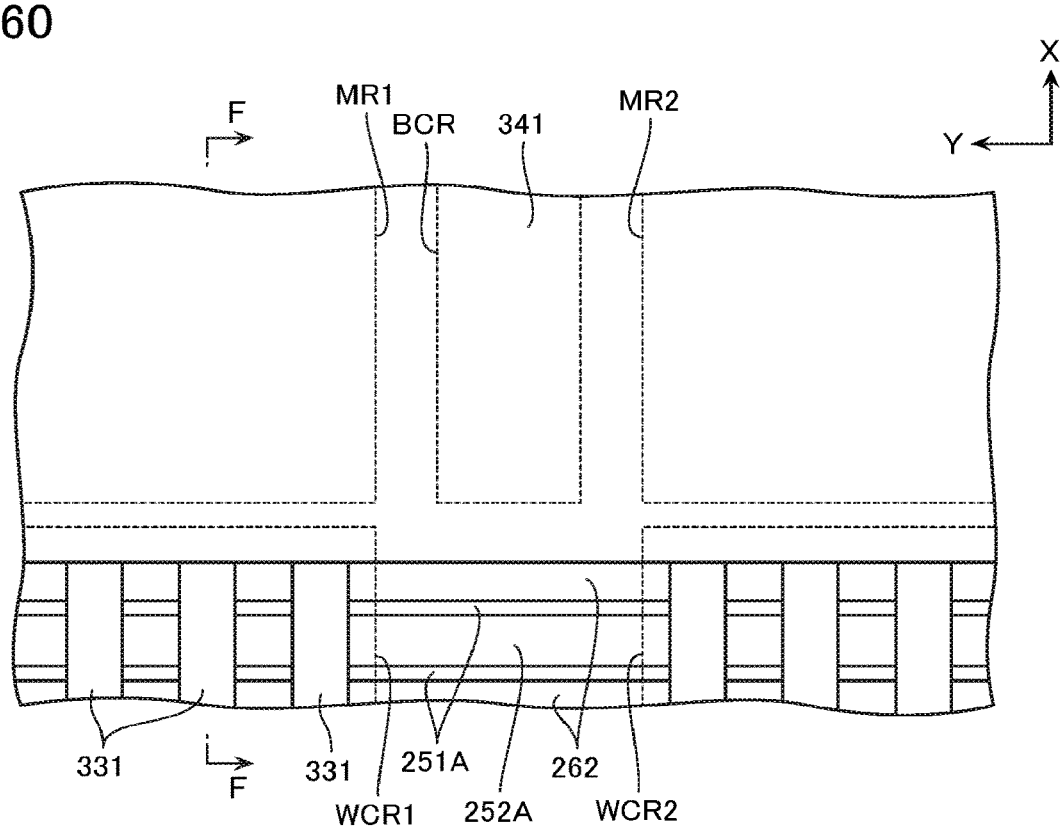
Figure 61:
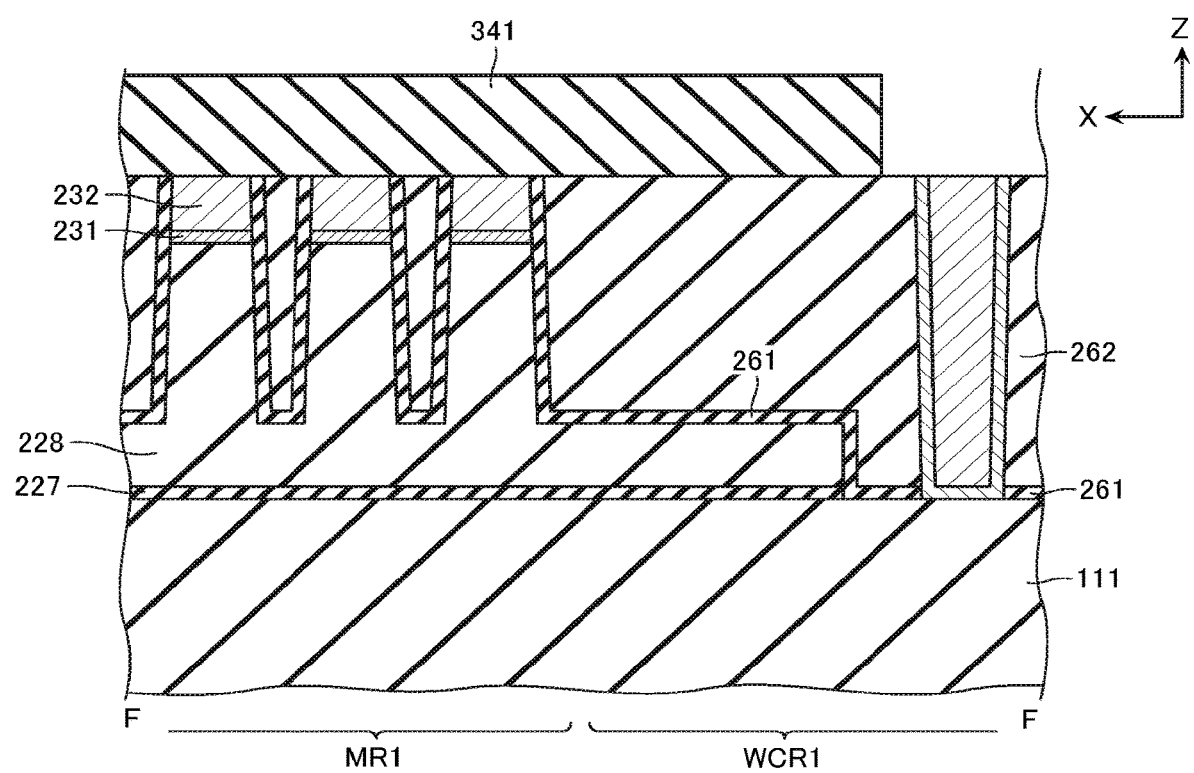

Next, as shown in FIGS. 60 and 61, a mask 341 covering the memory regions MR1 and MR2 and bit line contact region BCR, is formed.

Figure 62:
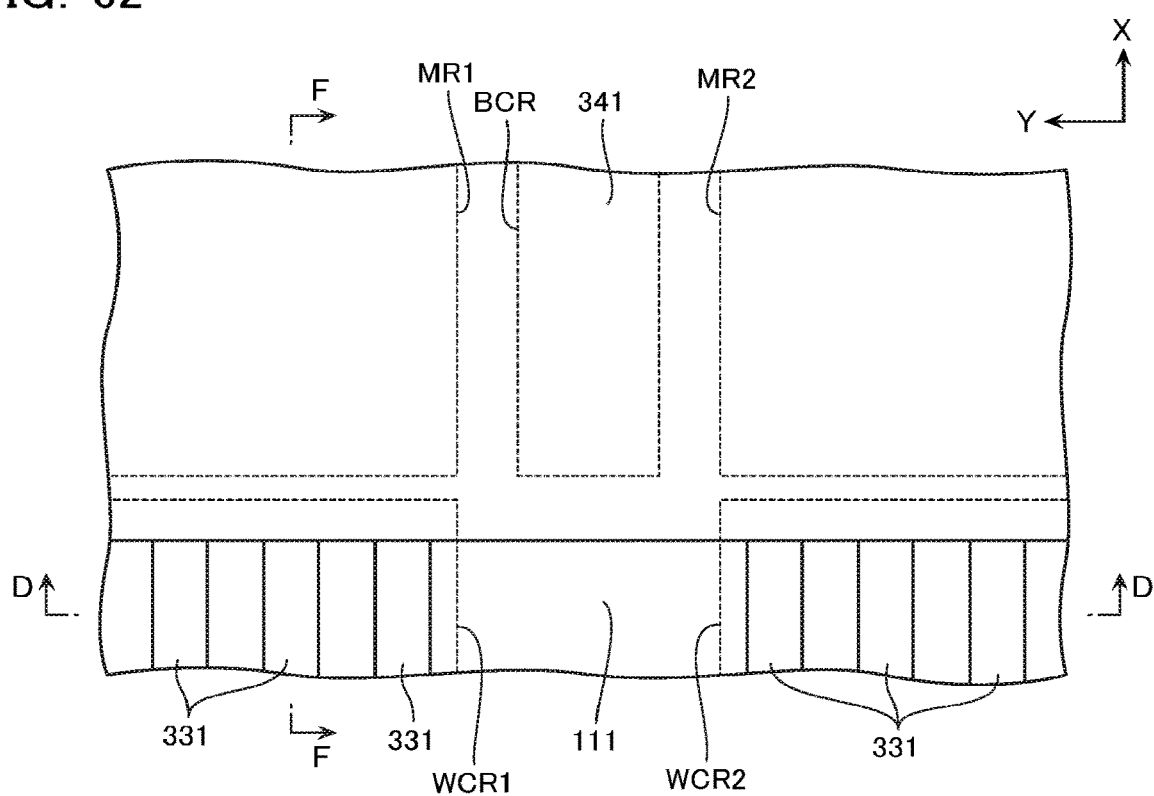
Figure 63:
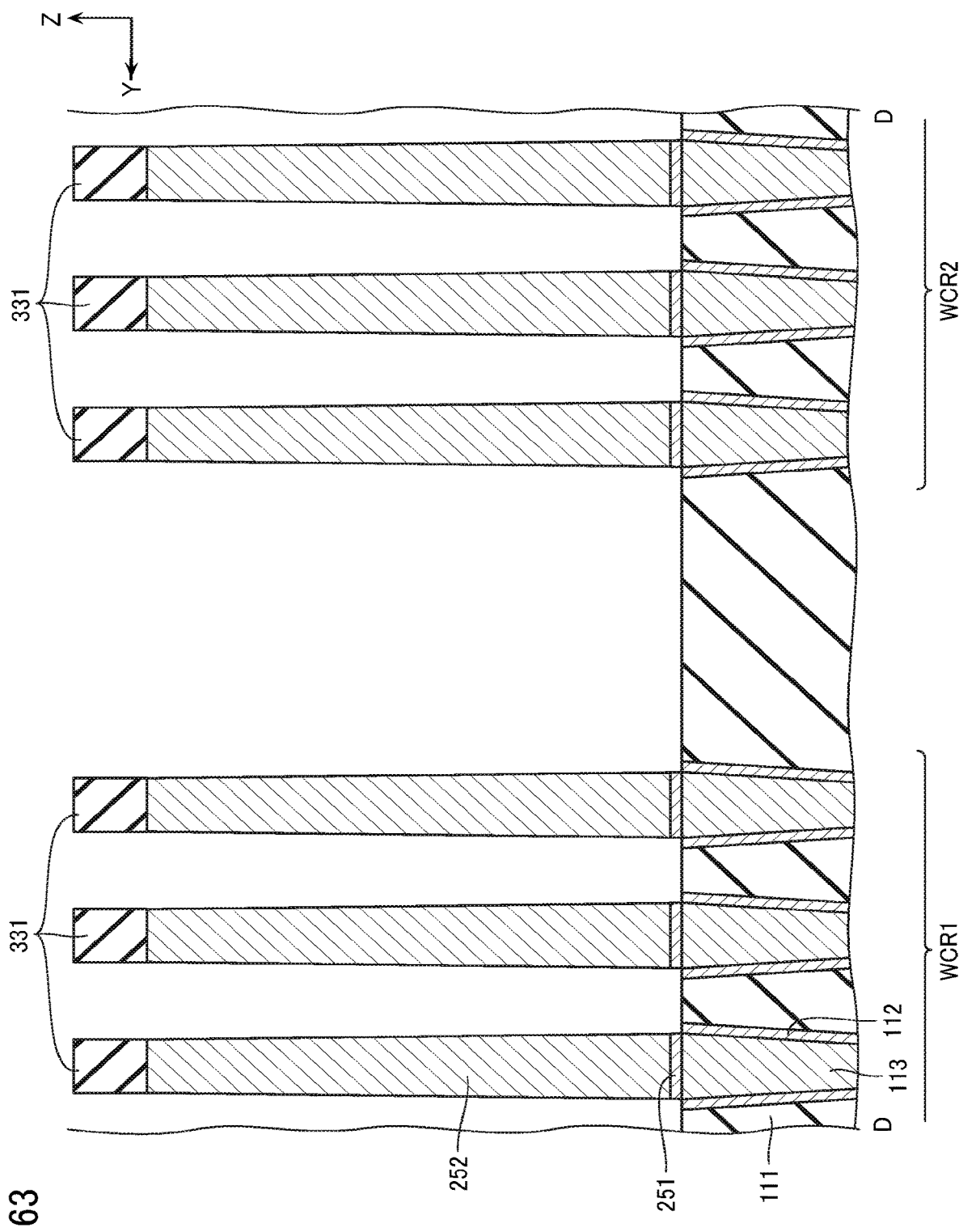
Figure 64:
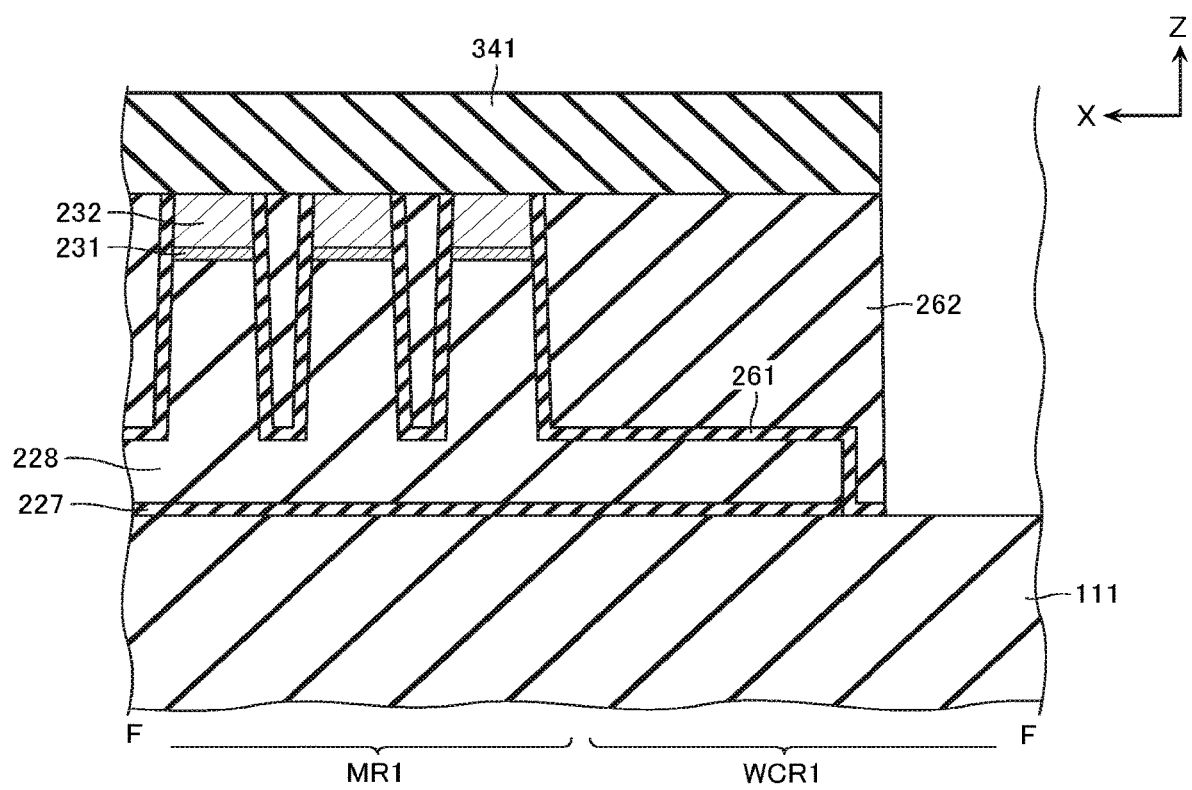

Next, as shown in FIGS. 62 to 64, this mask 341 and the mask 331 are utilized to divide each of the layers forming the word line WL2 (barrier metal layer 251A and conductive layer 252A), in the Y direction. As a result, each of the layers forming the word line WL2 (barrier metal layer 251A and conductive layer 252A) are completely divided in the Y direction, and the word line contact CW (barrier metal layer 251 and conductive layer 252) is formed.

Subsequently, as shown in FIG. 13 and FIGS. 6 to 12, in step S112, an inter-layer insulating layer 249 is formed. For example, a nitride layer 248 is deposited on sidewalls in the Y direction of the memory cells MC2 (barrier metal layer 241, electrode layer 242, insulating layer 243, barrier metal layer 244, metal layer 245, barrier metal layer 246, and conductive layer 247) and the word lines WL2 (barrier metal layer 251 and conductive layer 252) adjacent in the Y direction and on the upper surface of the inter-layer insulating layer 111. The nitride layer 248 is configured from silicon nitride (SiN), for example. Next, the inter-layer insulating layer 249 is implanted between the nitride layers 248. The inter-layer insulating layer 249 is configured from silicon oxide ($SiO_2$), for example.

The above steps make it possible to manufacture the nonvolatile semiconductor memory device described with reference to FIGS. 6 to 12.

As a result of the method of manufacturing according to the present embodiment, as described with reference to FIGS. 27 and 28, the conductive layer 232A is deposited inside the trench Slit1 extending in the X direction and this is utilized to form the bit line contact CB, hence positions in the Y direction of the bit line contacts CB can be substantially matched. In addition, as a result of such a method, as described with reference to FIGS. 30 to 33, the masks 311 to 314 of the pattern corresponding to the bit line BL is formed and this is utilized to form the bit line BL and the bit line contact CB, hence a position in the X direction of the bit line BL and a position in the X direction of the bit line contact CB can be substantially matched.

Similarly, as a result of the method of manufacturing according to the present embodiment, as described with reference to FIG. 53, the conductive layer 252A is deposited inside the trench Slit2 extending in the Y direction and this is utilized to form the word line contact CW, hence positions in the X direction of the word line contacts CW can be substantially matched. In addition, as a result of such a method, as reference to FIGS. 54 and 55, the mask 331 of the pattern corresponding to the word line WL is formed and this is utilized to form the word line WL and the word line contact CW, hence a position in the Y direction of the word line WL and a position in the Y direction of the word line contact CW can be substantially matched.

Moreover, in the method of manufacturing according to the present embodiment, as described with reference to FIG. 25, for example, the trench Slit1 is formed such that the inter-layer insulating layer 111, barrier wiring line layer 112, and conductive layer 113 of the lower wiring line layer 100 are exposed at the lower surface of the trench Slit1. Such a mode makes it possible for positions of the bit line contacts CB and each of configurations of the lower wiring line layer 100 to be aligned by adjusting a position in the Y direction of the trench Slit1. Therefore, manufacturing can be performed more easily compared to when, for example, positions in the X direction and the Y direction must be aligned.

Note that when the nonvolatile semiconductor memory device is manufactured by the method of manufacturing according to the present embodiment, as shown in FIG. 7, the lower surface of the bit line BL and the side surface in the Y direction and lower surface of the bit line contact CB are sometimes covered by the barrier metal layer 231. In contrast, as shown in FIG. 9, the side surfaces in the X direction of the bit line BL and bit line contact CB are sometimes covered by the nitride layer 261.

Moreover, when the nonvolatile semiconductor memory device is manufactured by the method of manufacturing according to the present embodiment, as shown in FIG. 9, the side surface in the Y direction of the bit line BL and the side surface in the Y direction of the bit line contact CB are sometimes formed continuously.

Figure 11:
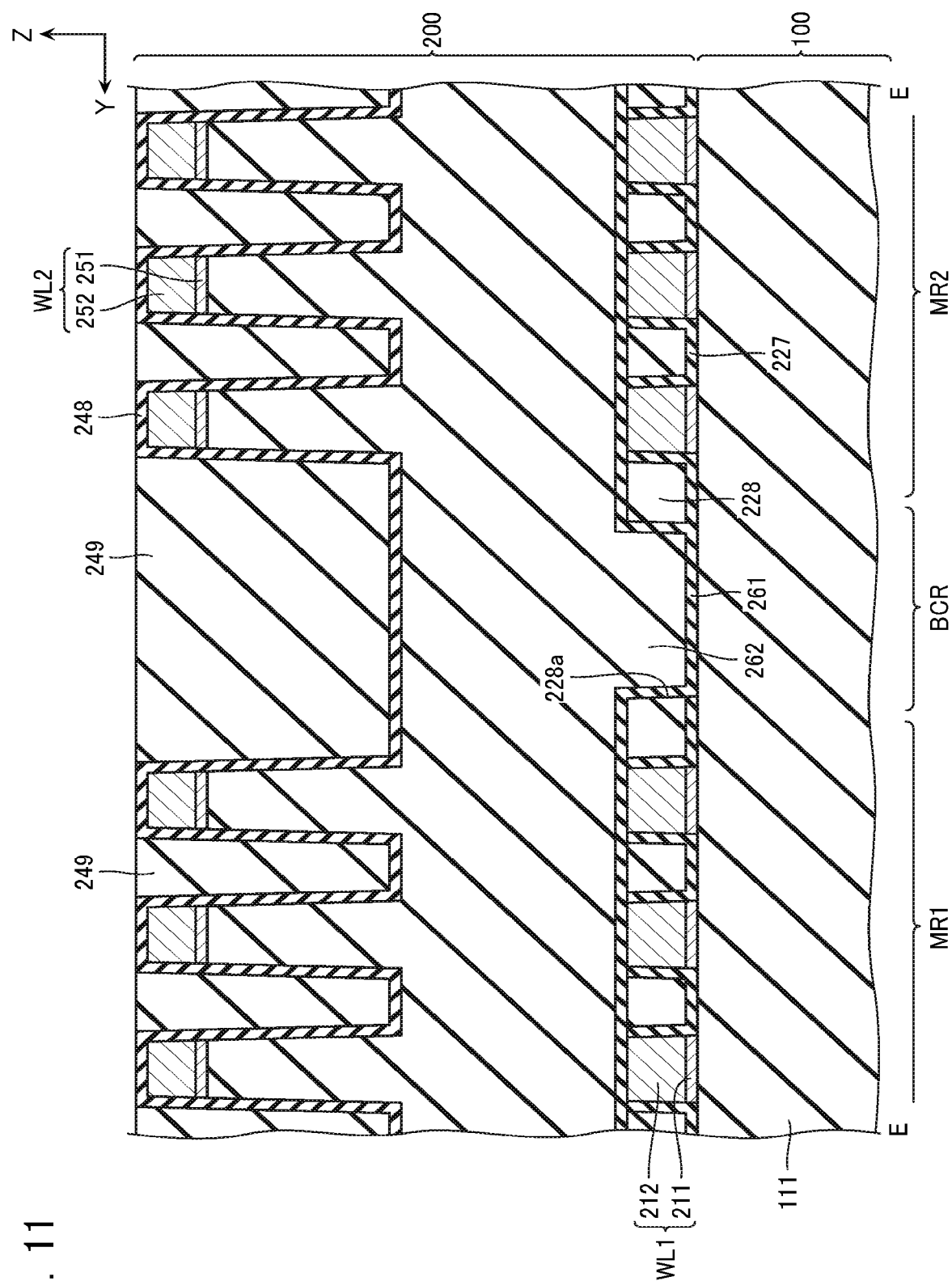
Figure 12:
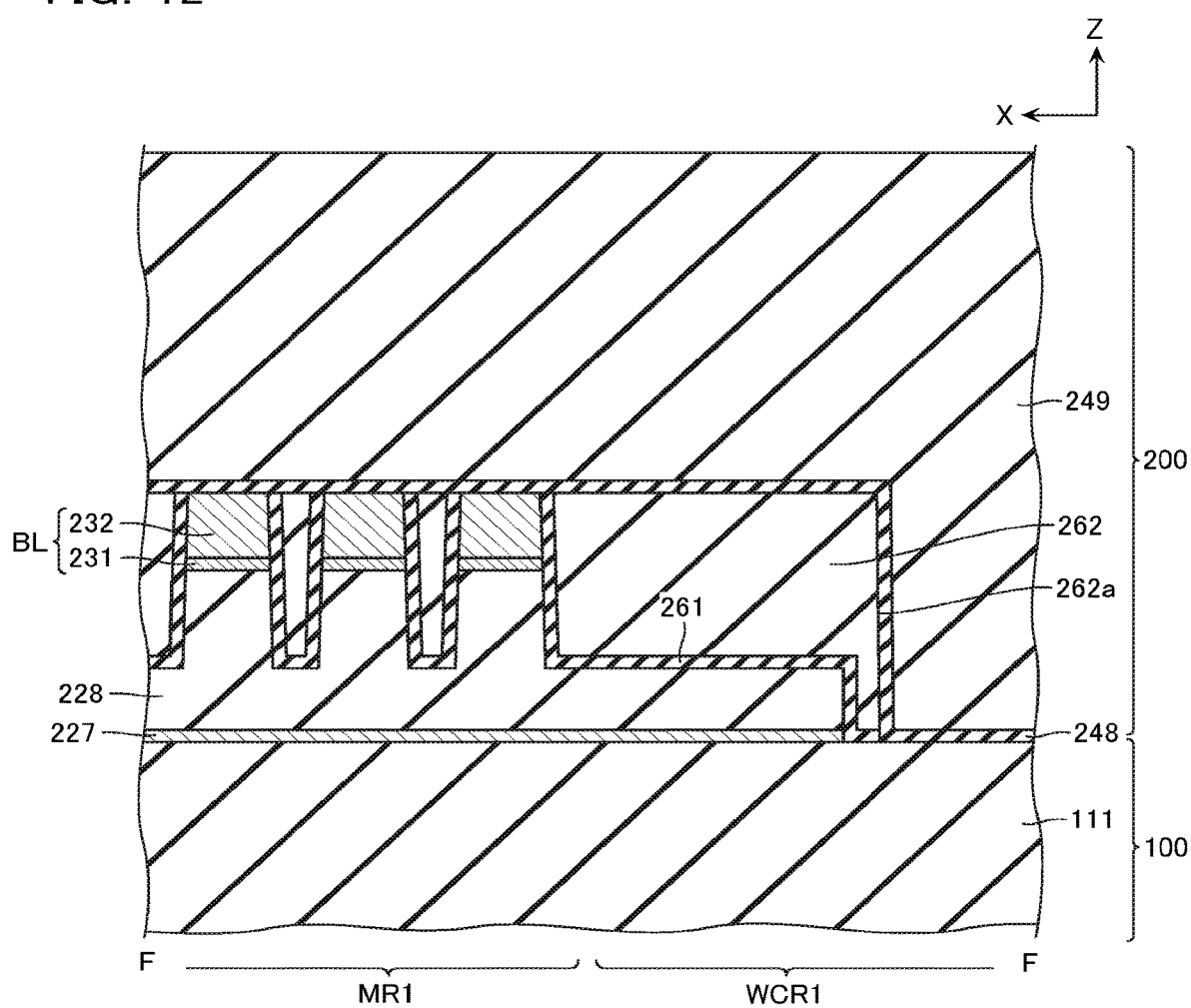

Moreover, in the method of manufacturing according to the present embodiment, in step S107, as described with reference to FIGS. 39 to 43, the mask 321 covering the memory regions MR1 and MR2 is formed, and as described with reference to FIGS. 44 to 46, this mask 321 and the mask 311 are utilized to divide each of the layers forming the bit line BL, in the X direction. Therefore, as shown in FIG. 11, an end 228a in the Y direction of the inter-layer insulating layer 228 is resultantly positioned between the bit line contact CB and the word line WL1, at a position between the bit lines BL. Moreover, as shown in FIG. 11, when the nitride layer 261 and the inter-layer insulating layer 262 are formed in step S108, these nitride layer 261 and inter-layer insulating layer 262 resultantly contact the end 228a in the Y direction of the inter-layer insulating layer 228.

Moreover, as a result of the method of manufacturing according to the present embodiment, the word line contact CW is formed similarly to the bit line contact CB, and similar advantages can be displayed in manufacturing steps of the word line contact CW.

Other Embodiments

Note that in the present embodiment, the bit line contact CB and the word line contact CW had substantially similar configurations. However, it is also possible for different configurations to be adopted as the bit line contact CB or the word line contact CW, for example.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   a first wiring extending in a first direction;
   a second wiring being adjacent to the first wiring in a second direction parallel to the substrate and crossing the first direction, the second wiring extending in the first direction;

a third wiring being provided between the substrate and the first wiring, the third wiring being provided between the substrate and the second wiring, the third wiring extending in the second direction;

a first memory cell being provided between the first wiring and the third wiring;

a second memory cell being provided between the second wiring and the third wiring;

a first contact being provided between the first wiring and the second wiring in the second direction, the first contact extending in a third direction perpendicular to a surface of the substrate, and one end of the first contact being connected to the third wiring;

a second contact extending in the third direction, and one end of the second contact being connected to the first wiring; and a third contact extending in the third direction, and one end of the third contact being connected to the second wiring.

2. The memory device according to claim 1
a fourth contact being located below the third wiring in the third direction, one end of the fourth contact being connected to the other end of the second contact, and the fourth contact extending in the third direction;

a fifth contact being located below the third wiring in the third direction, one end of the fifth contact being connected to the other end of the first contact, and the fifth contact extending in the third direction.

3. The memory device according to claim 2, wherein a first length of the second contact in the third direction from a connecting surface of the first wiring to a connecting surface of the fourth contact is longer than a second length of the first contact in the third direction from a connecting surface of the third wiring to a connecting surface of the fifth contact.

4. The memory device according to claim 2, wherein the second contact is integrated together from a connecting surface of the first wiring to the fourth contact.

5. The memory device according to claim 2, wherein the second contact and third contact includes a first conductive portion and a second conductive portion, the first conductive portion provided in a layer which the first contact is provided, the second conductive portion provided in a layer which the third wiring is provided, and the first conductive portion and the second conductive portion formed of one body.

6. The memory device according to claim 5, wherein the first conductive portion and the second conductive portion is formed of one body by tungsten.

7. The memory device according to claim 5, wherein a layer including titanium is continuously provided on sidewalls of the first conductive portion and the second conductive portion.

8. The memory device according to claim 2, wherein the second contact is provided in a first layer different from a second layer in which the fourth contact is provided.

9. The memory device according to claim 1, further comprising a first film being provided on the first wiring and the second wiring.

10. The memory device according to claim 9, wherein the first film includes a nitride.

11. A memory device comprising:
a substrate;
a plurality of first wirings extending in a first direction and being arranged at a second direction parallel to the substrate and crossing the first direction;

a plurality of second wirings being adjacent to the plurality of the first wirings in the second direction, the plurality of second wirings extending in the first direction and being arranged at the second direction;

a plurality of third wirings being provided between the substrate and the plurality of first wirings, the plurality of third wirings being provided between the substrate and the plurality of second wirings, extending in the second direction, the plurality of the third wirings being arranged at the first direction;

first memory cells being provided between the plurality of first wirings and the plurality of third wirings;

second memory cells being provided between the plurality of second wirings and the plurality of third wirings;

a first contact being provided between the first memory cells and the second memory cells in the second direction, the first contact extending in a third direction perpendicular to a surface of the substrate, and one end of the first contact being connected to one of the plurality of the third wirings;

a second contact extending in the third direction, and one end of the second contact being connected to one of the plurality of the first wirings; and a third contact extending in the third direction, and one end of the third contact being connected to one of the plurality of the second wirings.

12. The memory device according to claim 11, further comprising:
a fourth contact being located below the plurality of third wirings in the third direction, one end of the fourth contact being connected to the other end of the second contact, and the fourth contact extending in the third direction; and a fifth contact being located below the plurality of third wiring in the third direction, one end of the fifth contact being connected to the other end of the first contact, and the fifth contact extending in the third direction.

13. The memory device according to claim 12, wherein a first length of the second contact in the third direction from a connecting surface of the first wiring to a connecting surface of the fourth contact is longer than a second length of the first contact in the third direction from a connecting surface of the third wiring to a connecting surface of the fifth contact.

14. The memory device according to claim 12, wherein the second contact is integrated together from a connecting surface of the first wiring to the fourth contact.

15. The memory device according to claim 12, wherein the second contact and third contact includes a first conductive portion and a second conductive portion, the first conductive portion provided in a layer which the first contact is provided, the second conductive portion provided in a layer which the third wiring is provided, and the first conductive portion and the second conductive portion formed of one body.

16. The memory device according to claim 15, wherein the first conductive portion and the second conductive portion is formed of one body by tungsten.

17. The memory device according to claim 15, wherein a layer including titanium is continuously provided on sidewalls of the first conductive portion and the second conductive portion.

18. The memory device according to claim 12, wherein the second contact is provided in a first layer different from a second layer in which the fourth contact is provided.

19. The memory device according to claim 11, further comprising a first film being provided on the plurality of first wirings and the plurality of the second wirings.

20. The memory device according to claim 19, wherein the first film includes a nitride.

\* \* \* \* \*